US009780233B2

United States Patent
Ohhashi et al.

(10) Patent No.: US 9,780,233 B2
(45) Date of Patent: Oct. 3, 2017

(54) SOLAR CELL MODULE, SOLAR CELL MODULE ASSEMBLY, AND SOLAR PHOTOVOLTAIC POWER GENERATION SYSTEM

(71) Applicant: Sharp Kabushiki Kaisha, Osaka-shi, Osaka (JP)

(72) Inventors: Seiji Ohhashi, Osaka (JP); Hideki Uchida, Osaka (JP); Yasuyuki Umenaka, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 120 days.

(21) Appl. No.: 14/420,069

(22) PCT Filed: Aug. 5, 2013

(86) PCT No.: PCT/JP2013/071105
§ 371 (c)(1),
(2) Date: Feb. 6, 2015

(87) PCT Pub. No.: WO2014/024816
PCT Pub. Date: Feb. 13, 2014

(65) Prior Publication Data
US 2015/0206987 A1     Jul. 23, 2015

(30) Foreign Application Priority Data

Aug. 10, 2012  (JP) ................................ 2012-178369

(51) Int. Cl.
*H01L 31/054* (2014.01)
*H01L 31/02* (2006.01)
(Continued)

(52) U.S. Cl.
CPC ........ *H01L 31/02013* (2013.01); *H01L 31/05* (2013.01); *H01L 31/055* (2013.01);
(Continued)

(58) Field of Classification Search
CPC ............. H01L 31/055; H01L 31/02013; H01L 31/0547; H01L 31/05; H01L 51/447; H02S 30/10; H02S 40/36; Y02E 10/52
See application file for complete search history.

(56) References Cited

U.S. PATENT DOCUMENTS 6,262,358 B1 * 7/2001 Kamimura ............ H01L 31/048
                                                                    136/244
2009/0056791 A1 * 3/2009 Pfenninger ........... H01L 31/055
                                                                    136/247
(Continued)

FOREIGN PATENT DOCUMENTS

JP        58-049860 A      3/1983
JP        2000-307143 A    11/2000
(Continued)

OTHER PUBLICATIONS

Official Communication issued in International Patent Application No. PCT/JP2013/071105, mailed on Oct. 1, 2013.

*Primary Examiner* — Devina Pillay
(74) *Attorney, Agent, or Firm* — Keating & Bennett, LLP

(57) ABSTRACT

A solar cell module, a solar cell module assembly, and a solar photovoltaic power generation system capable of reducing power loss are provided. A light-concentrating panel configured to collect light which is incident from the outside and a plurality of solar cell elements installed on the light-concentrating panel and configured to receive light which is collected by the light-concentrating panel are provided. Each of the plurality of solar cell elements is provided with a positive terminal and a negative terminal. The plurality of solar cell elements include a first solar cell element and a second solar cell element which are connected to each other in series via connection wiring and a third solar cell element which is not connected to the first solar cell element and the second solar cell element in series. The first (Continued)

solar cell element and the second solar cell element configure a first current path, and the third solar cell element configures a second current path.

10 Claims, 18 Drawing Sheets

(51) Int. Cl.
*H01L 31/055* (2014.01)
*H01L 31/05* (2014.01)
*H02S 30/10* (2014.01)
*H02S 40/36* (2014.01)
*H01L 51/44* (2006.01)

(52) U.S. Cl.
CPC .......... *H01L 31/0547* (2014.12); *H02S 30/10* (2014.12); *H02S 40/36* (2014.12); *H01L 51/447* (2013.01); *Y02E 10/52* (2013.01)

(56) References Cited

U.S. PATENT DOCUMENTS

| | | | |
|---|---|---|---|
| 2009/0126773 A1* | 5/2009 | Shimizu | ............ H01L 31/02008 136/244 |
| 2009/0126778 A1* | 5/2009 | Brounne | ............. H01L 31/0547 136/247 |
| 2009/0126792 A1 | 5/2009 | Gruhlke et al. | |
| 2009/0183762 A1* | 7/2009 | Jackson | ............ H01L 31/02021 136/246 |
| 2012/0291850 A1 | 11/2012 | Juso | |
| 2013/0098443 A1 | 4/2013 | Azumada | |

FOREIGN PATENT DOCUMENTS

| | | |
|---|---|---|
| JP | 2006-228876 A | 8/2006 |
| JP | 2007-234795 A | 9/2007 |
| JP | 2011-503902 A | 1/2011 |
| JP | 2011-138970 A | 7/2011 |
| NO | 2012/090849 A1 | 7/2012 |
| WO | 2009/064701 A1 | 5/2009 |
| WO | 2011/162130 A1 | 12/2011 |

\* cited by examiner

FIG. 2
(A)
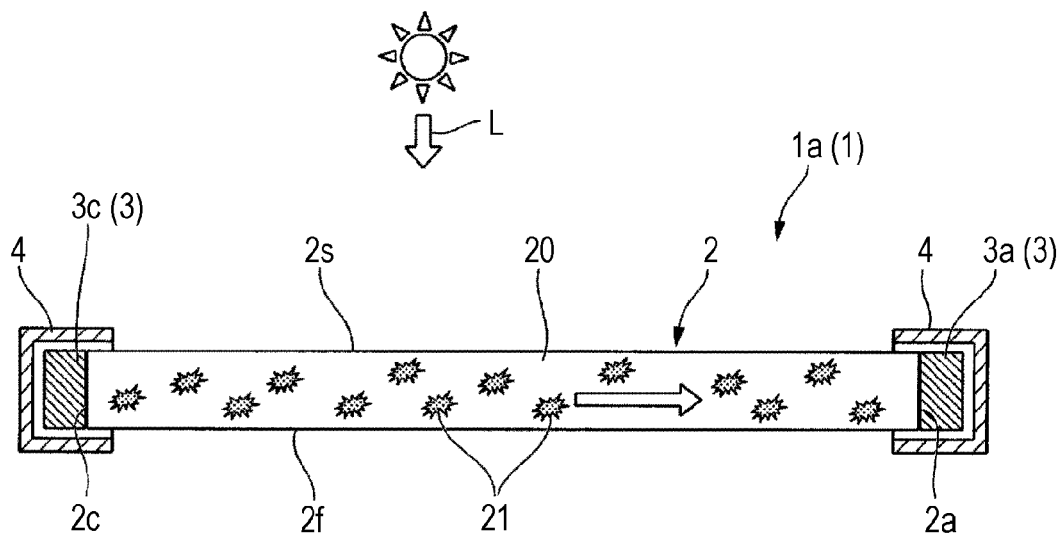
(B)
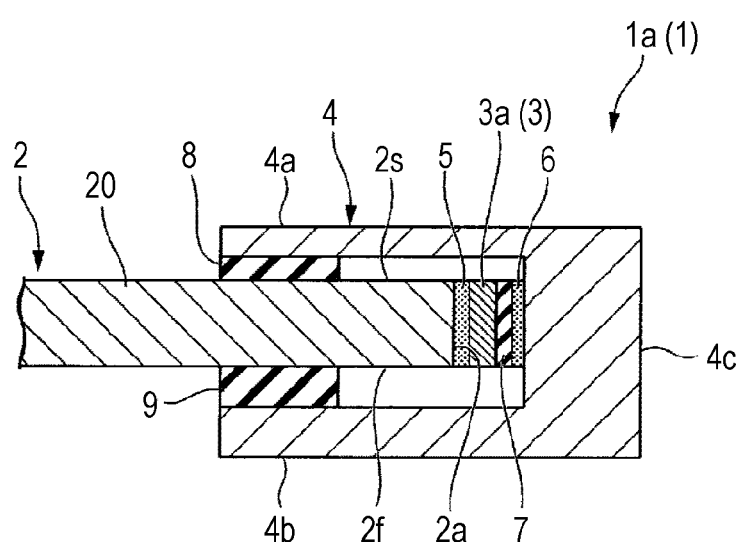

SOLAR CELL MODULE, SOLAR CELL MODULE ASSEMBLY, AND SOLAR PHOTOVOLTAIC POWER GENERATION SYSTEM

TECHNICAL FIELD

The present invention relates to a solar cell module, a solar cell module assembly and a solar photovoltaic power generation system.

BACKGROUND ART

As a solar photovoltaic power generation system which is configured such that a solar cell element is installed at an end surface of a light-concentrating panel and light propagating inside the light-concentrating panel is made to be incident on the solar cell element to generate electrical power, a solar light energy converter disclosed in PTL 1 is known. According to the solar light energy converter, a fluorescent material is made to emit light by irradiation of solar light which is incident on the inside of a transparent substrate, and the fluorescent light emitted from the fluorescent material is made to propagate to a solar cell installed at an end surface of the transparent substrate to generate electrical power.

In addition, PTL 2 discloses a light-concentrating-type solar cell module configured such that a plurality of light-concentrating-type solar cells are arranged on a plate. On the plate, a connecting portion connected to the solar battery cells and wiring connecting the solar battery cells are formed. Through the plate, the plurality of solar battery cells are connected in series.

CITATION LIST

Patent Literature

PTL 1: Japanese Unexamined Patent Application Publication No. 58-49860
PTL 2: Japanese Unexamined Patent Application Publication No. 2011-138970

SUMMARY OF INVENTION

Technical Problem

Providing a plurality of solar cell modules is considered as means for acquiring a large amount of electrical power in a solar photovoltaic power generation system. For example, aligning and connecting the light-concentrating-type cell modules disclosed in PTL 2 in series is considered.

However, if the plate disclosed in PTL 2 is applied, the plurality of solar battery cells are connected to each other in series on each plate. For this reason, the distance between connection terminals between two adjacent plates becomes long. Therefore, connection wiring between the connection terminals becomes quite long.

At an ending point of a current path configured of the plurality of solar cell elements, a connection terminal for a power conditioner such as an inverter (DC/AC inverter) is arranged. Therefore, the connection terminal for the power conditioner is positioned far from the power conditioner. Thus, connection wiring to the power conditioner becomes quite long.

If the connection wiring becomes quite long as described above, there are problems in that wiring resistance increases and power loss increases.

The present invention was made to solve the aforementioned problem, and an object thereof is to provide a solar cell module, a solar cell module assembly, and a solar photovoltaic power generation system capable of reducing power loss.

Solution to Problem

In order to achieve the aforementioned object, the present invention employs the following means.

(1) That is, according to an aspect of the present invention, there is provided a solar cell module including: a light-concentrating panel configured to collect light which is incident from the outside; and a plurality of solar cell elements installed on the light-concentrating panel and configured to receive light which is collected by the light-concentrating panel, wherein each of the plurality of solar cell elements is provided with a positive terminal and a negative terminal, wherein the plurality of solar cell elements include a first solar cell element and a second solar cell element which are connected to each other in series via connection wiring and a third solar cell element which is not connected to the first solar cell element and the second solar cell element in series, and wherein the first solar cell element and the second solar cell element configure a first current path, and the third solar cell element configures a second current path.

(2) In the solar cell module according to (1), the plurality of solar cell elements may further include a fourth solar cell element which is connected to the third solar cell element in series via a connection wiring and is not connected to the first solar cell element and the second solar cell element in series, and the third solar cell element and the fourth solar cell element may configure the second current path.

(3) In the solar cell module according to (1) or (2), the plurality of solar cell elements may be arranged along an edge of the light-concentrating panel.

(4) In the solar cell module according to (3), the light-concentrating panel may collect the light which is incident from the outside and emit the light from end surfaces, and the plurality of solar cell elements may be arranged on the end surfaces of the light-concentrating panel and receive the light which is emitted from the end surfaces.

(5) In the solar cell module according to (3), the light-concentrating panel may collect the light which is incident from the outside and emit the light from a main surface, and the plurality of solar cell elements may be arranged on the main surface of the light-concentrating panel and receive the light which is emitted from the main surface.

(6) In the solar cell module according to any one of (1) to (5), a planar shape of the light-concentrating panel may be a polygonal shape, and a number of the solar cell elements may be equal to a number of sides of the polygonal shape.

(7) In the solar cell module according to any one of (1) to (5), a planar shape of the light-concentrating panel may be a polygonal shape, and a number of the solar cell elements may be smaller than a number of sides of the polygonal shape.

(8) In the solar cell module according to (7), a reflecting mirror configured to reflect light propagating inside the light-concentrating panel may be provided on an end surface of the light-concentrating panel, which corresponds to a side of the polygonal shape where the solar cell element is not provided.

(9) In the solar cell module according to (8), connection wiring may be provided on a surface on the opposite side of a reflecting surface of the reflecting mirror.

(10) According to an aspect of the present invention, there is provided a solar cell module assembly including at least: a first solar cell module provided with a plurality of solar cell elements configured to receive light from the outside; and a second solar cell module provided with a plurality of solar cell elements configured to receive light from the outside, wherein the plurality of solar cell elements in the first solar cell module include a first solar cell element and a second solar cell element which are connected to each other in series via connection wiring and a third solar cell element which is not connected to the first solar cell element and the second solar cell element in series, wherein the first solar cell element and the second solar cell element configure a first current path, and the third solar cell element configures a second current path, wherein the plurality of solar cell elements in the second solar cell module include a fourth solar cell element and a fifth solar cell element which are connected to each other in series via connection wiring and a sixth solar cell element which is not connected to the fourth solar cell element and the fifth solar cell element in series, wherein the fourth solar cell element and the fifth solar cell element configure a third current path, and the sixth solar cell element configures a fourth current path, wherein the first current path in the first solar cell module and the third current path in the second solar cell module are connected in series via connection wiring, and wherein the second current path in the first solar cell module and the fourth current path in the second solar cell module are connected in series via connection wiring.

(11) In the solar cell module assembly according to (10), the first solar cell module may include a first light-concentrating panel configured to collect light which is incident from the outside, and the plurality of solar cell elements in the first solar cell module may be installed on the first light-concentrating panel and receive the light which is collected by the first light-concentrating panel.

(12) In the solar cell module assembly according to (10) or (11), the second solar cell module may include a second light-concentrating panel configured to collect light which is incident from the outside, and the plurality of solar cell elements in the second solar cell module may be installed on the second light-concentrating panel and receive the light which is collected by the second light-concentrating panel.

(13) In the solar cell module assembly according to any one of (10) to (12), a starting point of the first current path and an ending point of the second current path in the first solar cell module may be arranged so as to be adjacent to each other, and the starting point of the first current path and the ending point of the second current path may be terminals for connection to an external device.

(14) In the solar cell module assembly according to (13), an ending point of the third current path and a starting point of the fourth current path in the second solar cell module may be connected in series via connection wiring.

(15) According to an aspect of the present invention, there is provided a solar photovoltaic power generation system, wherein a power conditioner is connected to the terminals for connection to an external device, in the solar cell module assembly according to (13).

Advantageous Effects of Invention

According to the aspects of the present invention, it is possible to provide a solar cell module, a solar cell module assembly, and a solar photovoltaic power generation system capable of reducing power loss.

BRIEF DESCRIPTION OF DRAWINGS

FIGS. 2(A) and 2(B) are cross-sectional views of the solar cell module.

DESCRIPTION OF EMBODIMENTS

[First Embodiment]

Hereinafter, a description will be given of a solar cell module 1 according to a first embodiment of the present invention with reference to FIGS. 1 to 7. In all of the drawings described below, dimensions, ratios, and the like of the respective components are appropriately differentiated for easy understanding of the drawings.

Figure 1:
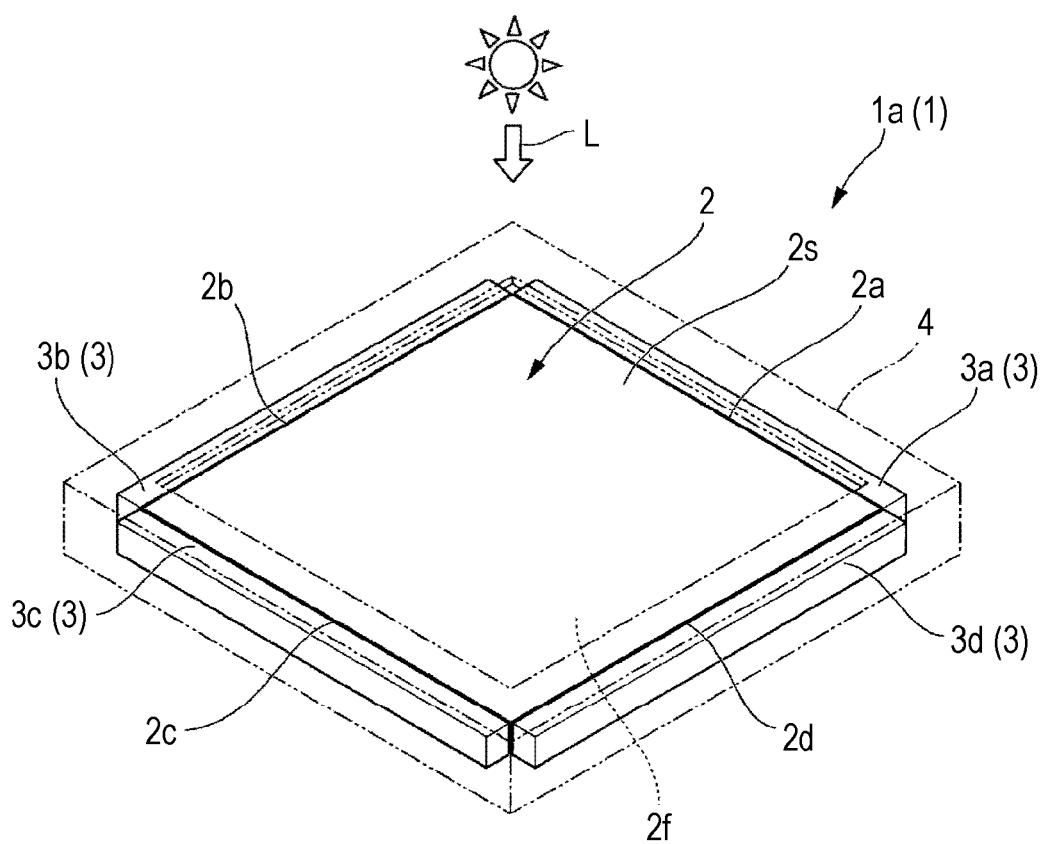
FIG. 1 is a perspective view showing an outline configuration of a solar cell module according to a first embodiment.

FIG. 1 is a perspective view showing an outline configuration of the solar cell module 1 according to the first embodiment.

In FIG. 1, the depiction of terminals of solar cell elements and connection wiring is omitted for the purpose of convenience.

In FIG. 1, a configuration of a first solar cell module 1a is exemplified and described as a configuration of the solar cell module 1. Configurations of a second solar cell module 1b and a third solar cell module 1c, which will be described later, are the same as that of the first solar cell module 1a.

As shown in FIG. 1, the first solar cell module 1a is provided with a light-concentrating panel 2, four solar cell elements 3, and a frame 4.

The light-concentrating panel 2 is a plate member with a square shape in a plan view. The light-concentrating panel 2 includes a first main surface 2s, a second main surface 2f, a first end surface 2a, a second end surface 2b, a third end surface 2c, and a fourth end surface 2d. The first main surface 2s is a light incident surface on which solar light is made to be incident. The second main surface 2f is a surface on the opposite side of the first main surface 2s. The first end surface 2a, the second end surface 2b, the third end surface 2c, and the fourth end surface 2d are light emission surfaces from which light propagating inside the light-concentrating panel 2 is emitted.

The first end surface 2a is adjacent to the second end surface 2b and the fourth end surface 2d and faces the third end surface 2c. The second end surface 2b is adjacent to the first end surface 2a and the third end surface 2c and faces the fourth end surface 2d. The third end surface 2c is adjacent to the second end surface 2b and the fourth end surface 2d and faces the first end surface 2a. The fourth end surface 2d is adjacent to the first end surface 2a and the third end surface 2c and faces the second end surface 2b.

The light-concentrating panel 2 receives external light L through the first main surface 2s and emits light propagating inside the light-concentrating panel 2 from the first end surface 2a, the second end surface 2b, the third end surface 2c, and the fourth end surface 2d. As an example of the size of the light-concentrating panel 2, the length of each side is about 40 cm, and the thickness is about 5 mm.

FIG. 2(A) is a cross-sectional view of the solar cell module 1. FIG. 2(B) is an enlarged cross-sectional view of main parts of the solar cell module 1.

In FIGS. 2(A) and 2(B), the depiction of the terminals of the solar cell elements and the connection wiring is omitted for the purpose of convenience.

In FIGS. 2(A) and 2(B), a configuration of the first solar cell module 1a is exemplified and described as a configuration of the solar cell module 1. Configurations of the second solar cell module 1b and the third solar cell module 1c, which will be described later, are the same as that of the first solar cell module 1a.

In FIG. 2(A), the depiction of a transparent adhesive 5, an adhesive 6, a buffer material 7, a first buffer layer 8, and a second buffer layer 9 is omitted for the purpose of convenience.

In FIG. 2(B), an arrangement configuration of the first solar cell element 3a is exemplified and described as an arrangement configuration of the solar cell element 3. Arrangement configurations of a second solar cell element 3b, a third solar cell element 3c, and a fourth solar cell element 3d are the same as that of the first solar cell element 3a.

The light-concentrating panel 2 is a fluorescent light-concentrating panel in which a fluorescent material 21 is dispersed in a transparent base material 20 as shown in FIG. 2(A). The transparent base material 20 is made of an organic material with high transparency, and examples thereof include acrylic resin such as PMMA or polycarbonate resin. Alternatively, the transparent base material 20 is made of an inorganic material with transparency such as glass. According to the embodiment, PMMA resin (refractive index: 1.49) is used for the transparent base material 20. The light-concentrating panel 2 is formed by dispersing the fluorescent material 21 in the PMMA resin. In addition, the refractive index of the light-concentrating panel 2 is 1.50, which is substantially the same as the refractive index of the PMMA resin, since the amount of the dispersed fluorescent material 21 is small.

The fluorescent material 21 is an optical functional material which absorbs ultraviolet light or visible light and generates and emits visible light or infrared light. As the optical functional material, an organic fluorescent material is exemplified.

As such an organic fluorescent material, a coumarin-based pigment, a perylene-based pigment, a phthalocyanine-based pigment, a stilbene-based pigment, a cyanine-based pigment, a polyphenylene-based pigment, a xanthene-based pigment, a pyridine-based pigment, an oxazine-based pigment, a chrysene-based pigment, a thioflavin-based pigment, a perylene-based pigment, a pyrene-based pigment, an anthracene-based pigment, an acridone-based pigment, an acridine-based pigment, a fluorene-based pigment, a terphenyl pigment, an ethane-based pigment, a butadiene-based pigment, a hexatriene-based pigment, an oxazole-based pigment, a coumarin-based pigment, a stilbene-based pigment, di- and triphenylmethane-based pigments, a thiazole-based pigment, a thiazine-based pigment, a naphthalimide-based resin, an anthraquinone-based resin, or the like is preferably used. Specific examples thereof include a coumarin-based pigment such as 3-(2'-benzothiazolyl)-7-diethylaminocoumarin (coumarin6), 3-(2'-benzimidazolyl)-7-N,N-diethylaminocoumarin (coumarin7), 3-(2'-N-methylbenzimidazolyl)-7-N,N-diethylaminocoumarin (coumarin30), or 2,3,5,6-1H,4H-tetrahydro-8-trifluoromethylquinolizine(9,9a,1-gh)coumarin (coumarin153), Basic Yellow 51 as a coumarin pigment-based dye, a naphthalimide-based pigment such as Solvent Yellow 11 or Solvent Yellow 116, a Rhodamine-based pigment such as Rhodamine B, Rhodamine 6G, Rhodamine 3B, Rhodamine 101, Rhodamine 110, Sulforhodamine, Basic Violet 11, or Basic Red 2, a pyridine-based pigment such as 1-ethyl-2-[4-(p-dimethylaminophenyl)-1,3-butadienyl]pyridinium-perchlorate (Pyridine 1), a cyanine-based pigment, and an oxazine-based pigment.

In addition, it is also possible to use an inorganic fluorescent material as the fluorescent material.

Furthermore, various dyes (a direct dye, an acidic dye, a basic dye, a dispersive dye and the like) can also be used as the fluorescent material according to the present invention as long as the dyes exhibit fluorescence.

In the case of the embodiment, one type of fluorescent material 21 is dispersed within the light-concentrating panel 2. The fluorescent material 21 absorbs orange light and emits red fluorescent light. According to the embodiment, Lumogen R305 (product name) manufactured by BASF Japan Ltd. is used as the fluorescent material 21. The fluorescent material 21 absorbs light with a wavelength approximately equal to or less than 600 nm. The emission spectrum of the fluorescent material 21 has a peak wavelength of 610 nm.

In addition, the present invention is not limited to the case in which one type of fluorescent material is used, and a plurality of types (two types or three or more types) of fluorescent materials may be used.

According to the light-concentrating panel 2 configured as described above, the fluorescent material 21 absorbs at least a part of external light L which is incident on the inside of the light-concentrating panel 2, transforms the external light L into fluorescent light FL, and emits the fluorescent light FL. The emitted fluorescent light FL propagates through the inside of the light-concentrating panel 2, is emitted from the first end surface 2a, the second end surface 2b, the third end surface 2c, and the fourth end surface 2d, is incident on the solar cell elements 3, and is used for power generation.

According to the embodiment, four solar cell elements 3 are arranged along edge portions of the light-concentrating panel 2 as shown in FIG. 1. A planar shape of the light-concentrating panel 2 is a quadrangular shape, and the number of solar cell elements 3 is equal to the number of sides of the quadrangular shape.

Specifically, the respective solar cell elements 3 are arranged along the respective sides of the light-concentrating panel 2. A light-receiving surface of the first solar cell element 3a faces the first end surface 2a of the light-concentrating panel 2. A light-receiving surface of the second solar cell element 3b faces the second end surface 2b of the light-concentrating panel 2. A light-receiving surface of the third solar cell element 3c faces the third end surface 2c of the light-concentrating panel 2. A light-receiving surface of the fourth solar cell element 3d faces the fourth end surface 2d of the light-concentrating panel 2. In addition, the width of each solar cell element 3 is about 5 mm, for example.

As the solar cell elements 3, known solar cells such as silicon-based solar cells, compound-based solar cells, quantum dot solar cells, or organic solar cells can be used. Among the examples, the compound-based solar cells using compound semiconductors and the quantum dot solar cells are preferably used as the solar cell elements 3 since it is possible to highly efficiently generate electrical power therewith. Particularly, it is desirable to use GaAs solar cells, which are compound-based solar cells exhibiting high efficiency at a peak wavelength (610 nm) of the emission spectrum of the fluorescent material 21. As other examples of the compound-based solar cells, InGaP, InGaAs, AlGaAs, $Cu(In,Ga)Se_2$, $Cu(In,Ga)(Se,S)_2$, $CuInS_2$, CdTe, CdS, or the like may be used. As the quantum dot solar cells, Si, InGaAs, or the like may be used. However, other types of solar cells such as Si-based solar cells or organic solar cells may also be used in accordance with the price and the purpose of usage.

The first solar cell element 3a is joined to the first end surface 2a of the light-concentrating panel 2 with the transparent adhesive 5 as shown in FIG. 2(B). As the transparent adhesive 5, a thermosetting adhesive such as ethylene-vinyl acetate copolymer (EVA), an epoxy-based adhesive, silicone-based adhesive, or a polyimide-based adhesive is preferably used. In addition, the refractive index of the transparent adhesive 5 is 1.50 which is substantially the same as that of the light-concentrating panel 2.

The frame 4 has a rectangular frame shape in a plan view as shown in FIG. 1. The frame 4 is for holding the light-concentrating panel 2. The frame 4 is formed so as to cover the four solar cell elements 3. The thickness of the frame 4 is about 2 mm. A material for forming the frame 4 is a metal such as Al. In addition, various materials can be used as the material for forming the frame 4. Particularly, it is preferable to use a light-weight material with high strength.

As shown in FIG. 2(B), the frame 4 is provided with a top panel portion 4a, a bottom panel portion 4b, and a side wall portion 4c.

A first end of the top panel portion 4a is connected to the side wall portion 4c. A second end of the top panel portion 4a extends up to an end of the light-concentrating panel 2 on the side of the first end surface 2a of the first main surface 2s. The bottom panel portion 4b is arranged so as to face the top panel portion 4a with the light-concentrating panel 2 interposed therebetween. A first end of the bottom panel portion 4b is connected to the side wall portion 4c. A second end of the bottom panel portion 4b extends up to an end of the light-concentrating panel 2 on the side of the first end surface 2a of the second main surface 2f. The length of the bottom panel portion 4b in a direction parallel to the main surfaces of the light-concentrating panel 2 is substantially equal to the length of the top panel portion 4a in the direction parallel to the main surfaces of the light-concentrating panel 2.

The buffer material 7 is provided between the side wall portion 4c of the frame 4 and the first solar cell element 3a. With such a configuration, the buffer material 7 can absorb impact applied to the first solar cell element 3a when the frame 4 and the light-concentrating panel 2 receive impact due to external force. As a result, it is possible to suppress damage of the first solar cell element 3a. As the buffer material 7, urethane foam such as polyurethane can be used.

The buffer material 7 is joined to an inner wall surface of the side wall portion 4c of the frame 4 with the adhesive 6. As the adhesive 6, a thermosetting adhesive such as ethylene-vinyl acetate copolymer (EVA), an epoxy-based adhesive, silicone-based adhesive, or a polyimide-based adhesive is preferably used.

The first buffer layer 8 is provided between the second end of the top panel portion 4a of the frame 4 and the first main surface 2s of the light-concentrating panel 2.

The first buffer layer 8 absorbs stress which is applied between the top panel portion 4a of the frame 4 and the first main surface 2s of the light-concentrating panel 2. As the first buffer layer 8, a rubber sheet such as a silicone rubber sheet can be used. In addition, various materials can be used as the material for forming the first buffer layer 8. Particularly, a material with high water-proofing properties is preferably used.

In addition, an air layer is provided at a portion, in which the first buffer layer 8 is not provided, between the top panel portion 4a of the frame 4 and the first main surface 2s of the light-concentrating panel 2.

The second buffer layer 9 is provided between the second end of the bottom panel portion 4b of the frame 4 and the second main surface 2f of the light-concentrating panel 2.

The second buffer layer 9 absorbs stress which is applied between the bottom panel portion 4b of the frame 4 and the second main surface 2f of the light-concentrating panel 2. As the second buffer layer 9, the same material as that for the first buffer layer 8 can be used.

In addition, an air layer is provided at a portion, in which the second buffer layer 9 is not provided, between the bottom panel portion 4b of the frame 4 and the second main surface 2f of the light-concentrating panel 2.

Figure 3:
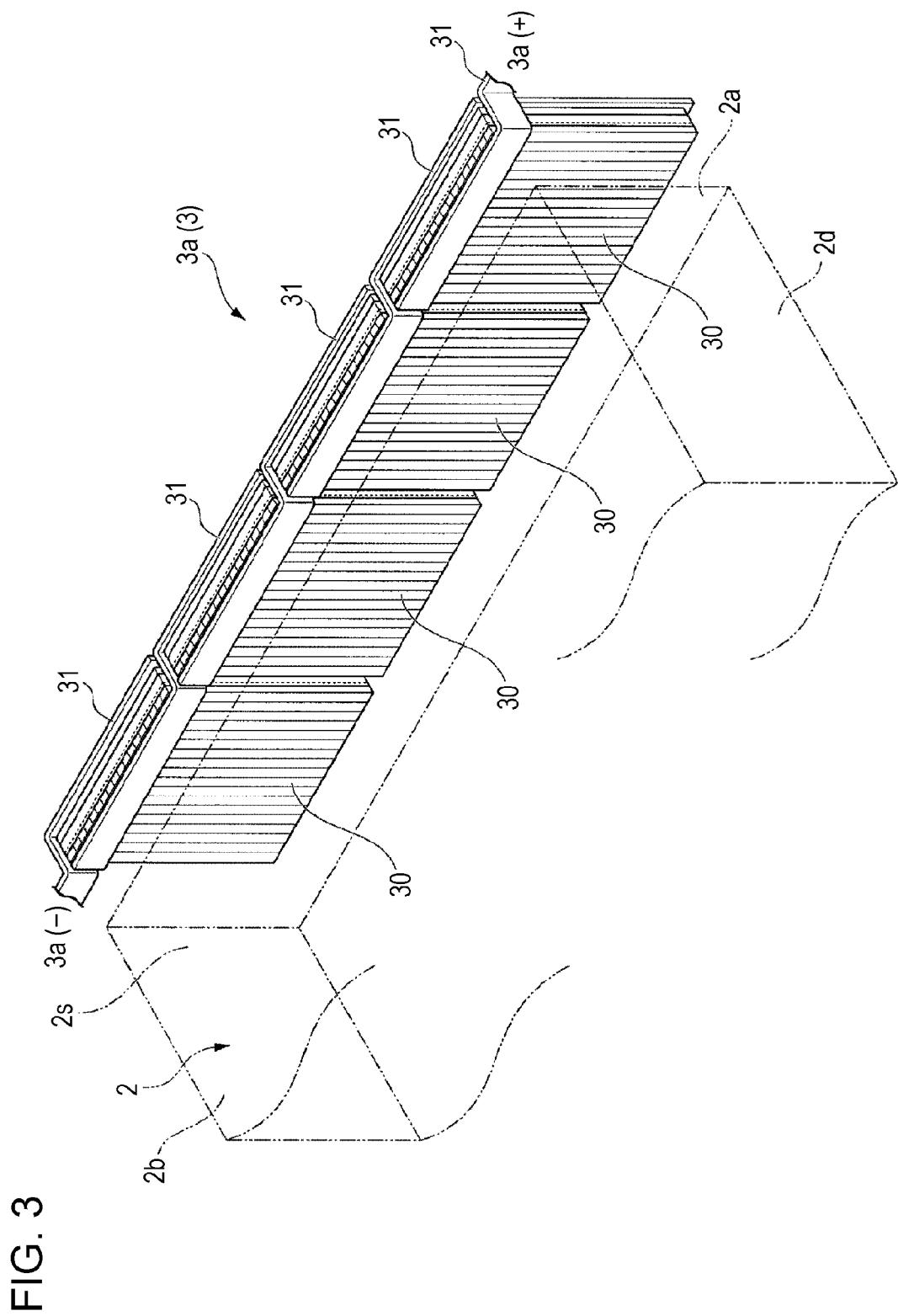
FIG. 3 is a partial perspective view of a solar cell element.
Figure 4:
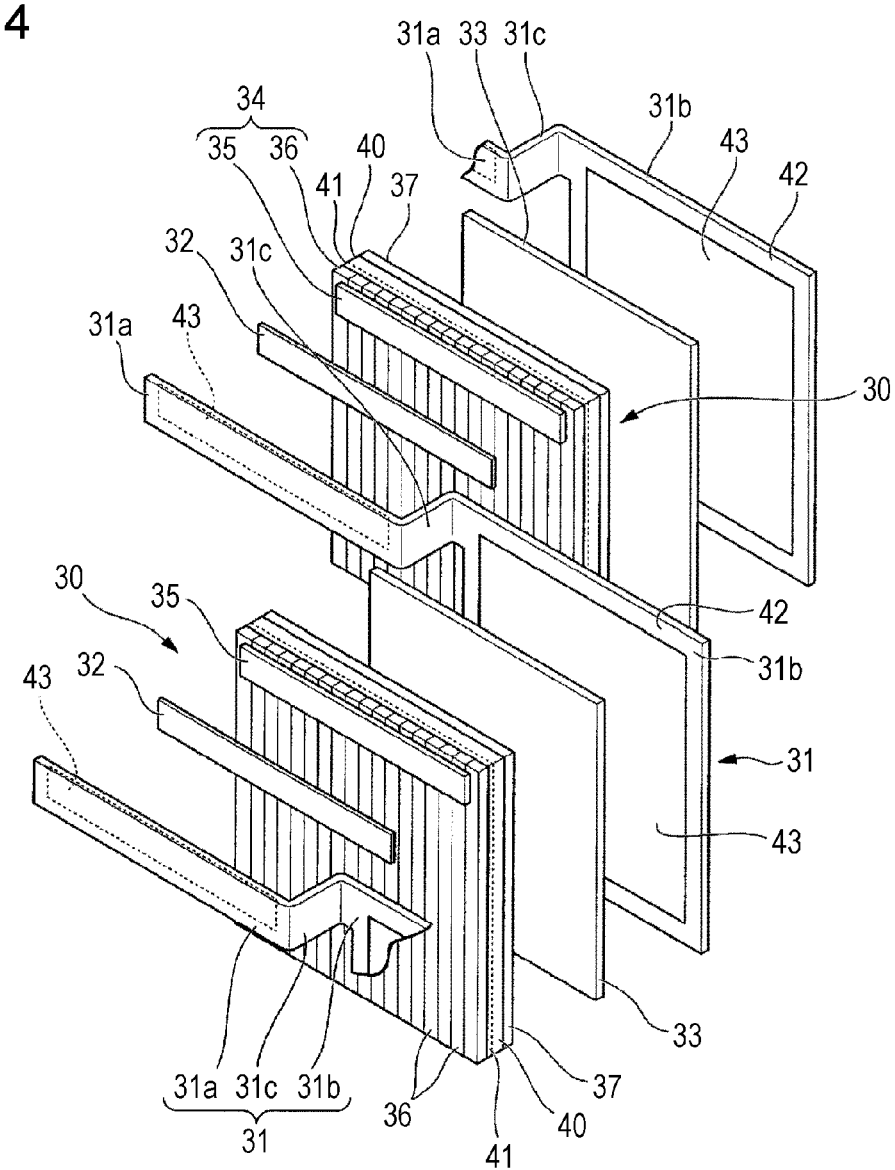
FIG. 4 is an exploded perspective view of the solar cell element.

FIG. 3 is a partial perspective view of each solar battery element 3. FIG. 4 is an exploded perspective view of each solar cell element 3.

In FIGS. 3 and 4, a configuration of the first solar cell element 3a is exemplified and described as a configuration of each solar cell element 3. Configurations of the second solar cell element 3b, the third solar cell element 3c, and the fourth solar cell element 3d are the same as that of the first solar cell element 3a.

As shown in FIG. 3, the first solar cell element 3a is provided with a plurality of solar battery cells 30 and a plurality of flexible substrates (flexible printed circuits: FPC) 31. According to the embodiment, four solar battery cells 30 are arranged so as to be adjacent to each other along the first end surface 2a of the light-concentrating panel 2. The flexible substrates 31 connect the adjacent solar battery cells 30 in series.

As shown in FIG. 4, each solar battery cell 30 is provided with a semiconductor substrate 40, a first collector electrode 34, and a second collector electrode 37.

The first collector electrode 34 is formed on a first surface side (front surface side) of the semiconductor substrate 40. The first collector electrode 34 is formed of a plurality of finger electrodes 36 and a bus bar electrode 35. The finger electrodes 36 are electrodes which capture carriers generated by incident light from the light-concentrating panel 2. The bus bar electrode 35 is an electrode which collects carriers from the respective finger electrodes 36. The second collector electrode 37 (rear-surface electrode) is formed on a second surface side (rear surface side) of the semiconductor substrate 40.

According to the embodiment, it is assumed that the polarity of the first collector electrode 34 is positive (+). It is assumed that the polarity of the second collector electrode 37 is negative (−). In such a case, an end of the flexible substrates 31 arranged at an end of the first end surface 2a of the light-concentrating panel 2 on the side of the fourth end surface 2d from among the plurality of flexible substrates 31 is a positive terminal as shown in FIG. 3. An end of the flexible substrate 31 arranged at an end of the first end surface 2a of the light-concentrating panel 2 on the side of the second end surface 2b from among the plurality of flexible substrates 31 is a negative terminal.

The semiconductor substrate 40 is a P-type semiconductor substrate with a rectangular shape, for example. As the semiconductor substrate 40, it is possible to use various known semiconductor substrates such as a single-crystal silicon substrate, a polycrystalline silicon substrate, or a gallium arsenide substrate. As shown in FIG. 4, an N-type impurity layer 41 is formed on the first surface side of the semiconductor substrate 40. A PN junction is formed at an interface between the N-type impurity layer 41 and the semiconductor substrate 40.

On the surface of the N-type impurity layer 41, the plurality of finger electrodes 36 are formed so as to be adjacent to each other along one side of the semiconductor substrate 40. The bus bar electrode 35 is formed on the end side of the plurality of finger electrodes 36. The bus bar electrode 35 is an electrode which connects the plurality of finger electrodes 36. The bus bar electrode 35 is arranged so as to be laid across the plurality of finger electrodes 36. The bus bar electrode 35 is formed in a stripe shape along one side of the semiconductor substrate 40. The second collector electrode 37 is formed so as to cover substantially the entire second surface of the semiconductor substrate 40.

Each of the flexible substrates 31 is formed by laminating a conductive layer 43 on an insulating film 42. Each of the flexible substrates 31 is a flexible wiring substrate. As the flexible substrate 31, a flexible substrate formed by covering upper and lower surfaces of the conductive layer 43, such as a copper foil, with the insulating film 42, such as polyimide, and removing the insulating film 42 at a portion at which connection to the solar battery cell 30 is made to expose the conductive layer 43 is used. The flexible substrate 31 is a so-called double-sided flexible substrate with the conductive layer 43 exposed from both sides thereof.

Each flexible substrate 31 is provided with a first electrode portion 31a, a second electrode portion 31b, and a connecting portion 31c. The first electrode portion 31a is a portion connected to the bus bar electrode 35. The second electrode portion 31b is a portion connected to the second collector electrode 37. The connecting portion 31c is a portion connecting the first electrode portion 31a to the second electrode portion 31b.

The first electrode portion 31a is connected to the bus bar electrode 35 of each solar battery cell 30. The first electrode portion 31a is arranged at such a position that the first electrode portion 31a overlaps the bus bar electrode 35 when viewed from a normal line direction of the first end surface 2a as shown in FIG. 3.

In relation to the arrangement position of the first electrode portion 31a, the first electrode portion 31a may be arranged at such a position that the first electrode portion 31a does not overlap the bus bar electrode 35 when viewed from a normal line direction of the first end surface 2a. However, a light-receiving portion (opening portion) decreases in size, and thus power generation efficiency deteriorates. Therefore, the first electrode portion 31a is preferably arranged at such a position that the first electrode portion 31a overlaps the bus bar electrode 35 when viewed from the normal line direction of the first end surface 2a from a viewpoint of suppressing deterioration in power generation efficiency.

The second electrode portion 31b and the connecting portion 31c are bent along the surface of the solar battery cell 30 and are connected to the second collector electrode 37 of the adjacent solar battery cell 30. The connecting portion 31c is substantially orthogonally bent along the end surface of the solar battery cell 30. With such a configuration, a large gap is not generated between the solar battery cells 30.

As shown in FIG. 4, the flexible substrate 31 and the bus bar electrode 35 are connected by using a first conductive film 32.

The first conductive film 32 is obtained by dispersing fine conductive particles in resin and forming the resin with the fine particles dispersed therein into a film shape with a thickness from about 10 μm to about 100 μm. As the first conductive film 32, an anisotropic conductive film (ACF) or the like can be used. In addition, not only a conductive film which exhibits conductivity only in a thickness direction, such as an anisotropic conductive film, but also a conductive film which exhibits conductivity both in the thickness direction and in the direction orthogonal to the thickness direction can also be used as the first conductive film 32.

The flexible substrate 31 and the second collector electrode 37 are connected by using a second conductive film 33. As the second conductive film 33, the same conductive film as the first conductive film 32 can be used.

Figure 5:
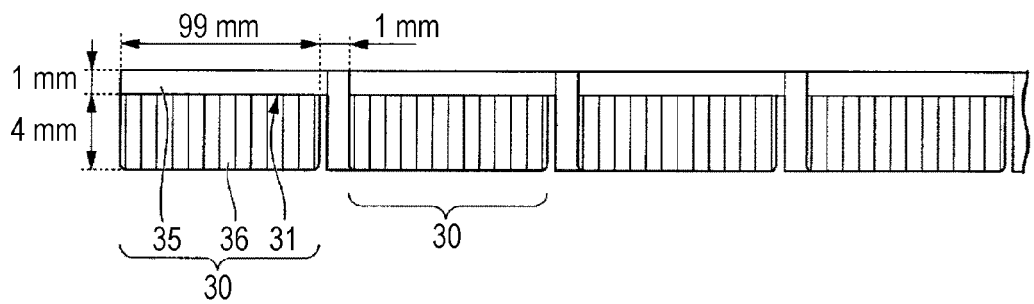
FIG. 5 is a diagram showing an example of a shape and a size of the solar cell element.

FIG. 5 is a diagram showing an example of a shape and a size of each solar cell element 3. As shown in FIG. 5, the planar shape of the solar battery cell 30 is a rectangular oblong shape with a width of 99 mm and a height of 5 mm. A gap between the solar battery cells 30 is 1 mm wide. The width of the bus bar electrode 35 is 1 mm. The flexible substrate 31 with a width of 1 mm is arranged at such a position that the flexible substrate 31 overlaps the bus bar electrode 35.

Figure 6:
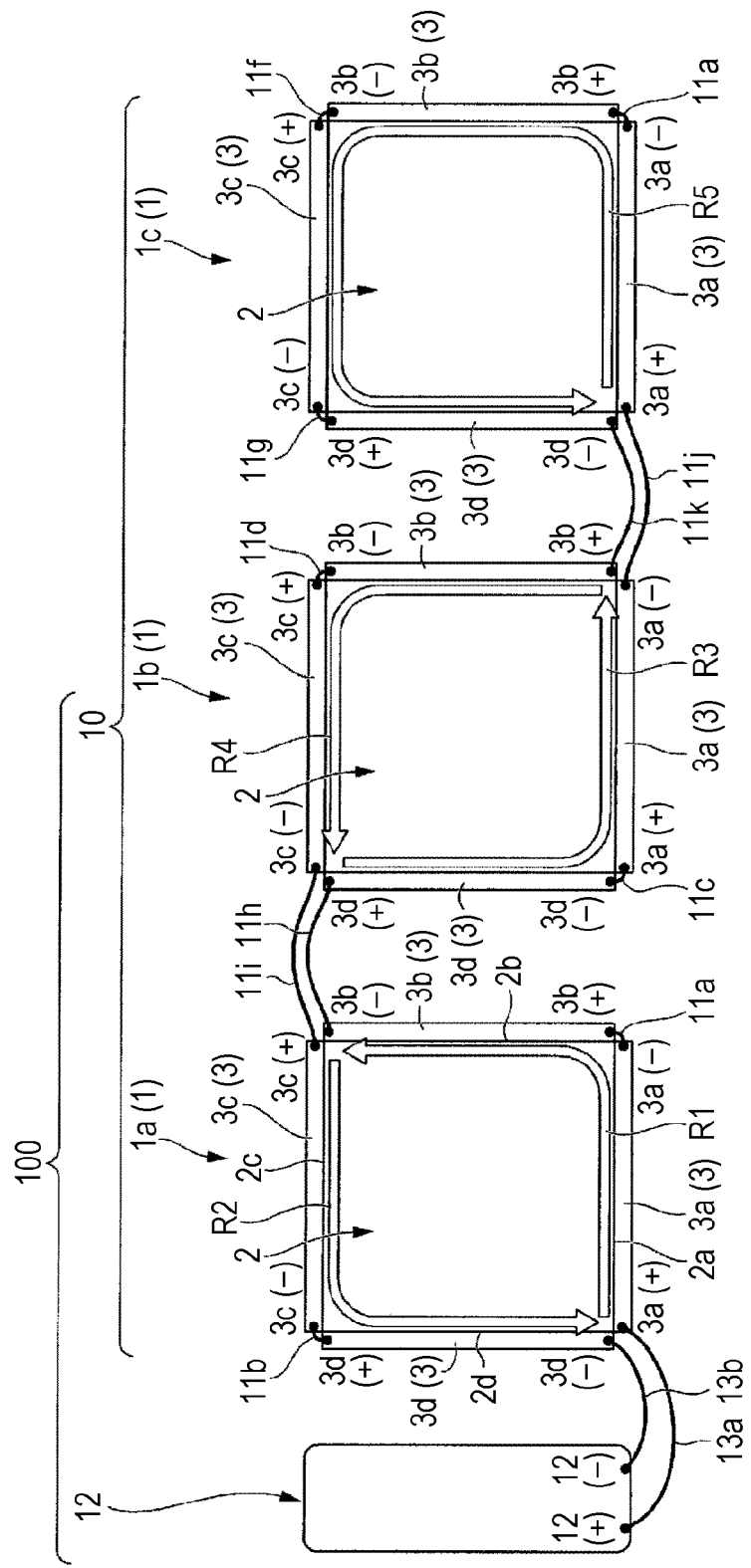
FIG. 6 is a plan view showing an outline configuration of a solar photovoltaic power generation system according to the first embodiment.

FIG. 6 is a plan view showing an outline configuration of a solar photovoltaic power generation system 100 according to the first embodiment of the present invention. In FIG. 6, the depiction of the frame 4 is omitted for the purpose of convenience.

As shown in FIG. 6, the solar photovoltaic power generation system 100 is provided with a solar cell module assembly 10 and a power conditioner 12.

In the solar cell module assembly 10 according to the embodiment, three solar cell modules 1 are arranged such that the three solar cell modules 1 are in a row. Specifically, a first solar cell module 1a, a second solar cell module 1b, and a third solar cell module 1c are arranged in this order from the side of the power conditioner 12.

Here, a description will be given of terminals of the solar cell elements 3. In the following description, reference numerals of terminals (a positive terminal 3a of the first solar element, for example) are represented by a combination of reference numerals of members (the first solar cell element 3a, for example) and symbols of polarity (positive (+), for example).

The first solar cell element 3a is provided with a positive terminal 3a(+) and a negative terminal 3a(−).

The positive terminal 3a(+) is an end of the first solar cell element 3a on the side of the fourth end surface 2d. Specifically, the positive terminal 3a(+) is an end of the flexible substrate 31 arranged at an end of the first end surface 2a on the side of the fourth end surface 2d from among the plurality of flexible substrates 31 (see FIG. 3).

The negative terminal 3a(−) is an end of the first solar cell element 3a on the side of the second end surface 2b. Specifically, the negative terminal 3a(−) is an end of the flexible substrate 31 arranged at an end of the first end surface 2a on the side of the second end surface 2b from among the plurality of flexible substrates 31 (see FIG. 3).

The second solar cell element 3b is provided with a positive terminal 3b(+) and a negative terminal 3b(−).

The positive terminal 3b(+) is an end of the second solar cell element 3b on the side of the first end surface 2a. Specifically, the positive terminal 3b(+) is an end of the flexible substrate 31 arranged at an end of the second end surface 2b on the first end surface 2a from among the plurality of flexible substrates 31.

The negative terminal 3b(−) is an end of the second solar cell element 3b on the side of the third end surface 2c. Specifically, the negative terminal 3b(−) is an end of the flexible substrate 31 arranged at an end of the second end surface 2b on the side of the third end surface 2c from among the plurality of flexible substrates 31.

The third solar cell element 3c is provided with a positive terminal 3c(+) and a negative terminal 3c(−).

The positive terminal 3c(+) is an end of the third solar cell element 3c on the side of the second end surface 2b. Specifically, the positive terminal 3c(+) is an end of the flexible substrate 31 arranged at an end of the third end surface 2c on the side of the second end surface 2b from among the flexible substrates 31.

The negative terminal 3c(−) is an end of the third solar cell element 3c on the side of the fourth end surface 2d. Specifically, the negative terminal 3c(−) is an end of the flexible substrate 31 arranged at an end of the third end surface 2c on the side of the fourth end surface 2d from among the flexible substrates 31.

The fourth solar cell element 3d is provided with a positive terminal 3d(+) and a negative terminal 3d(−).

The positive terminal 3d(+) is an end of the fourth solar cell element 3d on the side of the third end surface 2c. Specifically, the positive terminal 3d(+) is an end of the flexible substrate 31 arranged at an end of the fourth end surface 2d on the side of the third end surface 2c from among the plurality of flexible substrates 31.

The negative terminal 3d(−) is an end of the fourth solar cell element 3d on the side of the first end surface 2a. Specifically, the negative terminal 3d(−) is an end of the flexible substrate 31 arranged at an end of the fourth end surface 2d on the side of the first end surface 2a from among the plurality of flexible substrates 31.

The first solar cell element 3a and the second solar cell element 3b in the first solar cell module 1a are connected to each other in series via connection wiring 11a. Specifically, the negative terminal 3a(−) of the first solar cell element 3a and the positive terminal 3b(+) of the second solar cell element 3b in the first solar cell module 1a are connected to each other in series via the connection wiring 11a. The first solar cell element 3a and the second solar cell element 3b in the first solar cell module 1a configure a first current path R1.

In the first solar cell module 1a, the third solar cell element 3c and the fourth solar cell element 3d are not connected to the first solar cell element 3a and the second solar cell element 3b in series.

The third solar cell element 3c and the fourth solar cell element 3d in the first solar cell module 1a are connected to each other in series via connection wiring 11b. Specifically, the negative terminal 3c(−) of the third solar cell element 3c and the positive terminal 3d(+) of the fourth solar cell element 3d in the first solar cell module 1a are connected to each other in series via the connection wiring 11b. The third solar cell element 3c and the fourth solar cell element 3d in the first solar cell module 1a configure a second current path R2.

The fourth solar cell element 3d and the first solar cell element 3a in the second solar cell module 1b are connected to each other in series via connection wiring 11c. Specifically, the negative terminal 3d(−) of the fourth solar cell element 3d and the positive terminal 3a(+) of the first solar cell element 3a in the second solar cell module 1b are connected to each other in series via the connection wiring 11c. The fourth solar cell element 3d and the first solar cell element 3a in the second solar cell module 1b configure a third current path R3.

In the second solar cell module 1b, the second solar cell element 3b and the third solar element 3c are not connected to the fourth solar cell element 3d and the first solar cell element 3a in series.

The second solar cell element 3b and the third solar cell element 3c in the second solar cell module 1b are connected to each other in series via connection wiring 11d. Specifically, a negative terminal 3b(−) of the second solar cell element 3b and a positive terminal 3c(+) of the third solar cell element 3c in the second solar cell module 1b are connected to each other in series via the connection wiring 11d. The second solar cell element 3b and the third solar cell element 3c configure a fourth current path R4.

In the third solar cell module 1c, the respective solar cell elements are connected in series unlike the first solar cell module 1a and the second solar cell module 1b.

The first solar cell element 3a and the second solar cell element 3b in the third solar cell module 1c are connected to each other in series via connection wiring 11e. Specifically, a negative terminal 3a(−) of the first solar cell element 3a and a positive terminal 3b(+) of the second solar cell element 3b in the third solar cell module 1c are connected to each other in series via the connection wiring 11e.

The second solar cell element 3b and the third solar cell element 3c in the third solar cell module 1c are connected to each other in series via connection wiring 11*f*. Specifically, a negative terminal 3*b*(−) of the second solar cell element 3*b* and a positive terminal 3*c*(+) of the third solar cell element 3*c* in the third solar cell module 1*c* are connected to each other in series via the connection wiring 11*f*.

The third solar cell element 3*c* and the fourth solar cell element 3*d* in the third solar cell module 1*c* are connected to each other in series via connection wiring 11*g*. Specifically, a positive terminal 3*c*(−) of the third solar cell element 3*c* and a positive terminal 3*d*(+) of the fourth solar cell element 3*d* in the third solar cell module 1*c* are connected to each other in series via the connection wiring 11*g*. The first solar cell element 3*a*, the second solar cell element 3*b*, the third solar cell element 3*c*, and the fourth solar cell element 3*d* in the third solar cell module 1*c* configure a fifth current path R5.

According to the embodiment, an ending point of the first current path R1 in the first solar cell module 1*a* and a starting point of the third current path R3 in the second solar cell module 1*b* are connected to each other in series via connection wiring 11*h*. Specifically, the negative terminal 3*b*(−) of the second solar cell element 3*b* in the first solar cell module 1*a* and the positive terminal 3*d*(+) of the fourth solar cell element 3*d* in the second solar cell module 1*b* are connected to each other in series via the connection wiring 11*h*.

A starting point of the second current path R2 in the first solar cell module 1*a* and an ending point of the fourth current path R4 in the second solar cell module 1*b* are connected to each other in series via connection wiring 11*i*. Specifically, the positive terminal 3*c*(+) of the third solar cell element 3*c* in the first solar cell module 1*a* and the negative terminal 3*c*(−) of the third solar cell element 3*c* in the second solar cell module 1*b* are connected to each other in series via the connection wiring 11*i*.

An ending point of the third current path R3 in the second solar cell module 1*b* and a starting point of the fifth current path R5 in the third solar cell module 1*c* are connected to each other in series via connection wiring 11*j*. Specifically, the negative terminal 3*a*(−) of the first solar cell element 3*a* in the second solar cell module 1*b* and the positive terminal 3*a*(+) of the first solar cell element 3*a* in the third solar cell module 1*c* are connected to each other in series via the connection wiring 11*j*.

A starting point of the fourth current path R4 in the second solar cell module 1*b* and an ending point of the fifth current path R5 in the third solar cell module 1*c* are connected to each other in series via connection wiring 11*k*. Specifically, the positive terminal 3*b*(+) of the second solar cell element 3*b* in the second solar cell module 1*b* and the negative terminal 3*d*(−) of the fourth solar cell element 3*d*(−) in the third solar cell module 1*c* are connected to each other in series via the connection wiring 11*k*.

In the solar cell module assembly 10 according to the embodiment, the first current path R1 in the first solar cell module 1*a*, the third current path R3 in the second solar cell module 1*b*, the fifth current path R5 in the third solar cell module 1*c*, the fourth current path R4 in the second solar cell module 1*b*, and the second current path R2 in the first solar cell module 1*a* are connected in series in this order as described above.

The positive terminal 3*a*(+) of the first solar cell element 3*a* in the first solar cell module 1*a* is a starting point of the first current path R1 in the first solar cell module 1*a*. The negative terminal 3*d*(−) of the fourth solar element 3*d* in the first solar cell module 1*a* is an ending point of the second current path R2 in the first solar cell module 1*a*. The starting point of the first current path R1 of the first solar cell module 1*a* and the ending point of the second current path R2 in the first solar cell module 1*a* are arranged so as to be adjacent to each other. The starting point of the first current path R1 in the first solar cell module 1*a* and the ending point of the second current path R2 in the first solar cell module 1*a* are terminals for connecting to an external device.

The power conditioner 12 is an inverter (DC/AC inverter) which transforms DC power, which is output from the solar cell module assembly 10, into AC power. The power conditioner 12 is provided with a positive terminal 12(+) and a negative terminal 12(−).

The power conditioner 12 is connected to the terminals for connection to an external device of the solar cell module assembly 10. Specifically, the positive terminal 12(+) of the power conditioner 12 and the positive terminal 3*a*(+) of the first solar cell element 3*a* in the first solar cell module 1*a* are connected to each other via connection wiring 13*a*. The negative terminal 12(−) of the power conditioner 12 and the negative terminal 3*d*(−) of the fourth solar cell element 3*d* in the first solar cell module 1*a* are connected to each other via connection wiring 13*b*.

Hereinafter, a solar photovoltaic power generation system 1100 according to a comparative example is exemplified, and advantages of the solar photovoltaic power generation system 100 according to the embodiment will be described with reference to FIG. 7.

Figure 7:
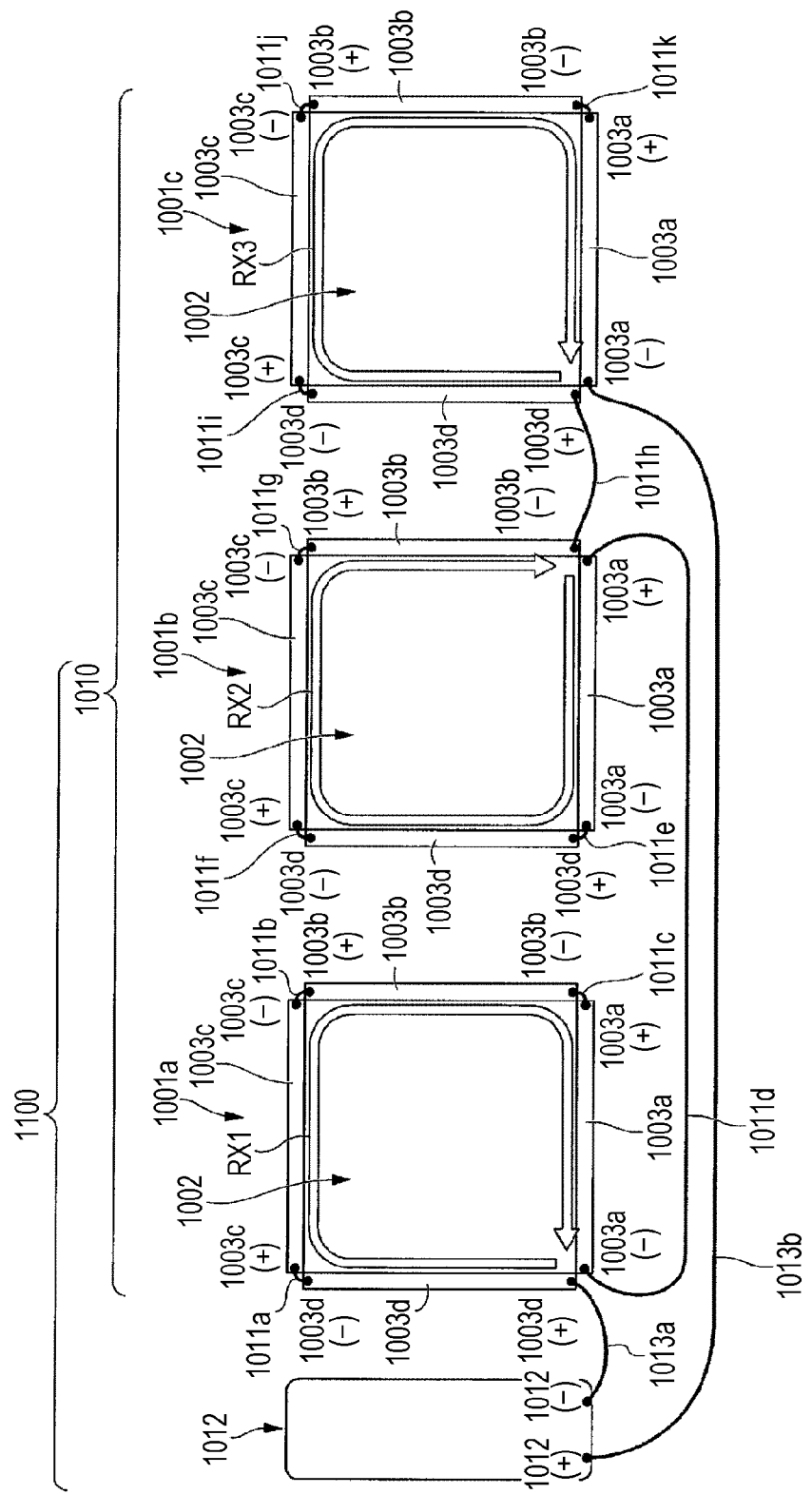
FIG. 7 is a plan view showing an outline configuration of a solar photovoltaic power generation system according to a comparative example.

FIG. 7 is a plan view showing an outline configuration of a solar photovoltaic power generation system 1100 according to the comparative example. In FIG. 7, the depiction of a frame is omitted for the purpose of convenience.

In FIG. 7, a reference numeral 1010 represents a solar cell module assembly. A reference numeral 1012 represents a power conditioner. A reference numeral 1001*a* represents a first solar cell module. A reference numeral 1001*b* represents a second solar cell module. A reference numeral 1001*c* represents a third solar cell module. A reference numeral 1002 represents a light-concentrating panel. A reference numeral 1003*a* represents a first solar cell element. A reference numeral 1003*b* represents a second solar cell element. A reference numeral 1003*c* represents a third solar cell element. A reference numeral 1003*d* represents a fourth solar cell element. A reference numeral 1003*a*(+) represents a positive terminal of the first solar cell element 1003*a*. A reference numeral 1003*a*(−) represents a negative terminal of the first solar cell element 1003*a*. A reference numeral 1003*b*(+) represents a positive terminal of the second terminal cell element 1003*b*. A reference numeral 1003*b*(−) represents a negative terminal of the second solar cell element 1003*b*. A reference numeral 1003*c*(+) represents a positive terminal of the third solar cell element 1003*c*. A reference numeral 1003*c*(−) represents a negative terminal of the third solar cell element 1003*c*. A reference numeral 1003*d*(+) represents a positive terminal of the fourth solar cell element 1003*d*. A reference numeral 1003*d*(−) represents a negative terminal of the fourth solar cell element 1003*d*. Reference numerals 1011*a*, 1011*b*, 1011*c*, 1011*d*, 1011*e*, 1011*f*, 1011*g*, 1011*h*, 1011*i*, 1011*j*, 1011*k*, 1013*a*, and 1013*b* represent connection wiring. A reference numeral RX1 represents a first current path. A reference numeral RX2 represents a second current path. A reference numeral RX3 represents a third current path.

In the solar photovoltaic power generation system 1100 according to the comparative example, four solar cell elements are connected in series in each of the solar cell modules as shown in FIG. 7.

In the solar cell module assembly 1010 according to the comparative example, the first current path RX1 in the first solar cell module 1001a, the second current path RX2 in the second solar cell module 1001b, and the third current path RX3 in the third solar cell module 1001c are connected in series in this order.

In the comparative example, the positive terminal 1012(+) of the power conditioner 1012 and the positive terminal 1003d(+) of the fourth solar cell element 1003d in the first solar cell module 1001a are connected to each other via the connection wiring 1013a. The negative terminal 1012(−) of the power conditioner 1012 and the negative terminal 1003a(−) of the first solar cell element 1003a in the third solar cell module 1001c are connected to each other via the connection wiring 1013b.

For this reason, the distance between the connection terminals of the first solar cell module 1001a and the second solar cell module 1001b, which are adjacent to each other, becomes longer in the comparative example. Specifically, the distance between the negative terminal 1003a(−) of the first solar cell element 1003a in the first solar cell module 1001a and the positive terminal 1003a(+) of the first solar cell element 1003a in the second solar cell module 1001b becomes longer. Therefore, the connection wiring 1011d between the connection terminals becomes quite long.

In the comparative example, the ending point of the third current path RX3 in the third solar cell module 1001c is a connection terminal to the power conditioner 1012. The third solar cell module 1001c is located at the furthest position from the power conditioner 1012 from among the three solar cell modules. Therefore, the connection terminal for the power conditioner is located at a position far from the power conditioner 1012. Specifically, the distance between the negative terminal 1003a(−) of the first solar cell element 1003a in the third solar cell module 1001c and the negative terminal 1012(−) of the power conditioner 1012 becomes longer. For this reason, the connection wiring 1013b to the power conditioner 1012 becomes quite long.

The solar photovoltaic power generation system 1100 according to the comparative example has the following problems. If the connection wiring becomes quite long as shown in FIG. 7, wiring resistance increases, and power loss increases. In addition, the cost of the connection wiring increases. In a case of surrounding the connection wiring with a frame for sealing, it is necessary to provide a large frame. If a large frame is provided, it becomes difficult to connect the wiring in a case in which the solar photovoltaic power generation system is installed at an outdoor location, such as a location on a roof.

In contrast, increasing the diameter of the connection wiring is considered as a method of reducing power loss. However, an increase in diameter of the connection wiring is not reasonable in terms of product cost, a product size, and wiring connection operability.

In contrast, in the solar photovoltaic power generation system 100 according to the embodiment, both the first solar cell module 1a and the second solar cell module 1b include two current paths as shown in FIG. 6. In addition, the first current path R1 in the first solar cell module 1a and the third current path R3 in the second solar cell module 1b are connected in series. The second current path R2 in the first solar cell module 1a and the fourth current path R4 in the second solar cell module 1b are connected in series. For this reason, it is possible to reduce the distance between the connection terminals in the first solar cell module 1a and the second solar cell module 1b, which are adjacent to each other, as compared with the corresponding distance in the comparative example. Accordingly it is possible to reduce the lengths of the connection wiring 11h and 11i between the connection terminals as compared with the length of the connection wiring 1011d in the comparative example.

In addition, the starting point of the first current path R1 in the first solar cell module 1a and the ending point of the second current path R2 in the first solar cell module 1a are connection terminals to the power conditioner 12. The first solar cell module 1a is arranged so as to be adjacent to the power conditioner 12. Therefore, it is possible to locate the connection terminal for the power conditioner to be closer to the power conditioner 12. Accordingly, it is possible to reduce the lengths of the connection wiring 13a to the power conditioner 12 as compared with the connection wiring 1013b in the comparative example.

According to the embodiment, it is possible to reduce the lengths of connection wiring as compared with those in the comparative example as described above. Therefore, it is possible to reduce wiring resistance and to reduce power loss. In addition, it is possible to reduce connection wiring cost.

Even in a case of surrounding the connection wiring with a frame for sealing, it is not necessary to increase the size of the frame. Therefore, a wiring connecting operation is facilitated when the solar photovoltaic power generation system 100 is installed at an outside location such as a location on a roof.

Furthermore, it is not necessary to increase the diameters of the connection wiring, which is preferable in terms of product cost, a product size, and wiring connection operability.

[Second Embodiment]

Hereinafter, a description will be given of a second embodiment of the present invention with reference to FIG. 8.

A basic configuration of a solar photovoltaic power generation system 200 according to the embodiment is the same as that in the first embodiment, and an arrangement configuration of the solar cell modules is different as that in the first embodiment.

Figure 8:
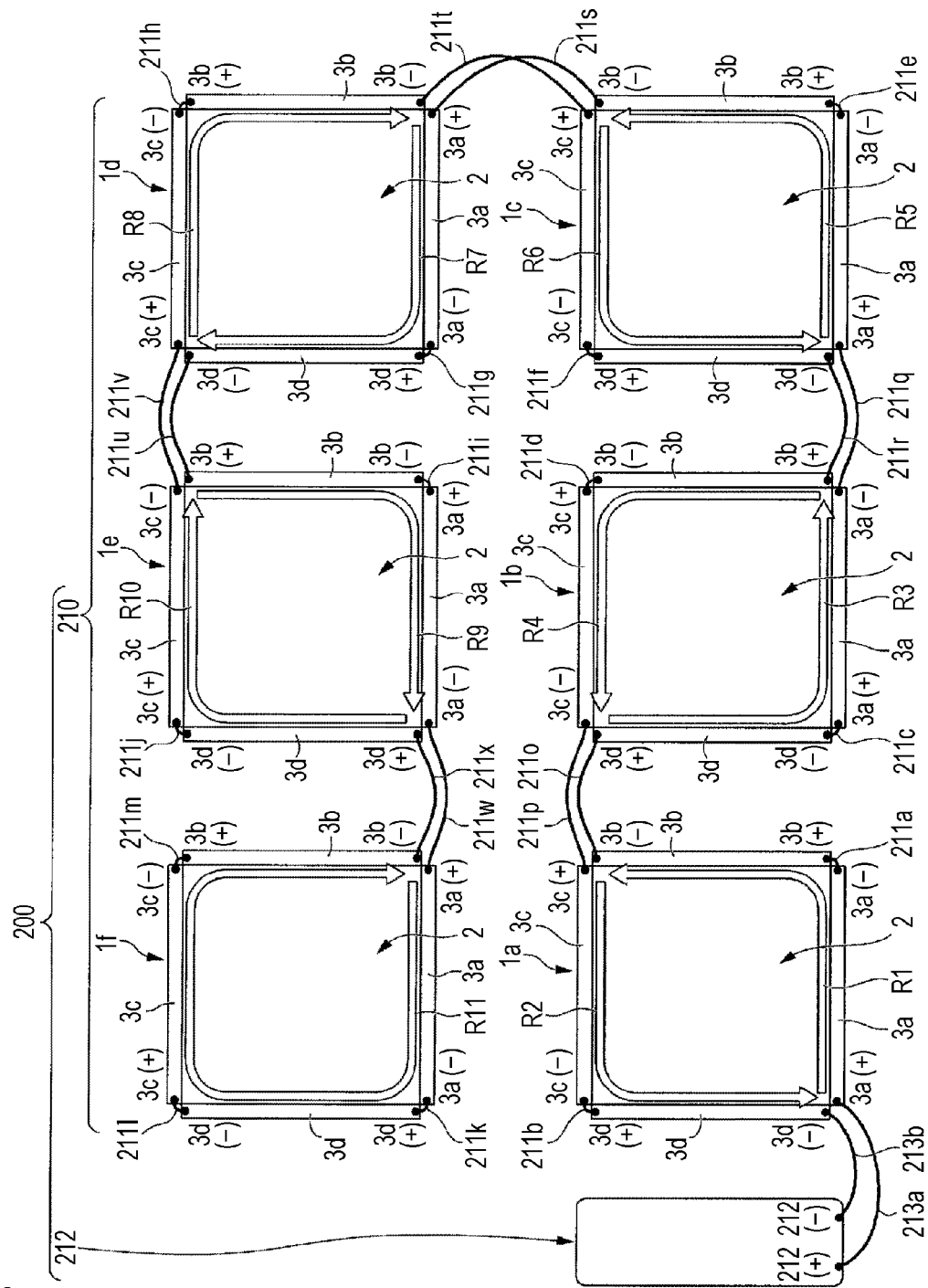
FIG. 8 is a plan view showing an outline configuration of a solar photovoltaic power generation system according to a second embodiment.

FIG. 8 is a plan view showing an outline configuration of the solar photovoltaic power generation system 200 according to the second embodiment. In FIG. 8, the depiction of the frame is omitted for the purpose of convenience. In FIG. 8, the same reference numerals are provided to the same components as those used in the drawings referred to in the first embodiment, and detailed descriptions thereof will be omitted.

As shown in FIG. 8, the solar photovoltaic power generation system 200 is provided with a solar cell module assembly 210 and a power conditioner 212.

In the embodiment, an example in which six solar cell modules 1 are arranged such that three solar cell modules 1 are in each of two rows will be exemplified and described. Specifically, a first solar cell module 1a, a second solar cell module 1b, a third solar cell module 1c, a fourth solar cell module 1d, a fifth solar cell module 1e, and a sixth solar cell module 1f are arranged in this order from the side of the power conditioner 212.

According to the embodiment, the number of arranged solar cell modules 1 is twice as many as the number of arranged solar cell modules 1 in the first embodiment as described above. Hereinafter, a detailed description will be given of the arrangement configuration of the solar cell modules according to the embodiment.

According to the embodiment, a negative terminal 3a(−) of the first solar cell element 3a and a positive terminal 3b(+)

of the second solar cell element 3*b* in the first solar cell module 1*a* are connected to each other in series via connection wiring 211*a*. The first solar cell element 3*a* and the second solar cell element 3*b* in the first solar cell module 1*a* configure a first current path R1.

A negative terminal 3*c*(−) of the third solar cell element 3*c* and a positive terminal 3*d*(+) of the fourth solar cell element 3*d* in the first solar cell module 1*a* are connected to each other in series via connection wiring 211*b*. The third solar cell element 3*c* and the fourth solar cell element 3*d* in the first solar cell module 1*a* configure a second current path R2.

A negative terminal 3*d*(−) of the fourth solar cell element 3*d* and a positive terminal 3*a*(+) of the first solar cell element 3*a* in the second solar cell module 1*b* are connected to each other in series via connection wiring 211*c*. The fourth solar cell element 3*d* and the first solar cell element 3*a* in the second solar cell module 1*b* configure a third current path R3.

A negative terminal 3*b*(−) of the second solar cell element 3*b* and a positive terminal 3*c*(+) of the third solar cell element 3*c* in the second solar cell module 1*b* are connected to each other in series via connection wiring 211*d*. The second solar cell element 3*b* and the third solar cell element 3*c* configure a fourth current path R4.

A negative terminal 3*a*(−) of the first solar cell element 3*a* and a positive terminal 3*b*(+) of the second solar cell element 3*b* in the third solar cell module 1*c* are connected to each other in series via connection wiring 211*e*. The first solar cell element 3*a* and the second solar cell element 3*b* in the third solar cell module 1*c* configure a fifth current path R5.

A negative terminal 3*c*(−) of the third solar cell element 3*c* and a positive terminal 3*d*(+) of the fourth solar cell element 3*d* in the third solar cell module 1*c* are connected to each other in series via connection wiring 211*f*. The third solar cell element 3*c* and the fourth solar cell element 3*d* in the third solar cell module 1*c* configure a sixth current path R6.

A negative terminal 3*a*(−) of the first solar cell element 3*a* and a positive terminal 3*d*(+) of the fourth solar cell element 3*d* in the fourth solar cell module 1*d* are connected to each other in series via connection wiring 211*g*. The first solar cell element 3*a* and the fourth solar cell element 3*d* in the fourth solar cell module 1*d* configure a seventh current path R7.

A negative terminal 3*c*(−) of the third solar cell element 3*c* and a positive terminal 3*b*(+) of the second solar cell element 3*b* in the fourth solar cell module 1*d* are connected to each other in series via connection wiring 211*h*. The third solar cell element 3*c* and the second solar cell element 3*b* configure an eighth current path R8.

A negative terminal 3*b*(−) of the second solar cell element 3*b* and a positive terminal 3*a*(+) of the first solar cell element 3*a* in the fifth solar cell module 1*e* are connected to each other in series via connection wiring 211*i*. The second solar cell element 3*b* and the first solar cell element 3*a* in the fifth solar cell module 1*e* configure a ninth current path R9.

A negative terminal 3*d*(−) of the fourth solar cell element 3*d* and a positive terminal 3*c*(+) of the third solar cell element 3*c* in the fifth solar cell module 1*e* are connected to each other in series via connection wiring 211*j*. The fourth solar cell element 3*d* and the third solar cell element 3*c* in the fifth solar cell module 1*e* configure a tenth current path R10.

A negative terminal 3*a*(−) of the first solar cell element 3*a* and a positive terminal 3*d*(+) of the fourth solar cell element 3*d* in the sixth solar cell module 1*f* are connected to each other in series via connection wiring 211*k*. A negative terminal 3*d*(−) of the fourth solar cell element 3*d* and a positive terminal 3*c*(+) of the third solar cell element 3*c* in the sixth solar cell module 1*f* are connected to each other in series via connection wiring 211*l*. A negative terminal 3*c*(−) of the third solar cell element 3*c* and a positive terminal 3*b*(+) of the second solar cell element 3*b* in the sixth solar cell module 1*f* are connected to each other in series via connection wiring 211*m*. The first solar cell element 3*a*, the fourth solar cell element 3*d*, the third solar cell element 3*c*, and the second solar cell element 3*b* in the sixth solar cell module 1*f* configure an eleventh current path R11.

According to the embodiment, the ending point of the first current path R1 in the first solar cell module 1*a* and the starting point of the third current path R3 in the second solar cell module 1*b* are connected to each other in series via connection wiring 211*o*. Specifically, the negative terminal 3*b*(−) of the second solar cell element 3*b* in the first solar cell module 1*a* and the positive terminal 3*d*(+) of the fourth solar cell element 3*d* in the second solar cell module 1*b* are connected to each other in series via the connection wiring 211*o*.

The starting point of the second current path R2 in the first solar cell module 1*a* and the ending point of the fourth current path R4 in the second solar cell module 1*b* are connected to each other in series via connection wiring 211*p*. Specifically, the positive terminal 3*c*(+) of the third solar cell element 3*c* in the first solar cell module 1*a* and the negative terminal 3*c*(−) of the third solar cell element 3*c* in the second solar cell module 1*b* are connected to each other in series via the connection wiring 211*p*.

The ending point of the third current path R3 in the second solar cell module 1*b* and the starting point of the fifth current path R5 in the third solar cell module 1*c* are connected to each other in series via connection wiring 211*q*. Specifically, the negative terminal 3*a*(−) of the first solar cell element 3*a* in the second solar cell module 1*b* and the positive terminal 3*a*(+) of the first solar cell element 3*a* in the third solar cell module 1*c* are connected to each other in series via the connection wiring 211*q*.

The starting point of the fourth current path R4 in the second solar cell module 1*b* and the ending point of the sixth current path R6 in the third solar cell module 1*c* are connected to each other in series via connection wiring 211*r*. Specifically, the positive terminal 3*b*(+) of the second solar cell element 3*b* in the second solar cell module 1*b* and the negative terminal 3*d*(−) of the fourth solar cell element 3*d* in the third solar cell module 1*c* are connected to each other in series via the connection wiring 211*r*.

The ending point of the fifth current path R5 in the third solar cell module 1*c* and the starting point of the seventh current path R7 in the fourth solar cell module 1*d* are connected to each other in series via connection wiring 211*s*. Specifically, the negative terminal 3*b*(−) of the second solar cell element 3*b* in the third solar cell module 1*c* and the positive terminal 3*a*(+) of the first solar cell element 3*a* in the fourth solar cell module 1*d* are connected to each other in series via the connection wiring 211*s*.

The starting point of the sixth current path R6 in the third solar cell module 1*c* and the ending point of the eighth current path R8 in the fourth solar cell module 1*d* are connected to each other in series via connection wiring 211*t*. Specifically, the positive terminal 3*c*(+) of the third solar cell element 3*c* in the third solar cell module 1*c* and negative terminal 3*b*(−) of the second solar cell element 3*b* in the fourth solar cell module 1*d* are connected to each other in series via the connection wiring 211*t*.

According to the embodiment, the connection wiring 211s and the connection wiring 211t are arranged so as to intersect with each other.

The ending point of the seventh current path R7 in the fourth solar cell module 1d and the starting point of the ninth current path R9 in the fifth solar cell module 1e are connected to each other in series via connection wiring 211u. Specifically, the negative terminal 3d(−) of the fourth solar cell element 3d in the fourth solar cell module 1d and the positive terminal 3b(+) of the second solar cell element 3b in the fifth solar cell module 1e are connected to each other in series via the connection wiring 211u.

The starting point of the eighth current path R8 in the fourth solar cell module 1d and the ending point of the tenth current path R10 in the fifth solar cell module 1e are connected to each other in series via connection wiring 211v. Specifically, the positive terminal 3c(+) of the third solar cell element 3c in the fourth solar cell module 1d and the negative terminal 3c(−) of the third solar cell element 3c in the fifth solar cell module 1e are connected to each other in series via the connection wiring 211v.

The ending point of the ninth current path R9 in the fifth solar cell module 1e and the starting point of the eleventh current path R11 in the sixth solar cell module 1f are connected to each other in series via connection wiring 211w. Specifically, the negative terminal 3a(−) of the first solar cell element 3a in the fifth solar cell module 1e and the positive terminal 3a(+) of the first solar cell element 3a in the sixth solar cell module 1f are connected to each other in series via the connection wiring 211w.

The starting point of the tenth current path R10 in the fifth solar cell module 1e and the ending point of the eleventh current path R11 in the sixth solar cell module 1f are connected to each other in series via connection wiring 211x. Specifically, the positive terminal 3d(+) of the fourth solar cell element 3d in the fifth solar cell module 1e and the negative terminal 3b(−) of the second solar cell element 3b in the sixth solar cell module 1f are connected to each other in series via the connection wiring 211x.

In the solar cell module assembly 210 according to the embodiment, the first current path R1 in the first solar cell module 1a, the third current path R3 in the second solar cell module 1b, the fifth current path R5 in the third solar cell module 1c, the seventh current path R7 in the fourth solar cell module 1d, the ninth current path R9 in the fifth solar cell module 1e, the eleventh current path R11 in the sixth solar cell module 1f, the tenth current path R10 in the fifth solar cell module 1e, the eighth current path R8 in the fourth solar cell module 1d, the sixth current path R6 in the third solar cell module 1c, the fourth current path R4 in the second solar cell module 1b, and the second current path R2 in the first solar cell module 1a are connected in series in this order as described above.

A positive terminal 212(+) of the power conditioner 212 and the positive terminal 3a(+) of the first solar cell element 3a in the first solar cell module 1a are connected to each other via connection wiring 213a. A negative terminal 212(−) of the power conditioner 212 and the negative terminal 3d(−) of the fourth solar cell element 3d in the first solar cell module 1a are connected to each other via connection wiring 213b.

If the six solar cell modules 1 are arranged such that the three solar cell modules 1 are in each of two rows as in the embodiment, the total length of the plurality of pieces of connection wiring becomes long as compared with the case according to the first embodiment (the case in which three solar cell modules 1 are arranged such that the three solar cell module 1 are in a row). Therefore, a significant actual advantage is achieved from the effect in that it is possible to reduce wiring resistance and to reduce power loss. In addition, a significant actual advantage is achieved from the effect in that it is possible to reduce connection wiring cost and to facilitate the wiring connecting operation, which is preferable in terms of product cost, a product size, and wiring connection operability.

[Third Embodiment]

Hereinafter, a description will be given of a third embodiment of the present invention with reference to FIG. 9.

A basic configuration of a solar photovoltaic power generation system 300 according to the embodiment is the same as that in the first embodiment, and an arrangement configuration of connection wiring is different from that in the first embodiment.

Figure 9:
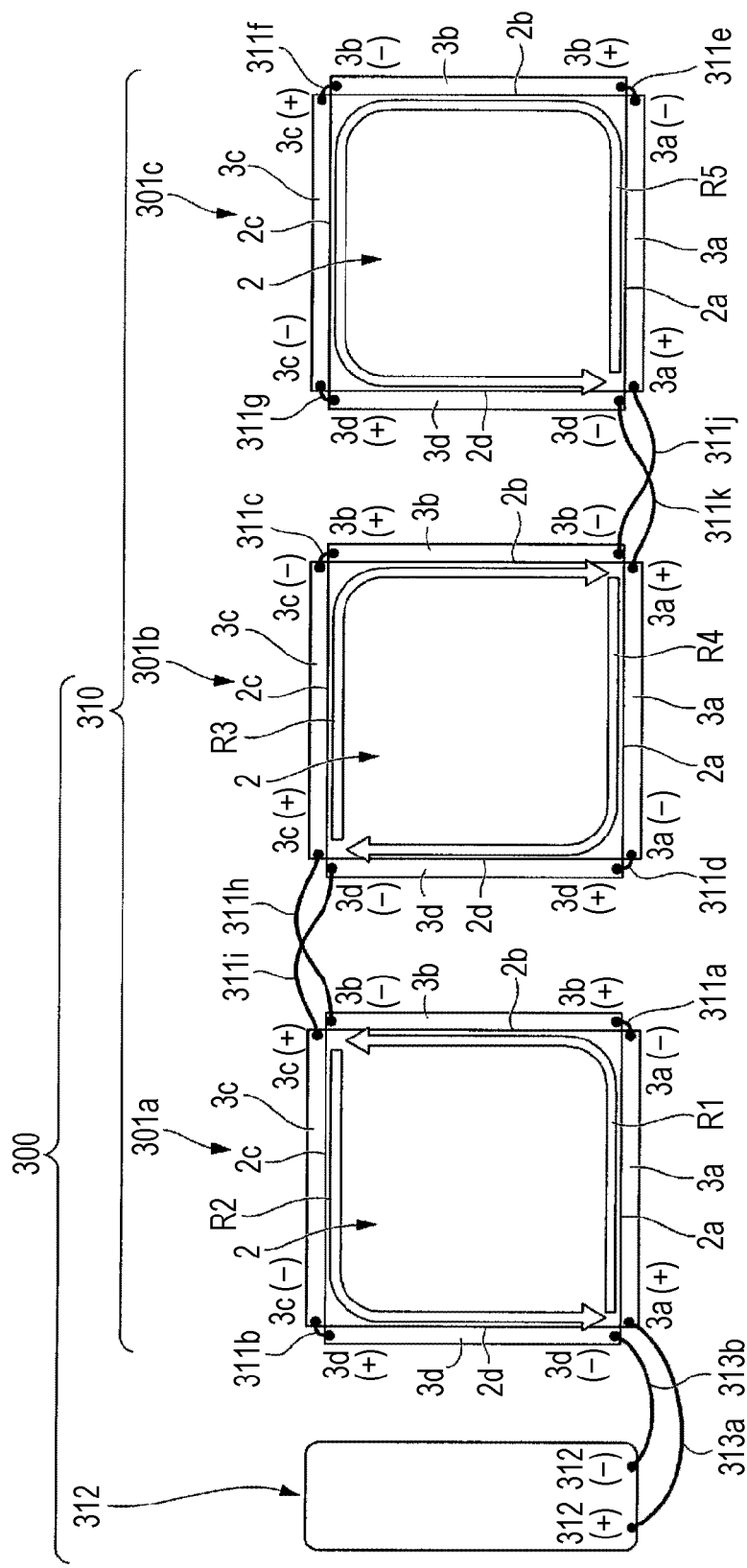
FIG. 9 is a plan view showing an outline configuration of a solar photovoltaic power generation system according to a third embodiment.

FIG. 9 is a plan view showing an outline configuration of the solar photovoltaic power generation system 300 according to the third embodiment. In FIG. 9, the depiction of a frame is omitted for the purpose of convenience. In FIG. 9, the same reference numerals are provided to the same components as those used in the first embodiment, and detailed descriptions thereof will be omitted.

As shown in FIG. 9, the solar photovoltaic power generation system 300 is provided with a solar cell module assembly 310 and a power conditioner 312.

In the solar cell module assembly 310 according to the embodiment, terminal polarities of the solar cell elements 3 are reversed. In the embodiment, a case in which terminal polarities of solar cell elements 3 in a second solar cell module 301b from among three solar cell modules are reversed will be exemplified and described as an example.

That is, in the solar cell module assembly 310 according to the embodiment, terminal polarities of the solar cell elements 3 in the first solar cell module 301a and the third solar cell module 301c are the same as those in the first embodiment. However, terminal polarities of the solar cell elements 3 in the second solar cell module 301b are different from those in the first embodiment and are reversed. Hereinafter, a detailed description will be given.

In each of the first solar cell module 301a and the third solar cell module 301c, a positive terminal 3a(+) of a first solar cell element 3a is an end of the first solar cell element 3a on the side of a fourth end surface 2d. A negative terminal 3a(−) of the first solar cell element 3a is an end of the first solar cell element 3a on the side of a second end surface 2b.

A positive terminal 3b(+) of a second solar cell element 3b is an end of the second solar cell element 3b on the side of the first end surface 2a. A negative terminal 3b(−) of the second solar cell element 3b is an end of the second solar cell element 3b on the side of a third end surface 2c.

A positive terminal 3c(+) of a third solar cell element 3c is an end of the third solar cell element 3c on the side of the second end surface 2b. A negative terminal 3c(−) of the third solar cell element 3c is an end of the third solar cell element 3c on the side of a fourth end surface 2d.

A positive terminal 3d(+) of a fourth solar cell element 3d is an end of the fourth solar cell element 3d on the side of the third end surface 2c. A negative terminal 3d(−) of the fourth solar cell element 3d is an end of the fourth solar cell element 3d on the side of the first end surface 2a.

In contrast, in the second solar cell module 301b, a positive terminal 3a(+) of a first solar cell element 3a is an end of the first solar cell element 3a on the side of a second end surface 2b. A negative terminal 3a(−) of the first solar cell element 3a is an end of the first solar cell element 3a on the side of a fourth end surface 2d.

A positive terminal 3b(+) of a second solar cell element 3b is an end of the second solar cell element 3b on the side of a third end surface 2c. A negative terminal 3b(−) of the second solar cell element 3b is an end of the second solar cell element 3b on the side of a first end surface 2a.

A positive terminal 3c(+) of a third solar cell element 3c is an end of the third solar cell element 3c on the side of the fourth end surface 2d. A negative terminal 3c(−) of the third solar cell element 3c is an end of the third solar cell element 3c on the side of the second end surface 2b.

A positive terminal 3d(+) of a fourth solar cell element 3d is an end of the fourth solar cell element 3d on the side of the first end surface 2a. A negative terminal 3d(−) of the fourth solar cell element 3d is an end of the fourth solar cell element 3d on the side of the third end surface 2c.

According to the embodiment, the negative terminal 3a(−) of the first solar cell element 3a and the positive terminal 3b(+) of the second solar cell element 3b in the first solar cell module 301a are connected to each other in series via connection wiring 311a. The first solar cell element 3a and the second solar cell element 3b in the first solar cell module 301a configure a first current path R1.

The negative terminal 3c(−) of the third solar cell element 3c and the positive terminal 3d(+) of the fourth solar cell element 3d in the first solar cell module 301a are connected to each other in series via connection wiring 311b. The third solar cell element 3c and the fourth solar cell element 3d in the first solar cell module 301a configure a second current path R2.

The negative terminal 3c(−) of the third solar cell element 3c and the positive terminal 3b(+) of the second solar cell element 3b in the second solar cell module 301b are connected to each other in series via connection wiring 311c. The third solar cell element 3c and the second solar cell element 3b in the second solar cell module 301b configure a third current path R3.

The negative terminal 3a(−) of the first solar cell element 3a and the positive terminal 3d(+) of the fourth solar cell element 3d in the second solar cell module 301b are connected to each other in series via connection wiring 311d. The first solar cell element 3a and the fourth solar cell element 3d configure a fourth current path R4.

The negative terminal 3a(−) of the first solar cell element 3a and the positive terminal 3b(+) of the second solar cell element 3b in the third solar cell module 301c are connected to each other in series via connection wiring 311e. The negative terminal 3b(−) of the second solar cell element 3b and the positive terminal 3c(+) of the third solar cell element 3c in the third solar cell module 301c are connected to each other via connection wiring 311f. The negative terminal 3c(−) of the third solar cell element 3c and the positive terminal 3d(+) of the fourth solar cell element 3d in the third solar cell module 301c are connected to each other in series. The first solar cell element 3a, the second solar cell element 3b, the third solar cell element 3c, and the fourth solar cell element 3d in the third solar cell module 301c configure a fifth current path R5.

According to the embodiment, an ending point of the first current path R1 in the first solar cell module 301a and a starting point of the third current path R3 in the second solar cell module 301b are connected to each other in series via connection wiring 311h. Specifically, the negative terminal 3b(−) of the second solar cell element 3b in the first solar cell module 301a and the positive terminal 3c(+) of the third solar cell element 3c in the second solar cell module 301b are connected to each other in series via the connection wiring 311h.

A starting point of the second current path R2 in the first solar cell module 301a and an ending point of the fourth current path R4 in the second solar cell module 301b are connected to each other in series via connection wiring 311i. Specifically, the positive terminal 3c(+) of the third solar cell element 3c in the first solar cell module 301a and the negative terminal 3d(−) of the fourth solar cell element 3d in the second solar cell module 301b are connected to each other via the connection wiring 311i.

According to the embodiment, the connection wiring 311h and the connection wiring 311i are arranged so as to intersect with each other.

An ending point of the third current path R3 in the second solar cell module 301b and a starting point of the fifth current path R5 in the third solar cell module 301c are connected to each other in series via connection wiring 311j. Specifically, a negative terminal 3b(−) of the second solar cell element 3b in the second solar cell module 301b and the positive terminal 3a(+) of the first solar cell element 3a in the third solar cell module 301c are connected to each other in series via the connection wiring 311j.

A starting point of the fourth current path R4 in the second solar cell module 301b and an ending point of the fifth current path R5 in the third solar cell module 301c are connected to each other in series via connection wiring 311k. Specifically, the positive terminal 3a(+) of the first solar cell element 3a in the second solar cell module 301b and the negative terminal 3d(−) of the fourth solar cell element 3d in the third solar cell module 301c are connected to each other in series via the connection wiring 311k.

According to the embodiment, the connection wiring 311j and the connection wiring 311k are arranged so as to intersect with each other.

In the solar cell module assembly 310 according to the embodiment, the first current path R1 in the first solar cell module 301a, the third current path R3 in the second solar cell module 301b, the fifth current path R5 in the third solar cell module 301c, the fourth current path R4 in the second solar cell module 301b, and the second current path R2 in the first solar cell module 301a are connected in series in this order as described above.

A positive terminal 312(+) of the power conditioner 312 and the positive terminal 3a(+) of the first solar cell element 3a in the first solar cell module 301a are connected to each other via connection wiring 313a. A negative terminal 312(−) of the power conditioner 312 and the negative terminal 3d(−) of the fourth solar cell element 3d in the first solar cell module 301a are connected to each other via connection wiring 313b.

If the terminal polarities of the solar cell elements 3 are reversed in the solar cell module as in the embodiment, it becomes more difficult to perform the wiring connecting operation as compared with the case according to the first embodiment (the case in which the terminal polarities of the solar cell elements 3 are the same in the respective solar cell modules 1). Therefore, a significant actual advantage is achieved from the effect in that the wiring connecting operation is facilitated by reducing the lengths of the connection wiring as compared with those in the comparative example.

[Fourth Embodiment]

Hereinafter, a description will be given of a fourth embodiment of the present invention with reference to FIG. 10.

A basic configuration of a solar photovoltaic power generation system 400 according to the embodiment is the same as that in the first embodiment, and a planar shape of a light-concentrating panel is different from that in the first embodiment.

Figure 10:
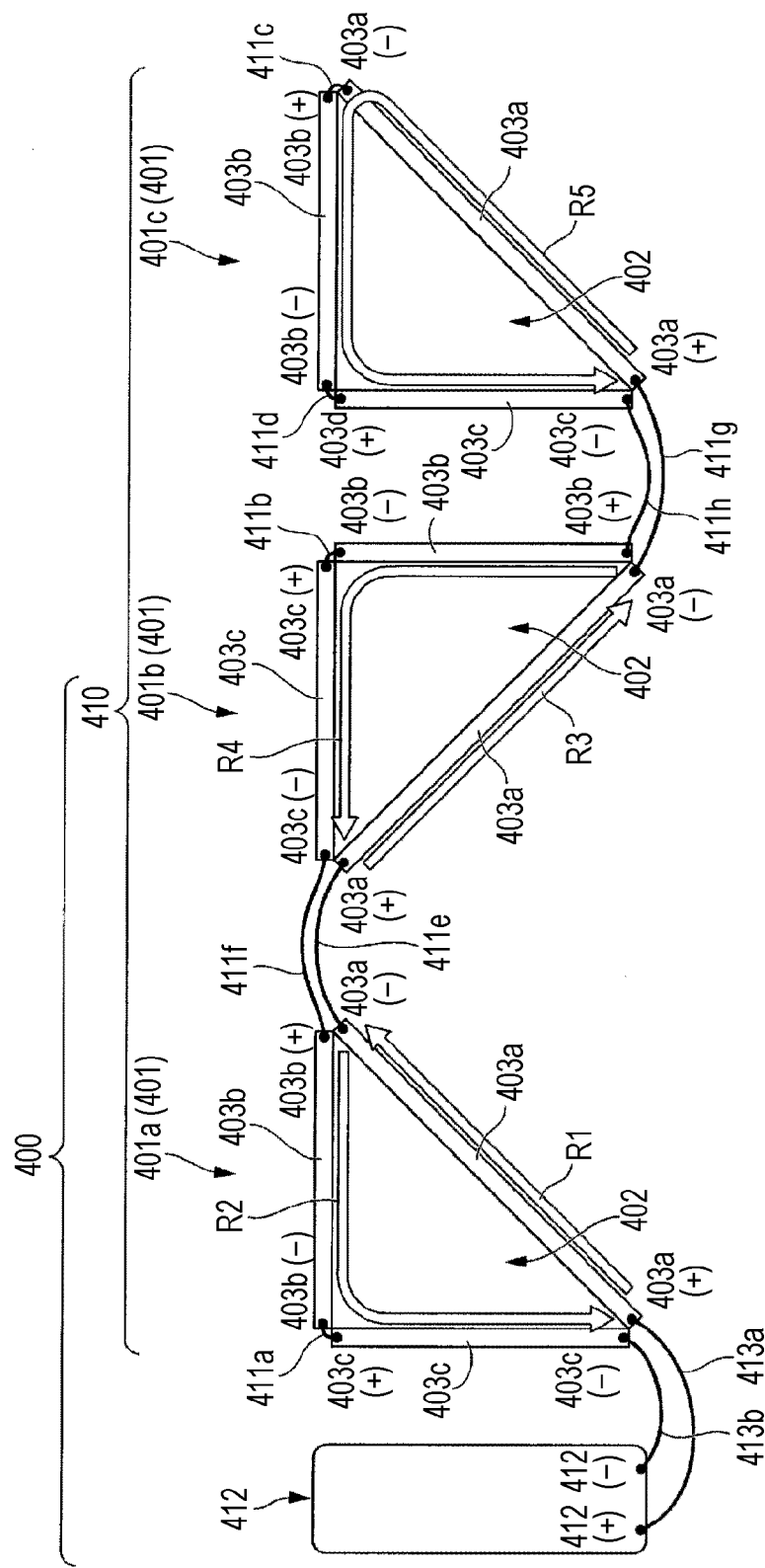
FIG. 10 is a plan view showing an outline configuration of a solar photovoltaic power generation system according to a fourth embodiment.

FIG. 10 is a plan view showing an outline configuration of the solar photovoltaic power generation system 400 according to the fourth embodiment. In FIG. 10, the depiction of a frame is omitted for the purpose of convenience. In FIG. 10, the same reference numerals are given to the same components as those used in the first embodiment, and detailed descriptions thereof will be omitted.

As shown in FIG. 10, the solar photovoltaic power generation system 400 is provided with a solar cell module assembly 410 and a power conditioner 412.

In this embodiment, a case in which a planar shape of a light-concentrating panel 302 is a triangular shape will be exemplified and described as an example. The number of solar cell elements is equal to the number of sides of the triangles. According to the embodiment, three solar cell elements are arranged in each solar cell module 401.

In the solar cell module assembly 410 according to the embodiment, a first solar cell module 401a, a second solar cell module 401b, and a third solar cell module 401c are arranged in this order from the side of the power conditioner 412.

According to the embodiment, the first solar cell element 403a in the first solar cell module 401a configures a first current path R1.

A negative terminal 403b(−) of a second solar cell element 403b and a positive terminal 3d(+) of the third solar cell element 403c in the first solar cell module 401a are connected to each other in series via connection wiring 411a. The second solar cell element 403b and the third solar cell element 403c in the first solar cell module 1a configure a second current path R2.

A first solar cell element 403a in the second solar cell module 401b configures a third current path R3.

A negative terminal 403b(−) of a second solar cell element 403b and a positive terminal 403c(+) of a third solar cell element 403c in the second solar cell module 401b are connected to each other in series via connection wiring 411b. The second solar cell element 403b and the third solar cell element 403c configure a fourth current path R4.

A negative terminal 403a(−) of a first solar cell element 403a and a positive terminal 403b(+) of a second solar cell element 403b in the third solar cell module 401c are connected to each other in series via connection wiring 411c. A negative terminal 403b(−) of the second solar cell element 403b and a positive terminal 403c(+) of the third solar cell element 403c in the third solar cell module 401c are connected to each other in series via connection wiring 411d. The first solar cell element 403a, the second solar cell element 403b, and the third solar cell element 403c in the third solar cell module 401c configure a fifth current path R5.

According to the embodiment, an ending point of the first current path R1 in the first solar cell module 401a and a starting point of the third current path R3 in the second solar cell module 401b are connected to each other in series via connection wiring 411e. Specifically, the negative terminal 403a(−) of the first solar cell element 403a in the first solar cell module 401a and the positive terminal 403a(+) of the first solar cell element 403a in the second solar cell module 401b are connected to each other in series via the connection wiring 411e.

A starting point of the second current path R2 in the first solar cell module 401a and the ending point of the fourth current path R4 in the second solar cell module 401b are connected to each other in series via connection wiring 411f. Specifically, the positive terminal 403b(+) of the second solar cell element 403b in the first solar cell module 401a and the negative terminal 403c(−) of the third solar cell element 403c in the second solar cell module 401b are connected to each other in series via the connection wiring 411f.

An ending point of the third current path R3 in the second solar cell module 401b and a starting point of the fifth current path R5 in the third solar cell module 401c are connected to each other in series via connection wiring 411g. Specifically, the negative terminal 403a(−) of the first solar cell element 403a in the second solar cell module 401b and the positive terminal 403a(+) of the first solar cell element 403a in the third solar cell module 401c are connected to each other in series via the connection wiring 411g.

A starting point of the fourth current path R4 in the second solar cell module 401b and the ending point of the fifth current path R5 in the third solar cell module 401c are connected to each other in series via connection wiring 411h. Specifically, the positive terminal 403b(+) of the second solar cell element 403b in the second solar cell module 401b and the negative terminal 403c(−) of the third solar cell element 403c in the third solar cell module 401c are connected to each other in series via the connection wiring 411h.

In the solar cell module assembly 410 according to the embodiment, the first current path R1 in the first solar cell module 401a, the third current path R3 in the second solar cell module 401b, the fifth current path R5 in the third solar cell module 401c, the fourth current path R4 in the second solar cell module 401b, and the second current path R2 in the first solar cell module 401a are connected in series in this order as described above.

A positive terminal 412(+) of the power conditioner 412 and the positive terminal 403a(+) of the first solar cell element 403a in the first solar cell module 401a are connected to each other via connection wiring 413a. A negative terminal 412(−) of the power conditioner 412 and the negative terminal 403c(−) of the third solar cell element 403c in the first solar cell module 401a are connected to each other via connection wiring 413b.

If the planar shape of the light-concentrating panel 402 is a triangular shape as in the embodiment, it is possible to reduce the number of pieces of the connection wiring as compared with the case according to the first embodiment (the case in which the planar shape of the light-concentrating panel 2 is a quadrangular shape). Therefore, further effects in that it is possible to reduce connection wiring cost and to facilitate the wiring connecting operation, which is preferable in terms of product cost, a product size, and wiring connection operability, are achieved.

In addition, it is possible to reduce the lengths of the connection wiring as compared with a light-concentrating panel according to the comparative example in which the planar shape thereof is a triangular shape. Therefore, it is possible to reduce wiring resistance and to reduce power loss. In addition, it is possible to reduce connection wiring cost. The wiring connecting operation is facilitated.

[Fifth Embodiment]

Hereinafter, a description will be given of a fifth embodiment of the present invention with reference to FIG. 11.

A basic configuration of a solar photovoltaic power generation system 500 according to the embodiment is the same as that in the first embodiment, and the fifth embodiment is different from the first embodiment in that light-concentrating panels with different planar shapes are used.

Figure 11:
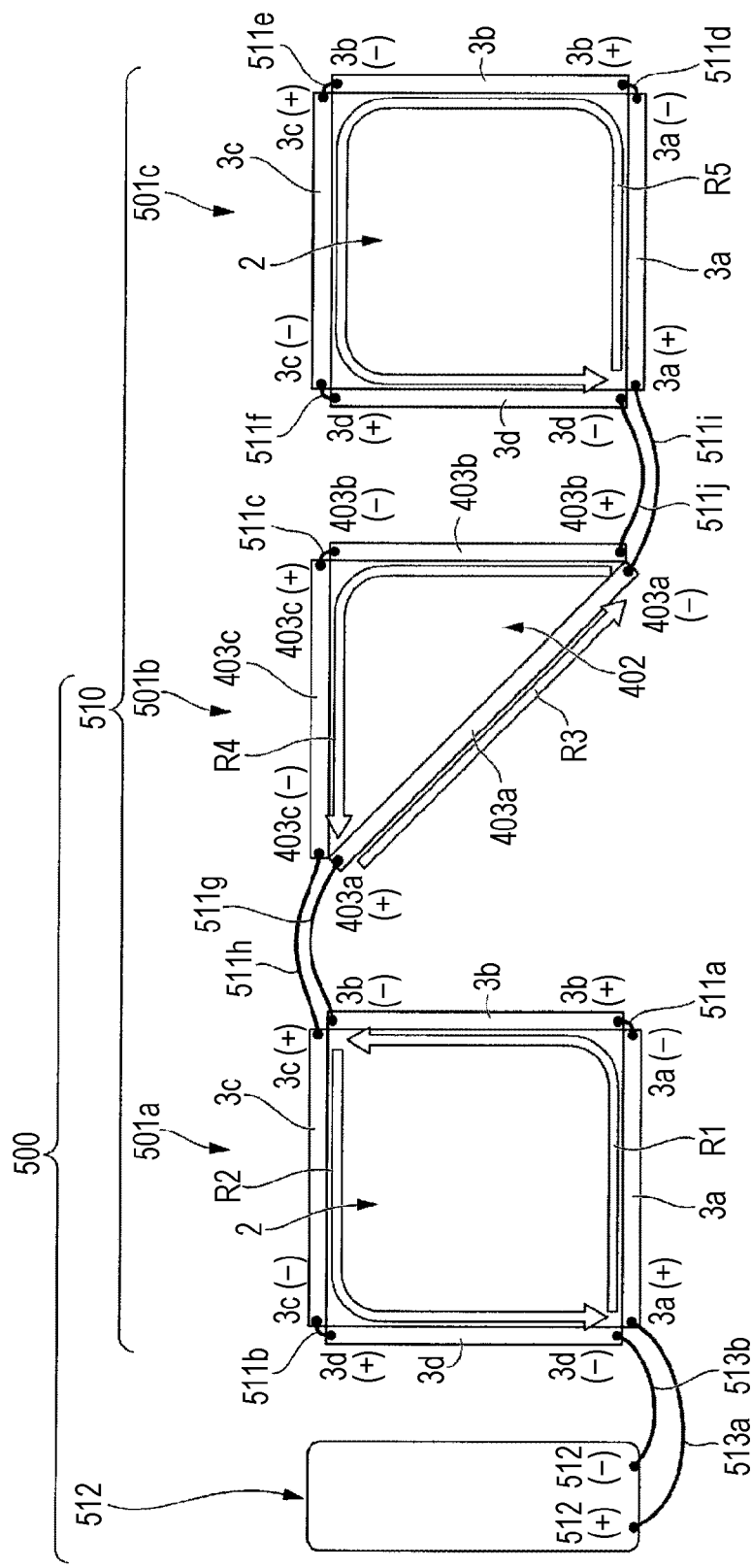
FIG. 11 is a plan view showing an outline configuration of a solar photovoltaic power generation system according to a fifth embodiment.

FIG. 11 is a plan view showing an outline configuration of the solar photovoltaic power generation system 500 according to the fifth embodiment. In FIG. 11, the depiction of a frame is omitted for the purpose of convenience. In FIG. 11, the same reference numerals are given to the same components as those used in the first embodiment, and detailed descriptions thereof will be omitted.

As shown in FIG. 11, the solar photovoltaic power generation system 500 is provided with a solar cell module assembly 510 and a power conditioner 512.

In the embodiment, a case in which light-concentrating panels 2, each of which has a quadrangular planar shape, and a light-concentrating panel 402, which has a triangular planar shape, are used will be exemplified and described as an example.

In the solar cell module assembly 510 according to the embodiment, a first solar cell module 501a, a second solar cell module 501b, and a third solar cell module 501c are arranged in this order from the side of the power conditioner 512.

In addition, the first solar cell module 501a and the third solar cell module 501c according to the embodiment correspond to the solar cell module 1 in the first embodiment. The second solar cell module 501b according to the embodiment corresponds to the solar cell module 401 in the fourth embodiment.

According to the embodiment, a negative terminal 3a(−) of a first solar cell element 3a and a positive terminal 3b(+) of a second solar cell element 3b in the first solar cell module 501a are connected to each other in series via connection wiring 511a. The first solar cell element 3a and the second solar cell element 3b in the first solar cell module 501a configure a first current path R1.

A negative terminal 3c(−) of a third solar cell element 3c and a positive terminal 3d(+) of a fourth solar cell element 3d in the first solar cell module 501a are connected to each other in series via connection wiring 511b. The third solar cell element 3c and the fourth solar cell element 3d in the first solar cell module 501a configure a second current path R2.

A first solar cell element 403a in the second solar cell module 501b configures a third current path R3.

A negative terminal 403b(−) of a second solar cell element 403b and a positive terminal 403c(+) of a third solar cell element 403c in the second solar cell module 501b are connected to each other in series via connection wiring 511c. The second solar cell element 403b and the third solar cell element 403c configure a fourth current path R4.

A negative terminal 3a(−) of a first solar cell element 3a and a positive terminal 3b(+) of a second solar cell element 3b in the third solar cell module 501c are connected to each other in series via connection wiring 511d. A negative terminal 3b(−) of the second solar cell element 3b and a positive terminal 3c(+) of a third solar cell element 3c in the third solar cell module 501c are connected to each other via connection wiring 511e. A negative terminal 3c(−) of the third solar cell element 3c and a positive terminal 3d(+) of a fourth solar cell element 3d in the third solar cell module 501c are connected to each other in series via connection wiring 511f. The first solar cell element 3a, the second solar cell element 3b, the third solar cell element 3c, and the fourth solar cell element 3d in the third solar cell module 501c configure a fifth current path R5.

According to the embodiment, an ending point of the first current path R1 in the first solar cell module 501a and a starting point of the third current path R3 in the second solar cell module 501b are connected to each other in series via connection wiring 511g. Specifically, the negative terminal 3b(−) of the second solar cell element 3b in the first solar cell module 501a and the positive terminal 403a(+) of the first solar cell element 403a in the second solar cell module 501b are connected to each other in series via the connection wiring 511g.

A starting point of the second current path R2 in the first solar cell module 501a and an ending point of the fourth current path R4 in the second solar cell module 501b are connected to each other in series via connection wiring 511h. Specifically, the positive terminal 3c(+) of the third solar cell element 3c in the first solar cell module 501a and the negative terminal 403c(−) of the third solar cell element 403c in the second solar cell module 501b are connected to each other in series via the connection wiring 511h.

An ending point of the third current path R3 in the second solar cell module 501b and a starting point of the fifth current path R5 in the third solar cell module 501c are connected to each other in series via connection wiring 511i. Specifically, the negative terminal 403a(−) of the first solar cell element 403a in the second solar cell module 501b and the positive terminal 3a(+) of the first solar cell element 3a in the third solar cell module 501c are connected to each other in series via the connection wiring 511i.

A starting point of the fourth current path R4 in the second solar cell module 501b and an ending point of the fifth current path R5 in the third solar cell module 501c are connected to each other in series via connection wiring 511j. Specifically, the positive terminal 403b(+) of the second solar cell element 403b in the second solar cell module 501b and the negative terminal 3d(−) of the fourth solar cell element 3d in the third solar cell module 501c are connected to each other in series via the connection wiring 511j.

In the solar cell module assembly 510 according to the embodiment, the first current path R1 in the first solar cell module 501a, the third current path R3 in the second solar cell module 501b, the fifth current path R5 in the third solar cell module 501c, the fourth current path R4 in the second solar cell module 501b, and the second current path R2 in the first solar cell module 501a are connected in series in this order as described above.

A positive terminal 512(+) of the power conditioner 512 and the positive terminal 3a(+) of the first solar cell element 3a in the first solar cell module 501a are connected to each other via connection wiring 513a. A negative terminal 512(−) of the power conditioner 512 and the negative terminal 3d(−) of the fourth solar cell element 3d in the first solar cell module 501a are connected to each other via connection wiring 513b.

Even in the case in which the light-concentrating panels 2, each of which has a quadrangular planar shape, and the light-concentrating panel 402, which has a triangular planar shape, are used as in the embodiment, the same effects as those in the case according to the first embodiment, that is, the effects in that it is possible to reduce wiring resistance, to reduce power loss, to reduce connection wiring cost, and to facilitate the wiring connecting operation, which is preferable in terms of product cost, a product size, and wiring connection operability, are achieved.

[Sixth Embodiment]

Hereinafter, a description will be given of a sixth embodiment of the present invention with reference to FIG. 12.

A basic configuration of a solar photovoltaic power generation system 600 according to the embodiment is the same as that in the first embodiment, and the sixth embodiment is different from the first embodiment in that reflecting mirrors are provided at end surfaces of light-concentrating panels, which correspond to sides of polygonal shape where no solar cell element is provided.

Figure 12:
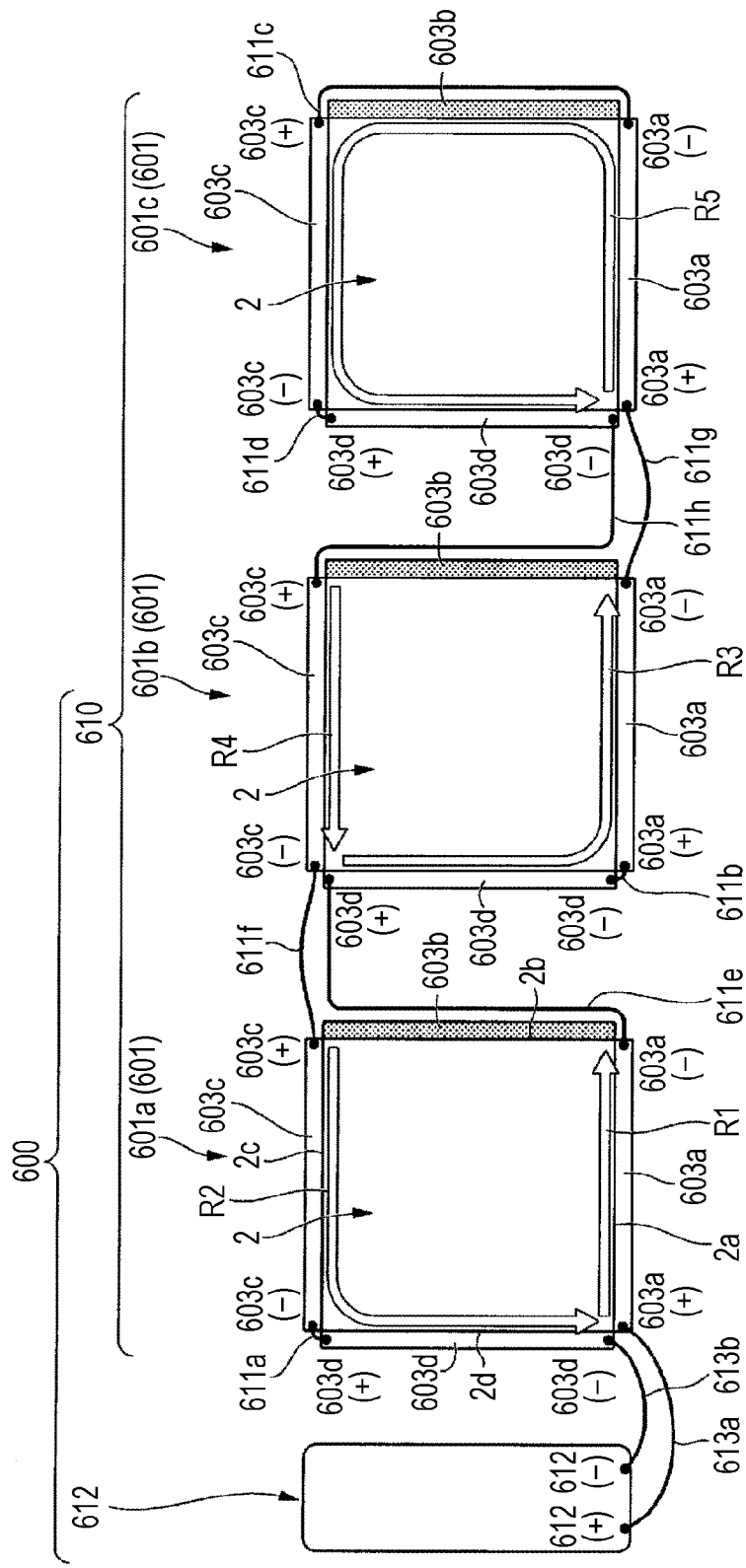
FIG. 12 is a plan view showing an outline configuration of a solar photovoltaic power generation system according to a sixth embodiment.

FIG. 12 is a plan view showing an outline configuration of the solar photovoltaic power generation system 600 according to the sixth embodiment. In FIG. 12, the depiction of a frame is omitted for the purpose of convenience. In FIG. 12, the same reference numerals are given to the same components as those used in the first embodiment, and detailed descriptions thereof will be omitted.

As shown in FIG. 12, the solar photovoltaic power generation system 600 is provided with a solar cell module assembly 610 and a power conditioner 612.

In the solar cell module assembly 610 according to the embodiment, a planar shape of each light-concentrating panel 2 is a quadrangular shape, and the number of solar cell elements is smaller than the number of sides of the quadrangular shape. In the embodiment, a case in which three solar cell elements and one reflecting mirror are arranged in each solar cell module 601 will be exemplified and described as an example.

In the solar cell module assembly 610 according to the embodiment, a first solar cell module 601a, a second solar cell module 601b, and a third solar cell module 601c are arranged in this order from the side of the power conditioner 612.

According to the embodiment, a second solar cell element is not arranged at a second end surface 2b of each light-concentrating panel 2. At the second end surface 2b of each light-concentrating panel 2 corresponding to the side of the quadrangular shape where the second solar cell element is not provided, a reflecting mirror 603b is provided. The reflecting mirror 603b reflects light propagating inside each light-concentrating panel 2. A reflecting surface of the reflecting mirror 603b faces the end surface 2b of each light-concentrating panel 2.

As the reflecting mirror 603b, a reflecting layer made of a metal film of silver, aluminum, or the like, a reflecting layer made of a dielectric multi-layer film such as an ESR (Enhanced Specular Reflector) reflecting film (manufactured by 3M Japan Limited), or the like can be used. In addition, the reflecting mirror 603b is not limited to these examples. As the reflecting mirror 603b, it is desirable to use a reflecting mirror exhibiting high reflectance at an emission wavelength of the fluorescent material.

According to the embodiment, a first solar cell element 603a in the first solar cell module 601a configures a first current path R1.

A negative terminal 603c(−) of a third solar cell element 603c and a positive terminal 603d(+) of a fourth solar cell element 603d in the first solar cell module 601a are connected to each other in series via connection wiring 611a. The third solar cell element 603c and the fourth solar cell element 603d in the first solar cell module 601a configure a second current path R2.

A negative terminal 603d(−) of a fourth solar cell element 603d and a positive terminal 603a(+) of a first solar cell element 603a in the second solar cell module 601b are connected to each other in series via connection wiring 611b. The fourth solar cell element 603d and the third solar cell element 603c in the second solar cell module 601b configure a third current path R3.

A third solar cell element 603c in the second solar cell module 601b configures a fourth current path R4.

A negative terminal 603a(−) of a first solar cell element 603a and a positive terminal 603c(+) of a third solar cell element 603c in the third solar cell module 601c are connected to each other in series via connection wiring 611c.

According to the embodiment, the connection wiring 611c is provided on a surface on the opposite side of the reflecting surface of the reflecting mirror 603b in the third solar cell module 601c. With such a configuration, it is possible to suppress a decrease in reflection efficiency of the reflecting mirror 603b as compared with the case in which the connection wiring 611c is provided on the reflecting surface of the reflecting mirror 603b.

A negative terminal 603c(−) of a third solar cell element 603c and a positive terminal 603d(+) of a fourth solar cell element 603d in the third solar cell module 601c are connected to each other in series via connection wiring 611d. The first solar cell element 603a, the third solar cell element 603c, and the fourth solar cell element 603d in the third solar cell module 601c configure a fifth current path R5.

According to the embodiment, an ending point of the first current path R1 in the first solar cell module 601a and a starting point of the third current path R3 in the second solar cell module 601b are connected to each other in series via connection wiring 611e. Specifically, the negative terminal 603a(−) of the first solar cell element 603a in the first solar cell module 601a and the positive terminal 603d(+) of the fourth solar cell element 603d in the second solar cell module 601b are connected to each other in series via the connection wiring 611e.

According to the embodiment, the connection wiring 611e is provided on a surface on the opposite side of the reflecting surface of the reflecting mirror 603b in the first solar cell module 601a. With such a configuration, it is possible to suppress a decrease in reflection efficiency of the reflecting mirror 603b as compared with the case in which the connection wiring 611e is provided on the reflecting surface of the reflecting mirror 603b.

A starting point of the second current path R2 in the first solar cell module 601a and an ending point of the fourth current path R4 in the second solar cell module 601b are connected to each other in series via connection wiring 611f. Specifically, the positive terminal 603c(+) of the third solar cell element 603c in the first solar cell module 601a and the negative terminal 603c(−) of the third solar cell element 603c in the second solar cell module 601b are connected to each other in series via the connection wiring 611f.

An ending point of the third current path R3 in the second solar cell module 601b and a starting point of the fifth current path R5 in the third solar cell module 601c are connected to each other in series via connection wiring 611g. Specifically, the negative terminal 603a(−) of the first solar cell element 603a in the second solar cell module 601b and the positive terminal 603a(+) of the first solar cell element 603a in the third solar cell module 601c are connected to each other in series via the connection wiring 611g.

A starting point of the fourth current path R4 in the second solar cell module 601b and an ending point of the fifth current path R5 in the third solar cell module 601c are connected to each other in series via connection wiring 611h. Specifically, the positive terminal 603c(+) of the third solar cell element 603c in the second solar cell module 601b and the positive terminal 603d(−) of the fourth solar cell element 603d in the third solar cell module 601c are connected to each other in series via the connection wiring 611h.

According to the embodiment, the connection wiring 611h is provided on the surface on the opposite side of the reflecting surface of the reflecting mirror 603b in the second solar cell module 601b. With such a configuration, it is possible to suppress a decrease in reflection efficiency of the reflecting mirror 603*b* as compared with the case in which the connection wiring 611*h* is provided on the reflecting surface of the reflecting mirror 603*b*.

In the solar cell module assembly 610 according to the embodiment, the first current path R1 in the first solar cell module 601*a*, the third current path R3 in the second solar cell module 601*b*, the fifth current path R5 in the third solar cell module 601*c*, the fourth current path R4 in the second solar cell module 601*b*, and the second current path R2 in the first solar cell module 601*a* are connected in series in this order as described above.

A positive terminal 612(+) of the power conditioner 612 and the positive terminal 603*a*(+) of the first solar cell element 603*a* in the first solar cell module 601*a* are connected to each other via connection wiring 613*a*. A negative terminal 612(−) of the power conditioner 612 and the negative terminal 603*d*(−) of the fourth solar cell element 603*d* in the first solar cell module 601*a* are connected to each other via connection wiring 613*b*.

Even with the configuration in which the reflecting mirror 603*b* is provided on the second end surface 2*b* of each light-concentrating panel 2 as in the embodiment, the same effects as those in the case according to the first embodiment, that is, the effects in that it is possible to reduce wiring resistance, to reduce power loss, to reduce connection wiring cost, and to facilitate the wiring connecting operation, which is preferable in terms of product cost, a product size, and wiring connection operability, are achieved.

[Seventh Embodiment]

Hereinafter, a description will be given of a seventh embodiment of the present invention with reference to FIG. 13.

A basic configuration of a solar photovoltaic power generation system 700 according to the embodiment is the same as that in the sixth embodiment, and the seventh embodiment is different from the sixth embodiment in that solar cell modules in which reflecting mirrors are arranged at different positions are used.

Figure 13:
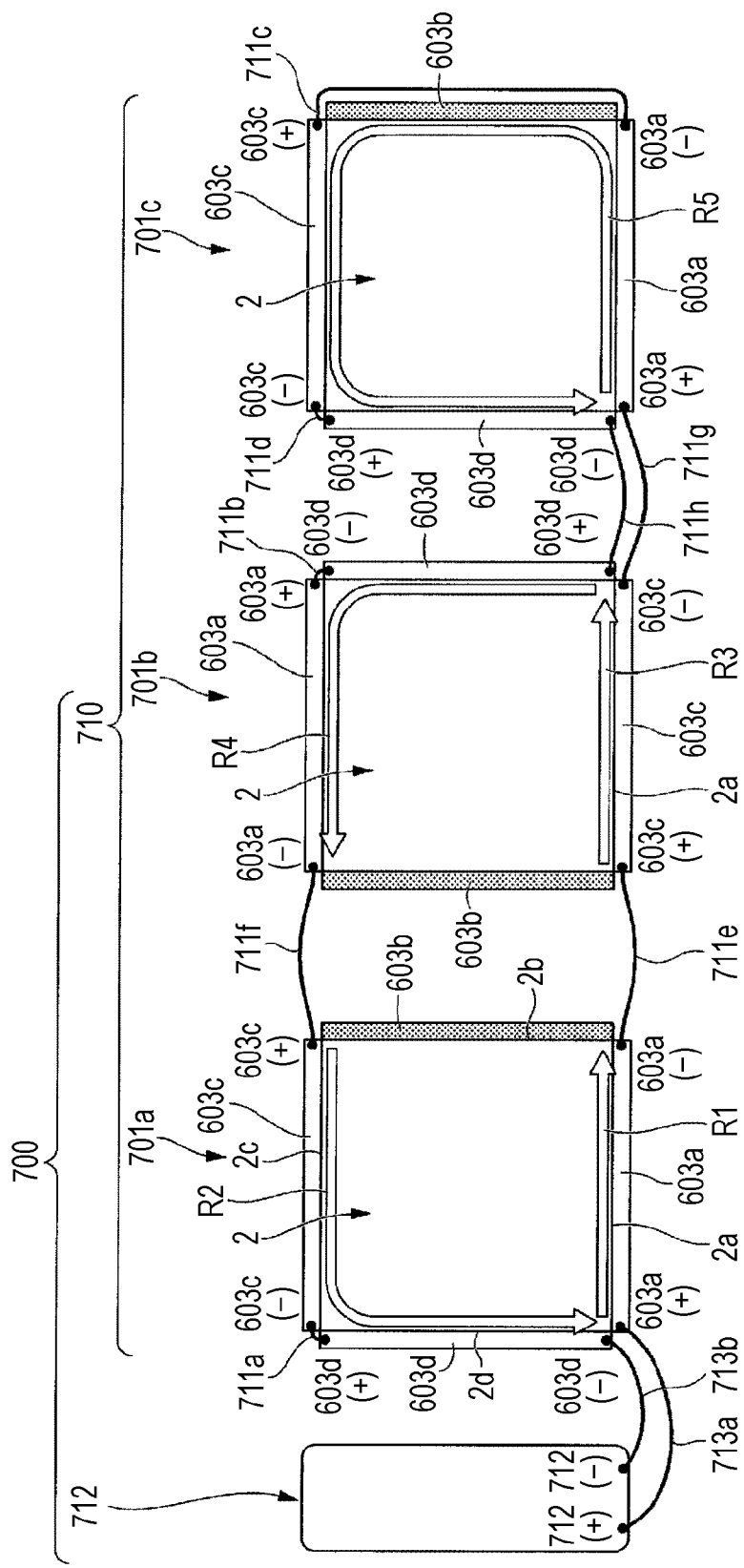
FIG. 13 is a plan view showing an outline configuration of a solar photovoltaic power generation system according to a seventh embodiment.

FIG. 13 is a plan view showing an outline configuration of a solar photovoltaic power generation system 700 according to the seventh embodiment. In FIG. 13, the depiction of a frame is omitted for the purpose of convenience. In FIG. 13, the same reference numerals are given to the same components as those used in the sixth embodiment, and detailed descriptions thereof will be omitted.

As shown in FIG. 13, the solar photovoltaic power generation system 700 is provided with a solar cell module assembly 710 and a power conditioner 712.

In the embodiment, a case in which arrangement positions of reflecting mirrors 603*b* in a first solar cell module 701*a* and a third solar cell module 701*c* are different from the arrangement position of the reflecting mirror 603*b* in a second solar cell module 701*b* will be exemplified and described as an example.

In the solar cell module assembly 710 according to the embodiment, the first solar cell module 701*a*, the second solar cell module 701*b*, and the third solar cell module 701*c* are arranged in this order from the side of the power conditioner 712.

In addition, the first solar cell module 701*a* and the third solar cell module 701*c* according to the embodiment correspond to the solar cell module 601 according to the sixth embodiment. The second solar cell module 701*b* according to the embodiment corresponds to the solar cell module 601 according to the sixth embodiment after being rotated about a center of the light-concentrating panel 2 by 180°.

According to the embodiment, a surface on the opposite side of a reflecting surface of a reflecting mirror 603*b* in the second solar cell module 701*b* is arranged so as to face a surface opposite of a reflecting surface of a reflecting mirror 603*b* in the first solar cell module 701*a*. In contrast, a surface on the opposite side of a light-receiving surface of a fourth solar cell element 603*d* in the second solar cell module 701*b* is arranged so as to face a surface on the opposite side of a light-receiving surface of a fourth solar cell element 603*d* in the third solar cell module 701*c*.

According to the embodiment, a first solar cell element 603*a* in the first solar cell module 701*a* configures a first current path R1.

A negative terminal 603*c*(−) of a third solar cell element 603*c* and a positive terminal 603*d*(+) of a fourth solar cell element 603*d* in the first solar cell module 701*a* are connected to each other in series via connection wiring 711*a*. The third solar cell element 603*c* and the fourth solar cell element 603*d* in the first solar cell module 701*a* configure a second current path R2.

A third solar cell element 603*c* in the second solar cell module 701*b* configures a third current path R3.

A negative terminal 603*d*(−) of a fourth solar cell element 603*d* and a positive terminal 603*a*(+) of a first solar cell element 603*a* in the second solar cell module 701*b* are connected to each other in series via connection wiring 711*b*. The fourth solar cell element 603*d* and the third solar cell element 603*c* in the second solar cell module 701*b* configure a fourth current path R4.

A negative terminal 603*a*(−) of a first solar cell element 603*a* and a positive terminal 603*c*(+) of a third solar cell element 603*c* in the third solar cell module 701*c* are connected to each other in series via connection wiring 711*c*.

According to the embodiment, the connection wiring 711*c* is provided on the surface opposite to the reflecting surface of the reflecting mirror 603*b* in the third solar cell module 701*c*. With such a configuration, it is possible to suppress a decrease in reflection efficiency of the reflecting mirror 603*b* as compared with the case in which the connection wiring 711*c* is provided on the reflecting surface of the reflecting mirror 603*b*.

A negative terminal 603*c*(−) of a third solar cell element 603*c* and a positive terminal 603*d*(+) of a fourth solar cell element 603*d* in the third solar cell module 701*c* are connected to each other in series via connection wiring 711*d*. The first solar cell element 603*a*, the third solar cell element 603*c*, and the fourth solar cell element 603*d* in the third solar cell module 701*c* configure a fifth current path R5.

According to the embodiment, an ending point of the first current path R1 in the first solar cell module 701*a* and a starting point of the third current path R3 in the second solar cell module 701*b* are connected to each other in series via connection wiring 711*e*. Specifically, the negative terminal 603*a*(−) of the first solar cell element 603*a* in the first solar cell module 701*a* and the positive terminal 603*c*(+) of the third solar cell element 603*c* in the second solar cell module 701*b* are connected to each other in series via the connection wiring 711*e*.

A starting point of the second current path R2 in the first solar cell module 701*a* and an ending point of the fourth current path R4 in the second solar cell module 701*b* are connected to each other in series via connection wiring 711*f*. Specifically, the positive terminal 603*c*(+) of the third solar cell element 603*c* in the first solar cell module 701*a* and the negative terminal 603*c*(−) of the third solar cell element 603*c* in the second solar cell module 701*b* are connected to each other in series via the connection wiring 711*f*.

An ending point of the third current path R3 in the second solar cell module 701b and a starting point of the fifth current path R5 in the third solar cell module 701c are connected to each other in series via connection wiring 711g. Specifically, the negative terminal 603a(−) of the first solar cell element 603a in the second solar cell module 701b and the positive terminal 603a(+) of the first solar cell element 603a in the third solar cell module 701c are connected to each other in series via the connection wiring 711g.

A starting point of the fourth current path R4 in the second solar cell module 701b and an ending point of the fifth current path R5 in the third solar cell module 701c are connected to each other in series via connection wiring 711h. Specifically, the positive terminal 603c(+) of the third solar cell element 603c in the second solar cell module 701b and the negative terminal 603d(−) of the fourth solar cell element 603d in the third solar cell module 701c are connected to each other in series via the connection wiring 711h.

In the solar cell module assembly 610 according to the embodiment, the first current path R1 in the first solar cell module 701a, the third current path R3 in the second solar cell module 701b, the fifth current path R5 in the third solar cell module 701c, the fourth current path R4 in the second solar cell module 701b, and the second current path R2 in the first solar cell module 701a are connected in series in this order as described above.

A positive terminal 712(+) of the power conditioner 712 and the positive terminal 603a(+) of the first solar cell element 603a in the first solar cell module 701a are connected to each other via connection wiring 713a. A negative terminal 712(−) of the power conditioner 712 and the negative terminal 603d(−) of the fourth solar cell element 603d in the first solar cell module 701a are connected to each other via connection wiring 713b.

According to the embodiment, the surface on the opposite side of the reflecting surface of the reflecting mirror 603b in the second solar cell module 701b is arranged so as to face the surface on the opposite side of the reflecting surface of the reflecting mirror 603b in the first solar cell module 701a. Therefore, in the configuration in which the reflecting mirror 603b is provided on the second end surface 2b of each light-concentrating panel 2, it is possible to reduce the lengths of the connection wiring between the first solar cell module 701a and the second solar cell module 701b and between the second solar cell module 701b and the third solar cell module 701c as compared with the configuration according to the sixth embodiment. That is, it is not necessary to extend the connection wiring along the surfaces on the opposite side of the reflecting surfaces of the reflecting mirrors 603b between the first solar cell module 701a and the second solar cell module 701b and between the second solar cell module 701b and the third solar cell module 701c. Therefore, according to the embodiment, it is possible to reduce the lengths of the connection wiring 711e and 711h as compared with the configuration according to the sixth embodiment. Therefore, further effects in that it is possible to reduce wiring resistance, to reduce power loss, to reduce connection wiring cost, and to facilitate wiring connecting operation, which is preferable in terms of product cost, a product size, and wiring connection operability, are achieved.

[Eighth Embodiment]

Hereinafter, a description will be given of an eighth embodiment of the present invention with reference to FIGS. 14 and 15.

A basic configuration of a solar photovoltaic power generation system 800 according to the embodiment is the same as that in the first embodiment, and the eighth embodiment is different from the first embodiment in that solar cell elements are provided on a first main surface of each light-concentrating panel.

Figure 14:
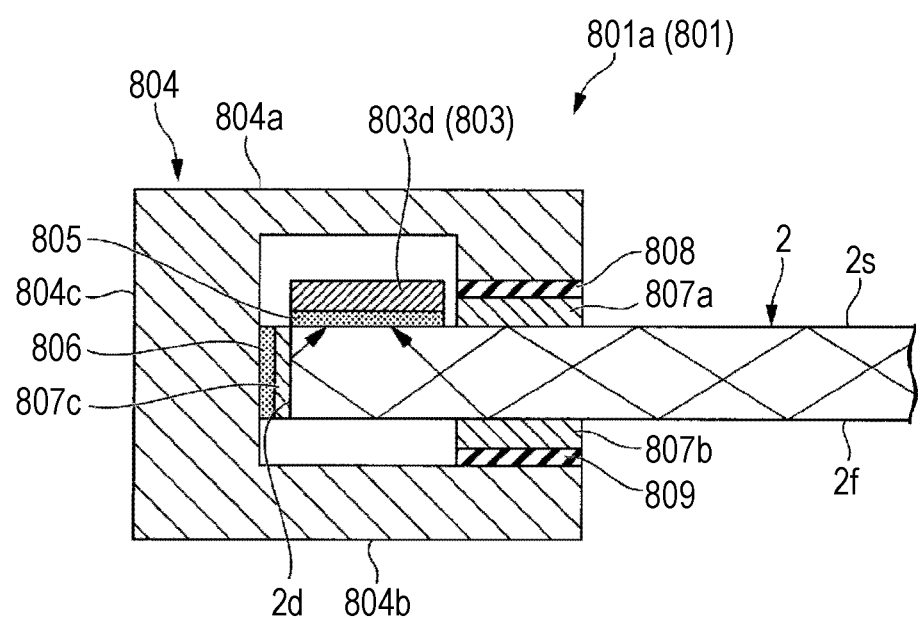
FIG. 14 is a cross-sectional view of a solar cell module according to an eighth embodiment.

FIG. 14 is an enlarged cross-sectional view of main parts of a solar cell module 801 according to the eighth embodiment. In FIG. 14, the depiction of terminals of solar cell elements and connection wiring is omitted for the purpose of convenience.

In FIG. 14, a configuration of a first solar cell module 801a will be exemplified and described as a configuration of the solar cell module 801. Configurations of a second solar cell module 801b and a third solar cell module 801c, which will be described later, are the same as that of the first solar cell module 801a.

In FIG. 14, an arrangement configuration of a fourth solar cell element 803d will be exemplified and described as an arrangement configuration of a solar cell element 803. Arrangement configurations of a first solar cell element 803a, a second solar cell element 803b, and a third solar cell element 803c are the same as an arrangement configuration of a fourth solar cell element 803d.

In addition, as arrangement configurations of a first reflecting layer 807a, a second reflecting layer 807b, a reflecting mirror 807c, a first buffer layer 808, and a second buffer layer 809, arrangement configurations on the side of a fourth end surface 2d will be exemplified and described. Arrangement configurations of the first reflecting layer 807a, the second reflecting layer 807b, the reflecting mirror 807c, the first buffer layer 808, and the second buffer layer 809 on the side of a first end surface 2a, the side of a second end surface 2c, and the side of a third end surface are the same as those on the side of the fourth end surface 2d.

In FIG. 14, the same reference numerals will be given to the same components as those used in the first embodiment, and detailed descriptions thereof will be omitted.

As shown in FIG. 14, each light-concentrating panel 2 according to the embodiment collects light which is incident from the outside and emits the light from a first main surface 2s. The fourth solar cell element 803d is arranged on the first surface 2s of the light-concentrating panel 2. The fourth solar cell element 803d receives light which is emitted from the first main surface 2s of the light-concentrating panel 2.

The fourth solar cell element 803d is joined to the first main surface 2s of the light-concentrating panel 2 with a transparent adhesive 805. As the transparent adhesive 805, ethylene-vinyl acetate copolymer (EVA) can be used. A refractive index of the transparent adhesive 805 is 1.50 which is substantially the same as that of the light-concentrating panel 2. As the transparent adhesive 805, a thermosetting adhesive such as an epoxy-based adhesive, a silicone-based adhesive, or a polyimide-based adhesive may be used.

The reflecting mirror 807c is arranged on the fourth end surface 2d of the light-concentrating panel 2. The reflecting mirror 807c reflects light, which advances from the inside of the light-concentrating panel 2 toward the outside thereof (light emitted from the fluorescent material 21), toward the inside of the light-concentrating panel 2. As the reflecting mirror 807c, a reflecting layer made of a dielectric multilayer film such as an ESR (Enhanced Specular Reflector) reflecting film (manufactured by 3M Japan Limited) or the like can be used. If the material is used, it is possible to realize reflectance which is as high as 98% or greater under visible light. In addition, a reflecting layer made of a metal film of aluminum (Al), copper (Cu), gold (Au), silver (Ag) or the like may be used as the reflecting mirror 807c.

A frame 804 is provided with a top panel portion 804a, a bottom panel portion 804b, and a side wall portion 804c.

The top panel portion 804a is formed so as to cover the fourth solar cell element 803d. A first end of the top panel portion 804a is connected to the side wall portion 804c. A second end of the top panel portion 804a extends to a portion beyond the fourth solar cell element 803d of the light-concentrating panel 2. The bottom panel portion 804b is arranged so as to face the top panel portion 804a with the light-concentrating panel 2 interposed therebetween. A first end of the bottom panel portion 804b is connected to the side wall portion 804c. A second end of the bottom panel portion 804b extends up to an end of a second main surface 2f of the light-concentrating panel 2 on the side of the fourth end surface 2d. A length of the bottom panel portion 804b in a direction parallel to the main surface of the light-concentrating panel 2 is substantially equal to a length of the top panel portion 804a in the direction parallel to the main surface of the light-concentrating panel 2.

The reflecting mirror 807c is joined to an inner wall surface of the side wall portion 804c of the frame 804 with an adhesive 806. As the adhesive 806, a thermosetting adhesive such as ethylene-vinyl acetate copolymer (EVA), an epoxy-based adhesive, a silicone-based adhesive, or a polyimide-based adhesive is suitably used.

Between the second end of the top panel portion 804a of the frame 804 and the first main surface 2s of the light-concentrating panel 2, the first reflecting layer 807a and the first buffer layer 808 are provided.

A reflecting surface of the first reflecting layer 807a faces the first main surface 2s of the light-concentrating panel 2. The first reflecting layer 807a reflects light, which advances from the inside of the light-concentrating panel 2 toward the side thereof (light emitted from the fluorescent material 21), toward the inside of the light-concentrating panel 2. As the first reflecting layer 807a, a reflecting layer made of a dielectric multi-layer film of ESR or the like or a reflecting layer made of a metal film of Al, Cu, Au, Ag, or the like can be used.

The first buffer layer 808 is arranged between the first reflecting layer 807a and the second end of the top panel portion 804a of the frame 804. The first buffer layer 808 absorbs stress which is applied between the second end of the top panel portion 804a of the frame 804 and the first main surface 2s of the light-concentrating panel 2. As the first buffer layer 808, a rubber sheet such as a silicone rubber sheet can be used. In addition, various materials can be used as materials for forming the first buffer layer 808. Particularly, it is preferable to use a material with high water-proofing properties.

Between the second end of the bottom panel portion 804b of the frame 804 and the second main surface 2f of the light-concentrating panel 2, the second reflecting layer 807b and the second buffer layer 809 are provided.

A reflecting surface of the second reflecting layer 807b faces the second main surface 2f of the light-concentrating panel 2. The second reflecting layer 807b reflects light, which advances from the inside of the light-concentrating panel 2 to the outside thereof (light emitted from the fluorescent material 21), toward the inside of the light-concentrating panel 2. As the second reflecting layer 807b, the same reflecting layer as the first reflecting layer 807a can be used.

The second buffer layer 809 is arranged between the second reflecting layer 807b and the second end of the bottom panel portion 804b of the frame 804. The second buffer layer 809 absorbs stress which is applied between the second end of the bottom panel portion 804b of the frame 804 and the second main surface 2f of the light-concentrating panel 2. As the second buffer layer 809, the same buffer layer as the first buffer layer 808 can be used.

Figure 15:
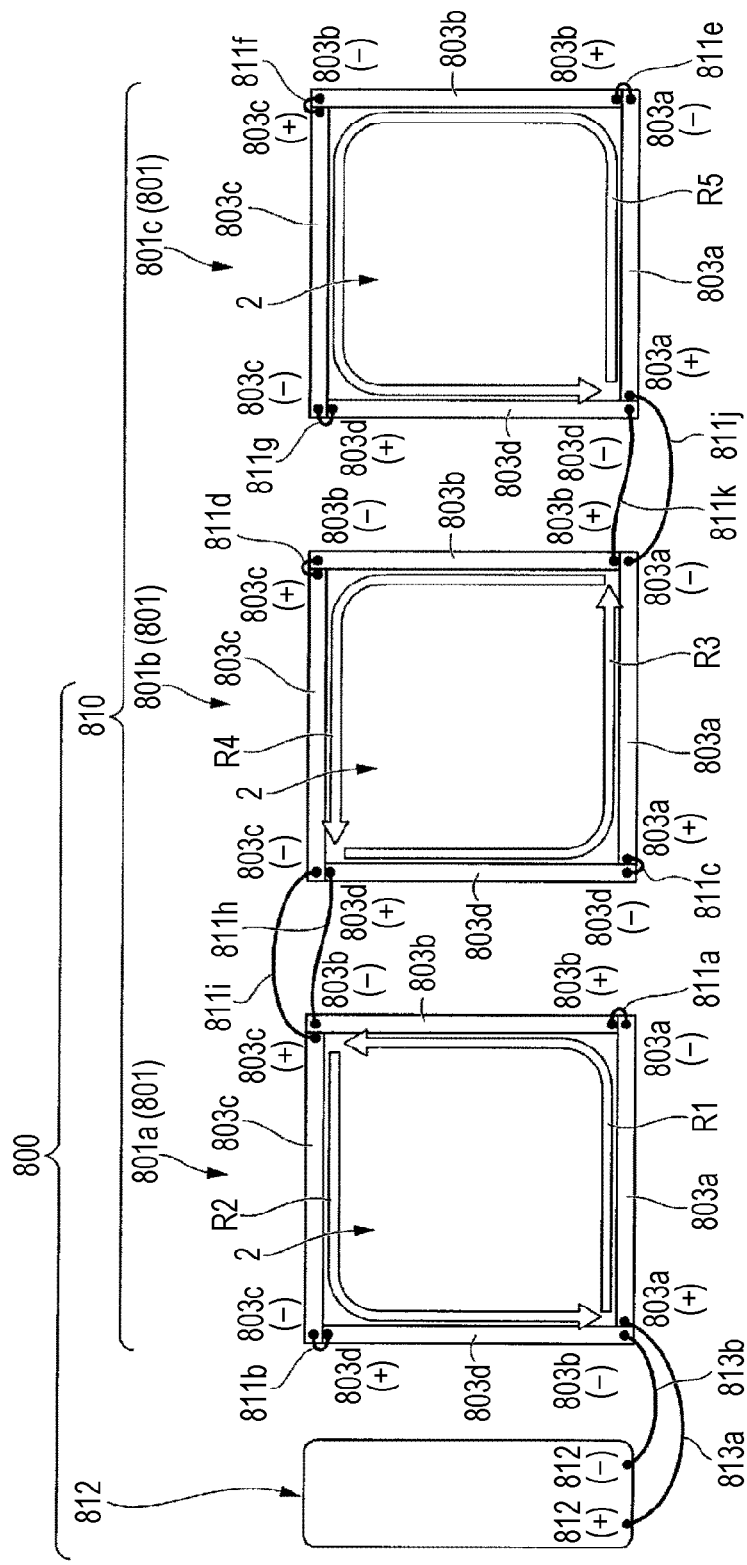
FIG. 15 is a plan view showing an outline configuration of a solar photovoltaic power generation system according to the eighth embodiment.

FIG. 15 is a plan view showing an outline configuration of the solar photovoltaic power generation system 800 according to the eighth embodiment. In FIG. 15, the depiction of the frame 804 and the like is omitted for the purpose of convenience. In FIG. 15, the same reference numerals are given to the same components as those used in the first embodiment, and detailed descriptions thereof will be omitted.

As shown in FIG. 15, the solar photovoltaic power generation system 800 is provided with a solar cell module assembly 810 and a power conditioner 812.

In this example, a case in which four solar cell elements 803 are arranged on the first main surface 2s of the light-concentrating panel 2 in each solar cell module 801 will be exemplified and described as an example.

In the solar cell module assembly 810 according to the embodiment, the first solar cell module 801a, the second solar cell module 801b, and the third solar cell module 801c are arranged in this order from the side of the power conditioner 812.

According to the embodiment, a negative terminal 803a(−) of a solar cell element 803a and a positive terminal 803b(+) of a second solar cell element 803b in the first solar cell module 801a are connected to each other in series via connection wiring 811a. The first solar cell element 803a and the second solar cell element 803b in the first solar cell module 801a configure a first current path R1.

A negative terminal 803c(−) of a third solar cell element 803c and a positive terminal 803d(+) of a fourth solar cell element 803d in the first solar cell module 801a are connected to each other in series via connection wiring 811b. The third solar cell element 803c and the fourth solar cell element 803d in the first solar cell module 801a configure a second current path R2.

A negative terminal 803d(−) of a fourth solar cell element 803d and a positive terminal 803a(+) of a first solar cell element 803a in the second solar cell module 801b are connected to each other in series via connection wiring 811c. The fourth solar cell element 803d and the first solar cell element 803a in the second solar cell module 801b configure a third current path R3.

A negative terminal 803b(−) of a second solar cell element 803b and a positive terminal 803c(+) of a third solar cell element 803c in the second solar cell module 801b are connected to each other in series via connection wiring 811d. The second solar cell element 803b and the third solar cell element 803c in the second solar cell module 801b configure a fourth current path R4.

A negative terminal 803a(−) of a first solar cell element 803a and a positive terminal 803b(+) of a second solar cell element 803b in the third solar cell module 801c are connected to each other in series via connection wiring 811e. A negative terminal 803b(−) of a second solar cell element 803b and a positive terminal 803c(+) of a third solar cell element 803c in the third solar cell module 801c are connected to each other in series via connection wiring 811f. A negative terminal 803c(−) of the third solar cell element 803c and a positive terminal 803d(+) of a fourth solar cell element 803d in the third solar cell module 801c are connected to each other in series via connection wiring 811g. The first solar cell element 803a, the second solar cell element 803b, the third solar cell element 803c, and the fourth solar cell element 803*d* in the third solar cell module 801*c* configure a fifth current path R5.

According to the embodiment, an ending point of the first current path R1 in the first solar cell module 801*a* and a starting point of the third current path R3 in the second solar cell module 801*b* are connected to each other in series via connection wiring 811*h*. Specifically, the negative terminal 803*b*(−) of the second solar cell element 803*b* in the first solar cell module 801*a* and the positive terminal 803*d*(+) of the fourth solar cell element 803*d* in the second solar cell module 801*b* are connected to each other in series via the connection wiring 811*h*.

A starting point of the second current path R2 in the first solar cell module 801*a* and an ending point of the fourth current path R4 in the second solar cell module 801*b* are connected to each other in series via connection wiring 811*i*. Specifically, the positive terminal 803*c*(+) of the third solar cell element 803*c* in the first solar cell module 801*a* and the negative terminal 803*c*(−) of the third solar cell element 803*c* in the second solar cell module 801*b* are connected to each other in series via the connection wiring 811*i*.

An ending point of the third current path R3 in the second solar cell module 801*b* and a starting point of the fifth current path R5 in the third solar cell module 801*c* are connected to each other in series via connection wiring 811*j*. Specifically, the negative terminal 803*a*(−) of the first solar cell element 803*a* in the second solar cell module 801*b* and the positive terminal 803*a*(+) of the first solar cell element 803*a* in the third solar cell module 801*c* are connected to each other in series via the connection wiring 811*j*.

A starting point of the fourth current path R4 in the second solar cell module 801*b* and an ending point of the fifth current path R5 in the third solar cell module 801*c* are connected to each other in series via connection wiring 811*k*. Specifically, the positive terminal 803*b*(+) of the second solar cell element 803*b* in the second solar cell module 801*b* and the negative terminal 803*d*(−) of the fourth solar cell element 803*d* in the third solar cell module 801*c* are connected to each other in series via the connection wiring 811*k*.

In the solar cell module assembly 810 according to the embodiment, the first current path R1 in the first solar cell module 801*a*, the third current path R3 in the second solar cell module 801*b*, the fifth current path R5 in the third solar cell module 801*c*, the fourth current path R4 in the second solar cell module 801*b*, and the second current path R2 in the first solar cell module 801*a* are connected in series in this order as described above.

A positive terminal 812(+) of the power conditioner 812 and the positive terminal 803*a*(+) of the first solar cell element 803*a* in the first solar cell module 801*a* are connected to each other via connection wiring 813*a*. A negative terminal 812(−) of the power conditioner 812 and the negative terminal 803*d*(−) of the fourth solar cell element 803*d* in the first solar cell module 801*a* are connected to each other via connection wiring 813*b*.

Even with the configuration in which four solar cell elements are provided on the first main surface 2*s* of each light-concentrating panel 2 as in the embodiment, the same effects as those in the case according to the first embodiment, that is, the effects in that it is possible to reduce wiring resistance, to reduce power loss, to reduce connection wiring cost, and to facilitate the wiring connecting operation, which is preferable in terms of product cost, a product size, and wiring connection operability, are achieved.

[Ninth Embodiment]

Hereinafter, a description will be given of a ninth embodiment of the present invention with reference to FIG. 16.

Figure 16:
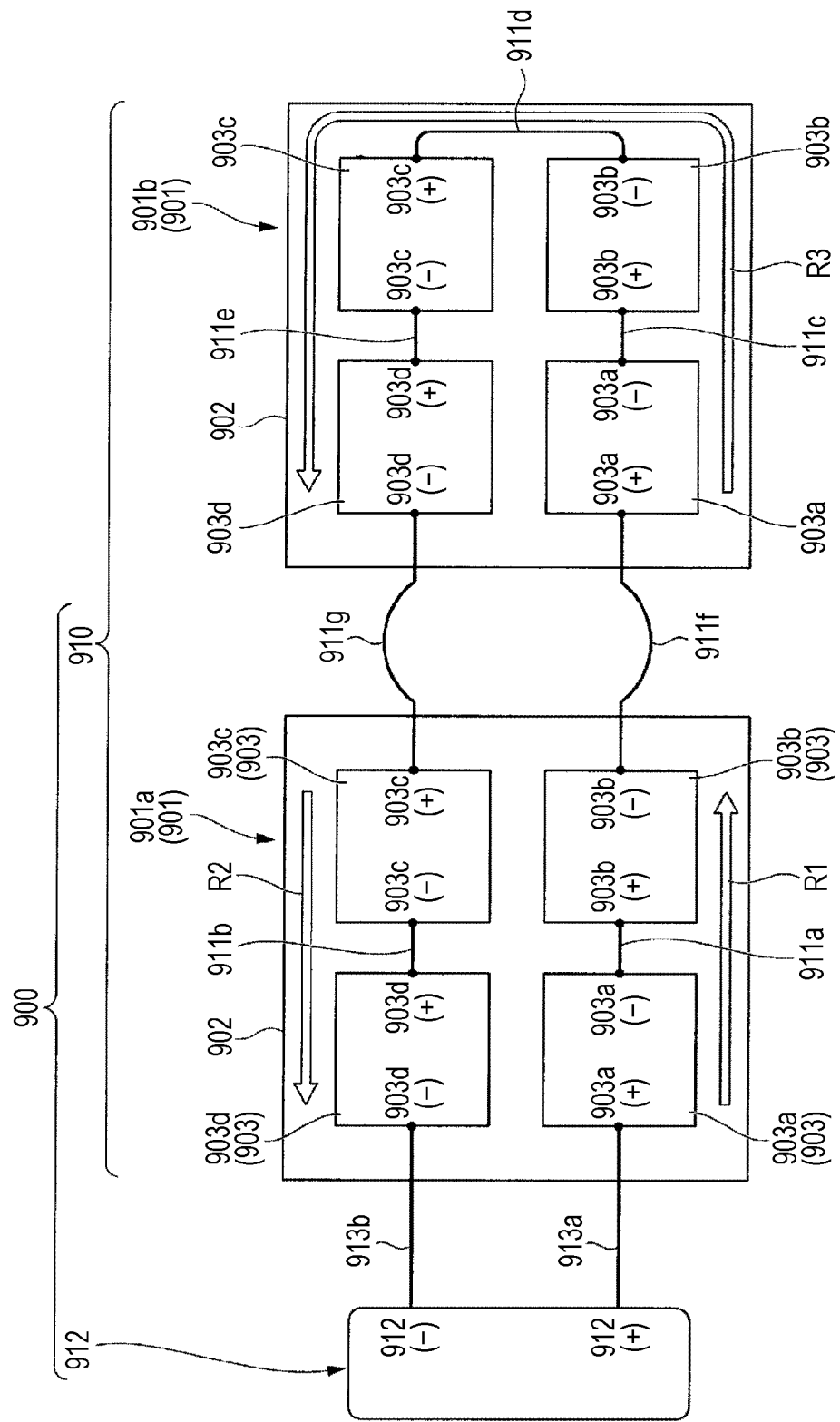
FIG. 16 is a plan view showing an outline configuration of a solar photovoltaic power generation system according to a ninth embodiment.

FIG. 16 is a plan view showing an outline configuration of a solar photovoltaic power generation system 900 according to the ninth embodiment.

As shown in FIG. 16, the solar photovoltaic power generation system 900 is provided with a solar cell module assembly 910 and a power conditioner 912.

In the solar cell module assembly 910 according to the embodiment, a first solar cell module 901*a* and a second solar cell module 901*b* are arranged in this order from the side of the power conditioner 912.

According to the embodiment, a light-concentrating panel is not provided in each solar cell module 901. That is, the embodiment employs a configuration in which solar cell elements 903 directly receive external light. In the embodiment, a case in which four solar cell elements 903 are arranged on an upper surface of a support panel 902 in each solar cell module 901 will be exemplified and described as an example.

According to the embodiment, a negative terminal 903*a* (−) of a first solar cell element 903*a* and a positive terminal 903*b*(+) of a second solar cell element 903*b* in the first solar cell module 901*a* are connected to each other in series via connection wiring 911*a*. The first solar cell element 903*a* and the second solar cell element 903*b* in the first solar cell module 901*a* configure a first current path R1.

A negative terminal 903*c*(−) of a third solar cell element 903*c* and a positive terminal 903*d*(+) of a fourth solar cell element 903*d* in the first solar cell module 901*a* are connected to each other in series via connection wiring 911*b*. The third solar cell element 903*c* and the fourth solar cell element 903*d* in the first solar cell module 901*a* configure a second current path R2.

A negative terminal 903*a*(−) of a first solar cell element 903*a* and a positive terminal 903*b*(+) of a second solar cell element 903*b* in the second solar cell module 901*b* are connected to each other in series via connection wiring 911*c*. A negative terminal 903*b*(−) of the second solar cell element 903*b* and a positive terminal 903*c*(+) of a third solar cell element 903*c* in the second solar cell module 901*b* are connected to each other in series via connection wiring 911*d*. A negative terminal 903*c*(−) of the third solar cell element 903*c* and a positive terminal 903*d*(+) of a fourth solar cell element 903*d* in the second solar cell module 901*b* are connected to each other in series via connection wiring 911*e*. The first solar cell element 903*a*, the second solar cell element 903*b*, the third solar cell element 903*c*, and the fourth solar cell element 903*d* in the second solar cell module 901*b* configure a third current path R3.

According to the embodiment, an ending point of the first current path R1 in the first solar cell module 901*a* and a starting point of the third current path R3 in the second solar cell module 901*b* are connected to each other in series via connection wiring 911*f*. Specifically, the negative terminal 903*b*(−) of the second solar cell element 903*b* in the first solar cell module 901*a* and the positive terminal 903*a*(+) of the first solar cell element 903*a* in the second solar cell module 901*b* are connected to each other in series via the connection wiring 911*f*.

A starting point of the second current path R2 in the first solar cell module 901*a* and an ending point of the third current path R3 in the second solar cell module 901*b* are connected to each other in series via connection wiring 911*g*. Specifically, the positive terminal 903*c*(+) of the third solar cell element 903*c* in the first solar cell module 901*a* and the negative terminal 903*d*(−) of the fourth solar cell element 903*d* in the second solar cell module 901*b* are connected to each other in series via the connection wiring 911*g*.

In the solar cell module assembly 910 according to the embodiment, the first current path R1 in the first solar cell module 901a, the third current path R3 in the second solar cell module 901b, and the second current path R2 in the first solar cell module 901a are connected in series in this order as described above.

A positive terminal 912(+) of the power conditioner 912 and the positive terminal 903a(+) of the first solar cell element 903a in the first solar cell module 901a are connected to each other via connection wiring 913a. A negative terminal 912(−) of the power conditioner 912 and the negative terminal 903d(−) of the fourth solar cell element 903d in the first solar cell module 901a are connected to each other via connection wiring 913b.

Even with the configuration in which the light-concentrating panel is not provided in each solar cell module 901 as in the embodiment, the same effects as those in the case according to the first embodiment, that is, the effects in that it is possible to reduce wiring resistance, to reduce power loss, to reduce connection wiring cost, and to facilitate the wiring connecting operation, which is preferable in terms of product cost, a product size, and wiring connection operability, are achieved.

[Tenth Embodiment]

Hereinafter, a description will be given of a tenth embodiment of the present invention with reference to FIG. 17.

A basic configuration of a solar photovoltaic power generation system 150 according to the embodiment is the same as that in the first embodiment, and the tenth embodiment is different from the first embodiment in an arrangement configuration of solar cell modules.

Figure 17:
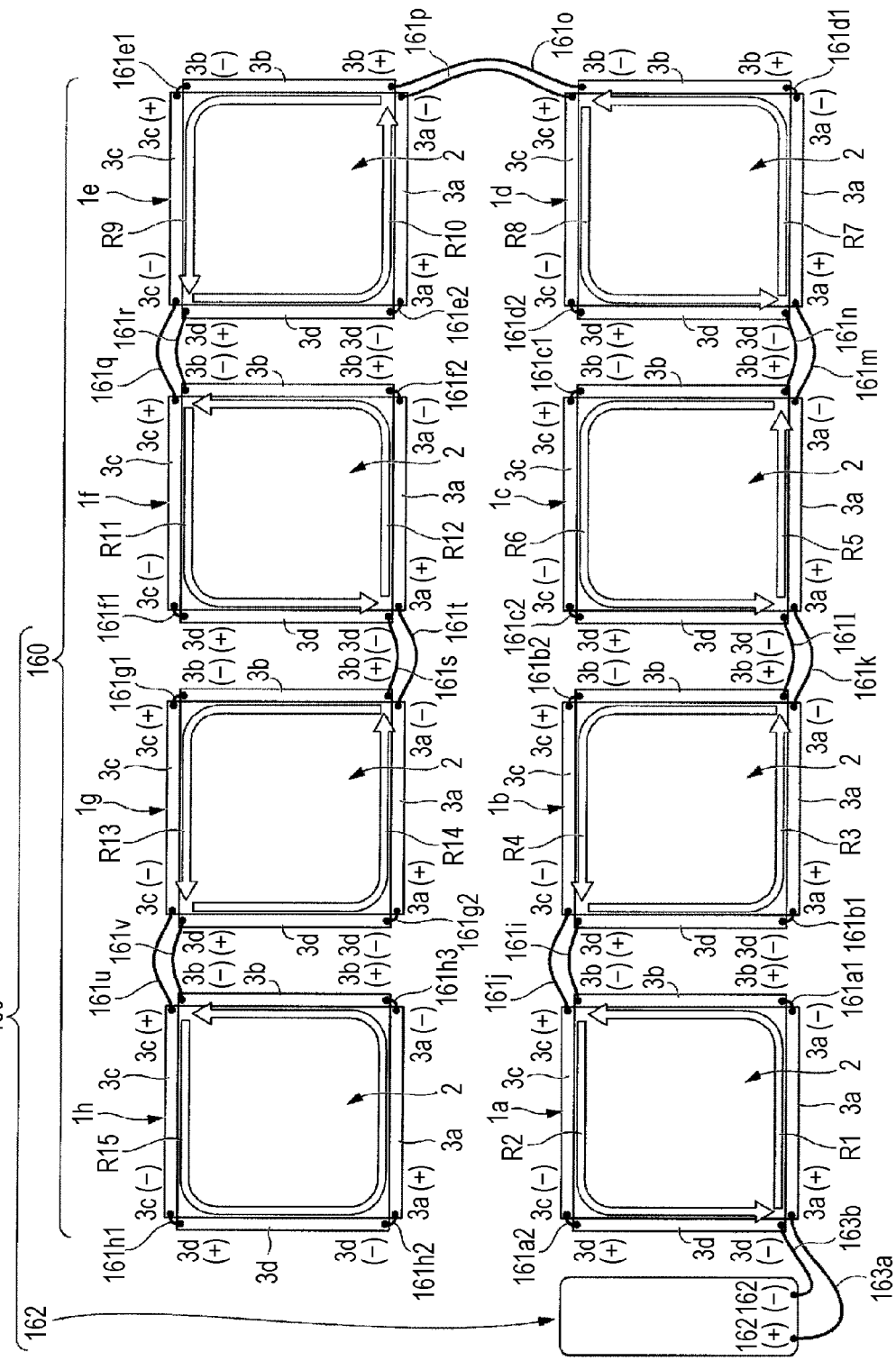
FIG. 17 is a plan view showing an outline configuration of a solar photovoltaic power generation system according to a tenth embodiment.

FIG. 17 is a plan view showing an outline configuration of the solar photovoltaic power generation system 150 according to the tenth embodiment. In FIG. 17, the depiction of a frame is omitted for the purpose of convenience. In FIG. 17, the same reference numerals are given to the same components as those used in the first embodiment, and detailed descriptions thereof will be omitted.

As shown in FIG. 17, the solar photovoltaic power generation system 150 is provided with a solar cell module assembly 160 and a power conditioner 162.

In the embodiment, a case in which eight solar cell modules 1 are arranged such that four solar cell modules 1 are in each of two rows will be exemplified and described as an example. Specifically, a first solar cell module 1a, a second solar cell module 1b, a third solar cell module 1c, a fourth solar cell module 1d, a fifth solar cell module 1e, a sixth solar cell module 1f, a seventh solar cell module 1g, and an eighth solar cell module 1h are arranged in this order from the side of the power conditioner 162.

Hereinafter, a detailed description will be given of the arrangement configuration of the solar cell modules according to the embodiment.

According to the embodiment, a negative terminal 3a(−) of a first solar cell element 3a and a positive terminal 3b(+) of a second solar cell element 3b in the first solar cell module 1a are connected to each other in series via connection wiring 161a1. The first solar cell element 3a and the second solar cell element 3b in the first solar cell module 1a configure a first current path R1.

A negative terminal 3c(−) of a third solar cell element 3c and a positive terminal 3d(+) of a fourth solar cell element 3d in the first solar cell module 1a are connected to each other in series via connection wiring 161a2. The third solar cell element 3c and the fourth solar cell element 3d in the first solar cell module 1a configure a second current path R2.

A negative terminal 3d(−) of a fourth solar cell element 3d and a positive terminal 3a(+) of a first solar cell element 3a in the second solar cell module 1b are connected to each other in series via connection wiring 161b1. The fourth solar cell element 3d and the first solar cell element 3a in the second solar cell module 1b configure a third current path R3.

A negative terminal 3b(−) of a second solar cell element 3b and a positive terminal 3c(+) of a third solar cell element 3c in the second solar cell module 1b are connected to each other in series via connection wiring 161b2. The second solar cell element 3b and the third solar cell element 3c configure a fourth current path R4.

According to the embodiment, a first solar cell element 3a in the third solar cell module 1c configures a fifth current path R5.

A negative terminal 3b(−) of a second solar cell element 3b and a positive terminal 3c(+) of a third solar cell element 3c in the third solar cell module 1c are connected to each other in series via connection wiring 161c1. A negative terminal 3c(−) of the third solar cell element 3c and a positive terminal 3d(+) of a fourth solar cell element 3d in the third solar cell module 1c are connected to each other in series via connection wiring 161c2. The second solar cell element 3b, the third solar cell element 3c, and the fourth solar cell element 3d in the third solar cell module 1c configure a sixth current path R6.

Although a case in which the fifth current path R5 is configured of the first solar cell element 3a (a single solar cell element) in the third solar cell module 1c was exemplified and described in this embodiment, the present invention is not limited thereto. For example, the fifth current path R5 may be configured of the first solar cell element 3a and the second solar cell element 3b (two solar cell elements) in the third solar cell module 1c, for example.

In other solar cell modules such as the first solar cell module 1a and the second solar cell module 1b, each current path may be configured of a single solar cell element in the same manner as in the third solar cell module 1c.

In addition, all the solar cell modules may be configured of the current path as in the third solar cell module 1c according to the embodiment. In addition, only the solar cell module 1a may be configured of the current path as described in the embodiment, and the other solar cell modules may be configured of the current path as in the third solar cell module 1c according to the embodiment. That is, configurations of the current paths in the respective solar cell modules in the solar photovoltaic power generation system may be configured in any combination as long as it is possible to reduce the lengths of connection wiring 163a and 163b connected from the power conditioner to the first solar cell module 1a or the lengths of connection wiring 161o and 161p connected from the fourth solar cell module 1d to the fifth solar cell module 1e.

A negative terminal 3a(−) of a first solar cell element 3a and a positive terminal 3b(+) of a second solar cell element 3b in the fourth solar cell module 1d are connected to each other in series via connection wiring 161d1. The first solar cell element 3a and the second solar cell element 3b in the fourth solar cell module 1d configure a seventh current path R7.

A negative terminal 3c(−) of a third solar cell element 3c and a positive terminal 3d(+) of a fourth solar cell element 3d in the fourth solar cell module 1d are connected to each other in series via connection wiring 161d2. The third solar cell element 3c and the fourth solar cell element 3d configure an eighth current path R8.

A negative terminal 3*b*(−) of a second solar cell element 3*b* and a positive terminal 3*c*(+) of a third solar cell element 3*c* in the fifth solar cell module 1*e* are connected to each other in series via connection wiring 161*e*1. The second solar cell element 3*b* and the third solar cell element 3*c* in the fifth solar cell module 1*e* configure a ninth current path R9.

A negative terminal 3*d*(−) of a fourth solar cell element 3*d* and a positive terminal 3*a*(+) of a first solar cell element 3*a* in the fifth solar cell module 1*e* are connected to each other in series via connection wiring 161*e*2. The fourth solar cell element 3*d* and the first solar cell element 3*a* in the fifth solar cell module 1*e* configure a tenth current path R10.

A negative terminal 3*c*(−) of a third solar cell element 3*c* and a positive terminal 3*d*(+) of a fourth solar cell element 3*d* in the sixth solar cell module 1*f* are connected to each other in series via connection wiring 161*f*1. The third solar cell element 3*c* and the fourth solar cell element 3*d* in the sixth solar cell module 1*f* configure an eleventh current path R11.

A negative terminal 3*a*(−) of a first solar cell element 3*a* and a positive terminal 3*b*(+) of a second solar cell element 3*b* in the sixth solar cell module 1*f* are connected to each other in series via connection wiring 161*f*2. The first solar cell element 3*a* and the second solar cell element 3*b* in the sixth solar cell module 1*f* configure a twelfth current path R12.

A negative terminal 3*b*(−) of a second solar cell element 3*b* and a positive terminal 3*c*(+) of a third solar cell element 3*c* in the seventh solar cell module 1*g* are connected to each other in series via connection wiring 161*g*1. The second solar cell element 3*b* and the third solar cell element 3*c* in the seventh solar cell module 1*g* configure a thirteenth current path R13.

A negative terminal 3*d*(−) of a fourth solar cell element 3*d* and a positive terminal 3*a*(+) of a first solar cell element 3*a* in the seventh solar cell module 1*g* are connected to each other in series via connection wiring 161*g*2. The fourth solar cell element 3*d* and the first solar cell element 3*a* in the seventh solar cell module 1*g* configures a fourteenth current path R14.

A negative terminal 3*c*(−) of a third solar cell element 3*c* and a positive terminal 3*d*(+) of a fourth solar cell element 3*d* in the eighth solar cell module 1*h* are connected to each other in series via connection wiring 161*h*1. The third solar cell element 3*c* and the fourth solar cell element 3*d* in the eighth solar cell module 1*h* configure a fifteenth current path R15.

A negative terminal 3*a*(−) of a first solar cell element 3*a* and a positive terminal 3*b*(+) of a second solar cell element 3*b* in the eighth solar cell module 1*h* are connected to each other in series via connection wiring 161*h*2. The first solar cell element 3*a* and the second solar cell element 3*b* in the eighth solar cell module 1*f* configure sixteenth current path R16.

An ending point of the first current path R1 in the first solar cell module 1*a* and a starting point of the third current path R3 in the second solar cell module 1*b* are connected to each other in series via connection wiring 161*i*. Specifically, the negative terminal 3*b*(−) of the second solar cell element 3*b* in the first solar cell module 1*a* and the positive terminal 3*d*(+) of the fourth solar cell element 3*d* in the second solar cell module 1*b* are connected to each other in series via the connection wiring 161*i*.

A starting point of the second current path R2 in the first solar cell module 1*a* and an ending point of the fourth current path R4 in the second solar cell module 1*b* are connected to each other in series via connection wiring 161*j*. Specifically, the positive terminal 3*c*(+) of the third solar cell element 3*c* in the first solar cell module 1*a* and the negative terminal 3*c*(−) of the third solar cell element 3*c* in the second solar cell module 1*b* are connected to each other in series via the connection wiring 161*i*.

An ending point of the third current path R3 in the second solar cell module 1*b* and a starting point of the fifth current path R5 in the third solar cell module 1*c* are connected to each other in series via connection wiring 161*k*. Specifically, the negative terminal 3*a*(−) of the first solar cell element 3*a* in the second solar cell module 1*b* and the positive terminal 3*a*(+) of the first solar cell element 3*a* in the third solar cell module 1*c* are connected to each other in series via the connection wiring 161*k*.

A starting point of the fourth current path R4 in the second solar cell module 1*b* and an ending point of the sixth current path R6 in the third solar cell module 1*c* are connected to each other in series via connection wiring 161*l*. Specifically, the positive terminal 3*b*(+) of the second solar cell element 3*b* in the second solar cell module 1*b* and the negative terminal 3*d*(−) of the fourth solar cell element 3*d* in the third solar cell module 1*c* are connected to each other in series via the connection wiring 161*l*.

An ending point of the fifth current path R5 in the third solar cell module 1*c* and a starting point of the seventh current path R7 in the fourth solar cell module 1*d* are connected to each other in series via connection wiring 161*m*. Specifically, the negative terminal 3*a*(−) of the first solar cell element 3*a* in the third solar cell module 1*c* and the positive terminal 3*a*(+) of the first solar cell element 3*a* in the fourth solar cell module 1*d* are connected to each other via the connection wiring 161*m*.

A starting point of the sixth current path R6 in the third solar cell module 1*c* and an ending point of the eighth current path R8 in the fourth solar cell module 1*d* are connected to each other in series via connection wiring 161*n*. Specifically, the positive terminal 3*b*(+) of the second solar cell element 3*b* in the third solar cell module 1*c* and the negative terminal 3*d*(−) of the fourth solar cell element 3*d* in the fourth solar cell module 1*d* are connected to each other in series via the connection wiring 161*n*.

An ending point of the seventh current path R7 in the fourth solar cell module 1*d* and a starting point of the ninth current path R9 in the fifth solar cell module 1*e* are connected to each other in series via connection wiring 161*o*. Specifically, the negative terminal 3*d*(−) of the second solar cell element 3*b* in the fourth solar cell module 1*d* and the positive terminal 3*b*(+) of the second solar cell element 3*b* in the fifth solar cell module 1*e* are connected to each other in series via the connection wiring 161*o*.

A starting point of the eighth current path R8 in the fourth solar cell module 1*d* and an ending point of the tenth current path R10 in the fifth solar cell module 1*e* are connected to each other in series via connection wiring 161*p*. Specifically, the positive terminal 3*c*(+) of the third solar cell element 3*c* in the fourth solar cell module 1*d* and the negative terminal 3*a*(−) of the first solar cell element 3*a* in the fifth solar cell module 1*e* are connected to each other in series via the connection wiring 161*p*.

An ending point of the ninth current path R9 in the fifth solar cell module 1*e* and a starting point of the eleventh current path R11 in the sixth solar cell module 1*f* are connected to each other in series via connection wiring 161*q*. Specifically, the negative terminal 3*c*(−) of the third solar cell element 3*c* in the fifth solar cell module 1*e* and the positive terminal 3*c*(+) of the third solar cell element 3*c* in the sixth solar cell module 1f are connected to each other in series via the connection wiring 161q.

A starting point of the tenth current path R10 in the fifth solar cell module 1e and an ending point of the twelfth current path R12 in the sixth solar cell module 1f are connected to each other in series via connection wiring 161r. Specifically, the positive terminal 3d(+) of the fourth solar cell element 3d in the fifth solar cell module 1e and the negative terminal 3b(−) of the second solar cell element 3b in the sixth solar cell module 1f are connected to each other in series via the connection wiring 161r.

An ending point of the eleventh current path R11 in the sixth solar cell module 1f and a starting point of the thirteenth current path R13 in the seventh solar cell module 1g are connected to each other in series via connection wiring 161s. Specifically, the negative terminal 3d(−) of the fourth solar cell element 3d in the sixth solar cell module 1f and the positive terminal 3b(+) of the second solar cell element 3b in the seventh solar cell module 1g are connected to each other in series via the connection wiring 161s.

A starting point of the twelfth current path R12 in the sixth solar cell module 1f and an ending point of the fourteenth current path R14 in the seventh solar cell module 1g are connected to each other in series via connection wiring 161t. Specifically, the positive terminal 3a(+) of the first solar cell element 3a in the sixth solar cell module 1f and the negative terminal 3a(−) of the first solar cell element 3a in the seventh solar cell module 1g are connected to each other in series via the connection wiring 161t.

An ending point of the thirteenth current path R13 in the seventh solar cell module 1g and a starting point of the fifteenth current path R15 in the eighth solar cell module 1h are connected to each other in series via connection wiring 161u. Specifically, the negative terminal 3c(−) of the third solar cell element 3c in the seventh solar cell module 1g and the positive terminal 3c(+) of the third solar cell element 3c in the eighth solar cell module 1h are connected to each other in series via the connection wiring 161u.

A starting point of the fourteenth current path R14 in the seventh solar cell module 1g and an ending point of the fifteenth current path R15 in the eighth solar cell module 1h are connected to each other in series via connection wiring 161v. Specifically, the positive terminal 3d(+) of the fourth solar cell element 3d in the seventh solar cell module 1g and the negative terminal 3b(−) of the second solar cell element 3b in the eighth solar cell module 1h are connected to each other in series via the connection wiring 161v.

In the solar cell module assembly 160 according to the embodiment, the first current path R1 in the first solar cell module 1a, the third current path R3 in the second solar cell module 1b, the fifth current path R5 in the third solar cell module 1c, the seventh current path R7 in the fourth solar cell module 1d, the ninth current path R9 in the fifth solar cell module 1e, the eleventh current path R11 in the sixth solar cell module 1f, the thirteenth current path R13 in the seventh solar cell module 1g, the fifteenth current path R15 in the eighth solar cell module 1h, the fourteenth current path R14 in the seventh solar cell module 1g, the twelfth current path R12 in the sixth solar cell module 1f, the tenth current path R10 in the fifth solar cell module 1e, the eighth current path R8 in the fourth solar cell module 1d, the sixth current path R6 in the third solar cell module 1c, the fourth current path R4 in the second solar cell module 1b, and the second current path R2 in the first solar cell module 1a are connected in series in this order as described above.

A positive terminal 162(+) of the power conditioner 162 and the positive terminal 3a(+) of the first solar cell element 3a in the first solar cell module 1a are connected to each other via connection wiring 163a. A negative terminal 162(−) of the power conditioner 162 and the negative terminal 3d(−) of the fourth solar cell element 3d in the first solar cell module 1a are connected to each other via connection wiring 163b.

If the eight solar cell modules 1 are arranged such that four solar cell modules 1 are in each of two rows as in the embodiment, the total length of the plurality of pieces of connection wiring becomes longer as compared with a case according to the first embodiment (the case in which the three solar cell modules 1 are arranged such that the three solar cell modules 1 are in a row). Therefore, according to the embodiment, a significant actual advantage is achieved from the effect in that it is possible to reduce wiring resistance and to reduce power loss. In addition, a significant actual advantage is achieved from the effect in that it is possible to reduce connection wiring cost and to facilitate the wiring connecting operation, which is preferable in terms of product cost, a product size, and wiring connection operability.

[Eleventh Embodiment]

Hereinafter, a description will be given of an eleventh embodiment of the present invention with reference to FIG. 18.

A basic configuration of a solar photovoltaic power generation system 250 according to the embodiment is the same as that in the second embodiment, and the eleventh embodiment is different from the second embodiment in a connection configuration of solar cell modules.

Figure 18:
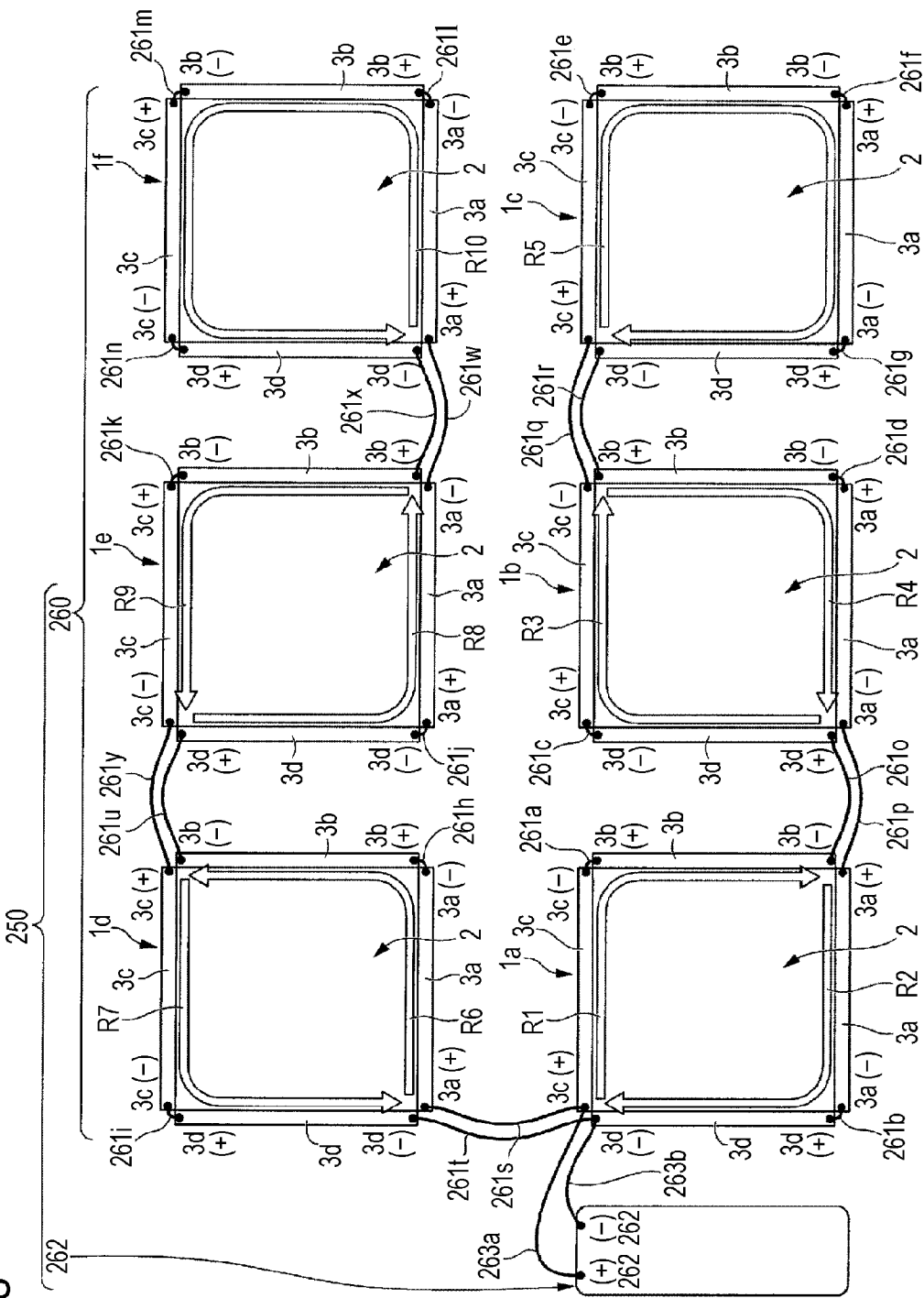
FIG. 18 is a plan view showing an outline configuration of a solar photovoltaic power generation system according to an eleventh embodiment.

FIG. 18 is a plan view showing an outline configuration of the solar photovoltaic power generation system 250 according to the eleventh embodiment. In FIG. 18, the depiction of a frame is omitted for the purpose of convenience. In FIG. 18, the same reference numerals are given to the same components as those used in the second embodiment, and detailed descriptions thereof will be omitted.

As shown in FIG. 18, the solar photovoltaic power generation system 250 is provided with a solar cell module assembly 260 and a power conditioner 262.

According to the embodiment, a first solar cell module 1a, a second solar cell module 1b, and a third solar cell module 1c are arranged in this order from the side of the power conditioner 262. In addition, a fourth solar cell module 1d, a fifth solar cell module 1e, and a sixth solar cell module 1f are arranged in this order from the side of the power conditioner 262 so as to be in parallel with the first solar cell module 1a, the second solar cell module 1b, and the third solar cell module 1c.

According to the embodiment, three solar cell modules 1 in the first row (upper stage) and three solar cell modules 1 in the second row (lower stage) from among the six solar cell modules 1 which are arranged such that three solar cell modules 1 are in each of the two rows are connected in parallel with each other as described above. Hereinafter, a detailed description will be given of an arrangement configuration of the solar cell modules according to the embodiment.

First, a description will be given of a connection configuration in the lower stage.

According to the embodiment, a negative terminal 3c(−) of a third solar cell element 3c and a positive terminal 3b(+) of a second solar cell element 3b in the first solar cell module 1a are connected to each other in series via connection wiring 261a. The third solar cell element 3c and the second solar cell element 3b in the first solar cell module 1a configure a first current path R1.

A negative terminal 3c(−) of a first solar cell element 3a and a positive terminal 3d(+) of a fourth solar cell element 3d in the first solar cell module 1a are connected to each other in series via connection wiring 261b. The first solar cell element 3a and the fourth solar cell element 3d in the first solar cell module 1a configure a second current path R2.

A negative terminal 3d(−) of a fourth solar cell element 3d and a positive terminal 3c(+) of a third solar cell element 3c in the second solar cell module 1b are connected to each other in series via connection wiring 261c. The fourth solar cell element 3d and the third solar cell element 3c in the second solar cell module 1b configure a third current path R3.

A negative terminal 3b(−) of a second solar cell element 3b and a positive terminal 3a(+) of a first solar cell element 3a in the second solar cell module 1b are connected to each other in series via connection wiring 261d. The second solar cell element 3b and the first solar cell element 3a configure a fourth current path R4.

A negative terminal 3c(−) of a third solar cell element 3c and a positive terminal 3b(+) of a second solar cell element 3b in the third solar cell module 1c are connected to each other in series via connection wiring 261e. A negative terminal 3b(−) of the second solar cell element 3b and a positive terminal 3a(+) of the first solar cell element 3a in the third solar cell module 1c are connected to each other in series via connection wiring 261f. A negative terminal 3c(−) of the first solar cell element 3a and a positive terminal 3d(+) of a fourth solar cell element 3d in the third solar cell module 1c are connected to each other in series via connection wiring 261g. The third solar cell element 3c, the second solar cell element 3b, the first solar cell element 3a, and the fourth solar cell element 3d in the third solar cell module 1c configure a fifth current path R5.

According to the embodiment, an ending point of the first current path R1 in the first solar cell module 1a and a starting point of the third current path R3 in the second solar cell module 1b are connected to each other in series via connection wiring 261o. Specifically, the negative terminal 3b(−) of the second solar cell element 3b in the first solar cell module 1a and the positive terminal 3d(+) of the fourth solar cell element 3d in the second solar cell module 1b are connected to each other in series via the connection wiring 261o.

A starting point of the second current path R2 in the first solar cell module 1a and an ending point of the fourth current path R4 in the second solar cell module 1b are connected to each other in series via connection wiring 261p. Specifically, the positive terminal 3a(+) of the first solar cell element 3a in the first solar cell module 1a and the negative terminal 3a(−) of the first solar cell element 3a in the second solar cell module 1b are connected to each other in series via the connection wiring 261p.

An ending point of the third current path R3 in the second solar cell module 1b and a starting point of the fifth current path R5 in the third solar cell module 1c are connected to each other in series via connection wiring 261q. Specifically, the negative terminal 3c(−) of the third solar cell element 3c in the second solar cell module 1b and the positive terminal 3c(+) of the third solar cell element 3c in the third solar cell module 1c are connected to each other in series via the connection wiring 261q.

A starting point of the fourth current path R4 in the second solar cell module 1b and an ending point of the fifth current path R5 in the third solar cell module 1c are connected to each other in series via connection wiring 261r. Specifically, the positive terminal 3b(+) of the second solar cell element 3b in the second solar cell module 1b and the negative terminal 3d(−) of the fourth solar cell element 3d in the third solar cell module 1c are connected to each other in series via the connection wiring 261r.

In the solar cell module assembly 260 according to the embodiment, the first current path R1 in the first solar cell module 1a, the third current path R3 in the second solar cell module 1b, the fifth current path R5 in the third solar cell module 1c, the fourth current path R4 in the second solar cell module 1b, and the second current path R2 in the first solar cell module 1a are connected in series in this order as described above when the connection configuration in the lower stage is viewed.

Next, a description will be given of a connection configuration in the upper stage.

A negative terminal 3c(−) of a first solar cell element 3a and a positive terminal 3b(+) of a second solar cell element 3b in the fourth solar cell module 1d are connected to each other in series via connection wiring 261h. The first solar cell element 3a and the second solar cell element 3b in the fourth solar cell module 1d configure a sixth current path R6.

A negative terminal 3c(−) of a third solar cell element 3c and a positive terminal 3d(+) of a fourth solar cell element 3d in the fourth solar cell module 1d are connected to each other in series via connection wiring 26ig. The third solar cell element 3c and the fourth solar cell element 3d in the fourth solar cell module 1d configure a seventh current path R7.

A negative terminal 3d(−) of a fourth solar cell element 3d and a positive terminal 3a(+) of a first solar cell element 3a in the fifth solar cell module 1e are connected to each other in series via connection wiring 261j. The fourth solar cell element 3d and the first solar cell element 3a in the fifth solar cell module 1e configure an eighth current path R8.

A negative terminal 3b(−) of a second solar cell element 3b and a positive terminal 3c(+) of a third solar cell element 3c in the fifth solar cell module 1e are connected to each other via connection wiring 261k. The second solar cell element 3b and the third solar cell element 3c in the fifth solar cell module 1e configure a ninth current path R9.

A negative terminal 3a(−) of a first solar cell element 3a and a positive terminal 3b(+) of a second solar cell element 3b in the sixth solar cell module 1f are connected to each other in series via connection wiring 261l. A negative terminal 3b(−) of the second solar cell element 3b and a positive terminal 3c(+) of a third solar cell element 3c in the sixth solar cell module 1f are connected to each other in series via connection wiring 261m. A negative terminal 3c(−) of the third solar cell element 3c and a positive terminal 3d(+) of a fourth solar cell element 3d in the sixth solar cell module 1f are connected to each other in series via connection wiring 261n. The first solar cell element 3a, the second solar cell element 3b, the third solar cell element 3c, and the fourth solar cell element 3d in the sixth solar cell module 1f configure a tenth current path R10.

An ending point of the sixth current path R6 in the fourth solar cell module 1d and a starting point of the eighth current path R8 in the fifth solar cell module 1e are connected to each other in series via connection wiring 261u. Specifically, the negative terminal 3b(−) of the second solar cell element 3b in the fourth solar cell module 1d and the positive terminal 3d(+) of the fourth solar cell element 3d in the fifth solar cell module 1e are connected to each other in series via the connection wiring 261u.

A starting point of the seventh current path R7 in the fourth solar cell module 1d and an ending point of the ninth current path R9 in the fifth solar cell module 1e are connected to each other in series via connection wiring 261v. Specifically, the positive terminal 3c(+) of the third solar cell element 3c in the fourth solar cell module 1d and the negative terminal 3c(−) of the third solar cell element 3c in the fifth solar cell module 1e are connected to each other via the connection wiring 261v.

An ending point of the eighth current path R8 in the fifth solar cell module 1e and a starting point of the tenth current path R10 in the sixth solar cell module 1f are connected to each other in series via connection wiring 261w. Specifically, the negative terminal 3a(−) of the first solar cell element 3a in the fifth solar cell module 1e and the positive terminal 3a(+) of the first solar cell element 3a in the sixth solar cell module 1f are connected to each other in series via the connection wiring 261w.

A starting point of the ninth current path R9 in the fifth solar cell module 1e and an ending point of the tenth current path R10 in the sixth solar cell module 1f are connected to each other in series via connection wiring 261x. Specifically, the positive terminal 3b(+) of the second solar cell element 3b in the fifth solar cell module 1e and the negative terminal 3d(−) of the fourth solar cell element 3d in the sixth solar cell module 1f are connected to each other in series via the connection wiring 261x.

In the solar cell module assembly 260 according to the embodiment, the sixth current path R6 in the fourth solar cell module 1d, the eighth current path R8 in the fifth solar cell module 1e, the tenth current path R10 in the sixth solar cell module 1f, the ninth current path R9 in the fifth solar cell module 1e, and the seventh current path R7 in the fourth solar cell module 1d are connected in series in this order as described above when the connection configuration in the upper stage is viewed.

Next, a description will be given of a connection configuration between the solar cell modules in the upper stage and the solar cell modules in the lower stage.

According to the embodiment, a starting point of the first current path R1 in the first solar cell module 1a and a starting point of the sixth current path R6 in the fourth solar cell module 1d are connected to each other in parallel via connection wiring 261s. Specifically, the positive terminal 3c(+) of the third solar cell element 3c in the first solar cell module 1a and the positive terminal 3a(+) of the first solar cell element 3a in the fourth solar cell module 1d are connected to each other in parallel via the connection wiring 261s.

An ending point of the second current path R2 in the first solar cell module 1a and an ending point of the seventh current path R7 in the fourth solar cell module 1d are connected to each other in parallel via connection wiring 261t. Specifically, the negative terminal 3d(−) of the fourth solar cell element 3d in the first solar cell module 1a and the negative terminal 3d(−) of the fourth solar cell element 3d in the fourth solar cell module 1d are connected to each other in parallel via the connection wiring 261t.

A positive terminal 262(+) of the power conditioner 262 and the positive terminal 3c(+) of the third solar cell element 3c in the first solar cell module 1a are connected to each other via connection wiring 263a. A negative terminal 262(−) of the power conditioner 262 and the negative terminal 3d(−) of the fourth solar cell element 3d in the first solar cell module 1a are connected to each other via connection wiring 263b.

Even with the configuration in which the three solar cell modules 1 in the first row (upper stage) and the three solar cell modules 1 in the second row (lower stage) from among the six solar cell modules 1 arranged such that three solar cell modules 1 are in each of two rows are connected to each other in parallel as in the embodiment, the total length of the plurality of pieces of connection wiring becomes longer as compared with the case according to the first embodiment (the case in which the three solar cell modules 1 are arranged such that the three solar cell modules 1 are in a row). Therefore, according to the embodiment, a significant actual advantage is achieved from the effect in that it is possible to reduce wiring resistance and to reduce power loss. In addition, a significant actual advantage is achieved from the effect in that it is possible to reduce connection wiring cost and to facilitate the wiring connecting operation, which is preferable in terms of product cost, a product size, and wiring connection operability.

[Twelfth Embodiment]

Hereinafter, a description will be given of a twelfth embodiment of the present invention with reference to FIG. 19.

A basic configuration of a solar photovoltaic power generation system 950 according to the embodiment is the same as that in the ninth embodiment, and the twelfth embodiment is different from the ninth embodiment in an arrangement configuration of solar cell elements in each solar cell module.

Figure 19:
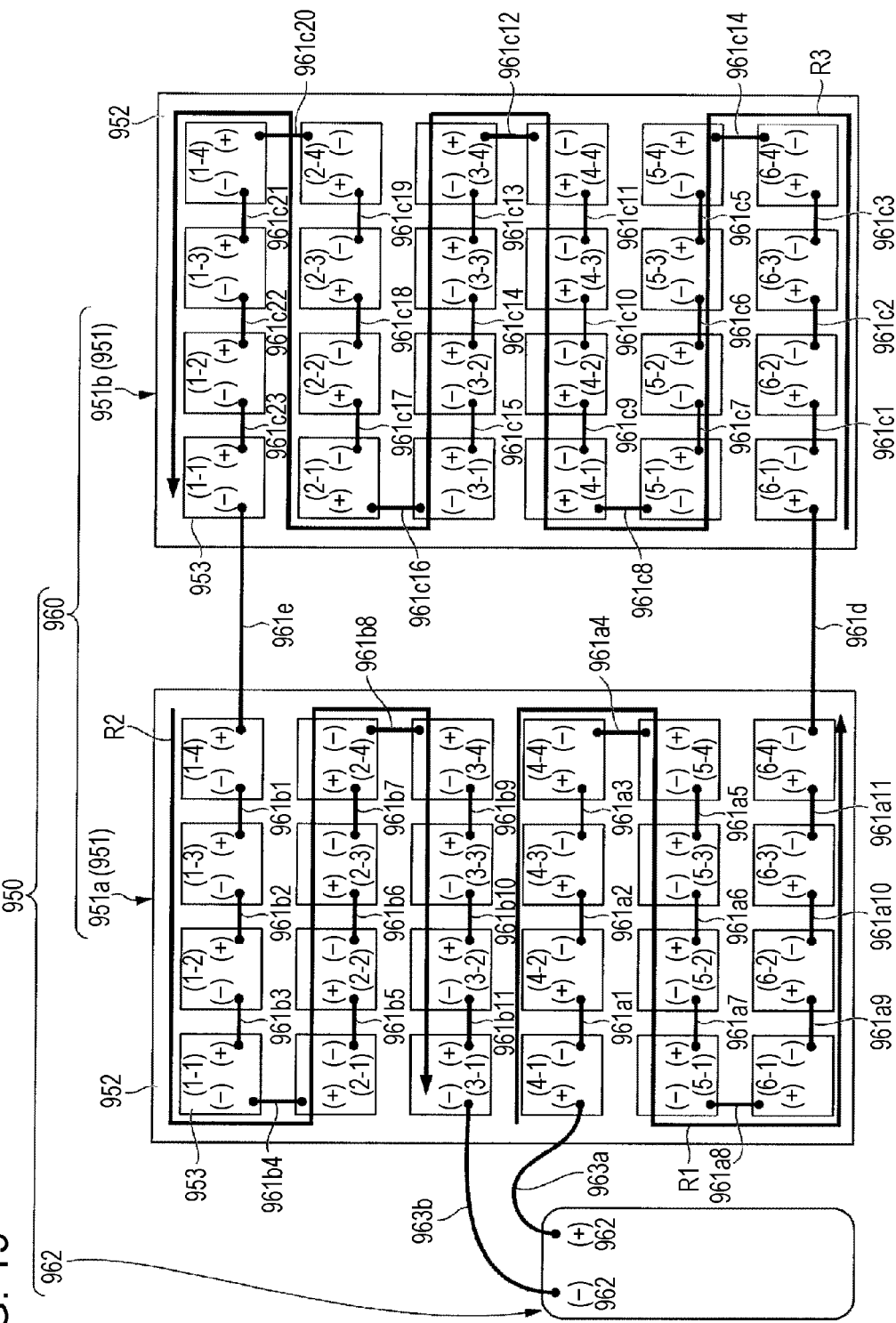
FIG. 19 is a plan view showing an outline configuration of a solar photovoltaic power generation system according to a twelfth embodiment.

FIG. 19 is a plan view showing an outline configuration of a solar photovoltaic power generation system 950 according to the twelfth embodiment. In FIG. 19, the same reference numerals are given to the same components as those used in the ninth embodiment, and detailed descriptions thereof will be omitted.

As shown in FIG. 19, the solar photovoltaic power generation system 950 is provided with a solar cell module assembly 960 and a power conditioner 962.

In the embodiment, a case in which solar cell elements 953 are arranged such that four solar cell elements 953 are in each of six rows in each solar cell module 951 will be exemplified and described as an example. In FIG. 19, a solar cell element arranged on the first column in the first row is represented by the reference numeral 953(1-1) for the purpose of convenience. In relation to the other solar cell elements, a solar cell element arranged on the n-th column in the m-th row is represented by the reference numeral (m-n) for the purpose of convenience. For example, the solar cell element arranged on the third column in the third row is represented by the reference numeral (3-3). In addition, positive terminals of the solar cell elements 953 are represented by a symbol (+) for the purpose of convenience. Negative terminals are represented by a symbol (−) for the purpose of convenience.

In the solar cell module assembly 960 according to the embodiment, a first solar cell module 951a and a second solar cell module 951b are arranged in this order from the side of the power conditioner 962.

In the embodiment, a case in which twenty four solar cell elements 953 are arranged on an upper surface of a support panel 952 in each solar cell module 951 will be exemplified and described as an example.

According to the embodiment, a negative terminal (−) of a solar cell element (4-1) on the first column in the fourth row and a positive terminal (+) of a solar cell element (4-2) on the second column in the fourth row in the first solar cell module 951a are connected to each other in series via connection wiring 961a1. In relation to solar cell elements (4-2) to (6-4), negative terminals (−) and positive terminals (+) of adjacent solar cell elements are connected to each other in series via connection wiring 961a2 to 961a11, respectively, in the same manner. The solar cell elements (4-1) to (6-4) in the first solar cell module 951a configure a first current path R1.

A negative terminal (−) of a solar cell element (1-4) on the fourth column in the first row and a positive terminal (+) of a solar cell element (1-3) on the third column in the first row in the first solar cell module 951a are connected to each other in series via connection wiring 961b1. In relation to solar cell elements (1-3) to (3-1), negative terminals (−) and positive terminals (+) of adjacent solar cell elements are connected to each other in series via connection wiring 961b2 to 961b11, respectively, in the same manner. The solar cell elements (1-4) to (3-1) in the first solar cell module 951a configure a second current path R2.

A negative terminal (−) of a solar cell element (6-1) on the first column in the sixth row and a positive terminal (+) of a solar cell element (6-2) on the second column in the sixth row in the second solar cell module 951b are connected to each other in series via connection wiring 961c1. In relation to solar cell elements (6-2) to (1-1), negative terminals (−) and positive terminals (+) of adjacent solar cell elements are connected to each other in series via connection wiring 961c2 to 961c23, respectively, in the same manner. The solar cell elements (6-1) to (1-1) in the second solar cell module 951b configure a third current path R3.

According to the embodiment, an ending point of the first current path R1 in the first solar cell module 951a and a starting point of the third current path R3 in the second solar cell module 951b are connected to each other in series via connection wiring 961d. Specifically, the negative terminal (−) of the solar cell element (6-4) on the fourth column in the sixth row in the first solar cell module 951a and the positive terminal (+) of the solar cell element (6-1) on the first column in the sixth row in the second solar cell module 951b are connected to each other in series via the connection wiring 961d.

A starting point of the second current path R2 in the first solar cell module 951a and an ending point of the third current path R3 in the second solar cell module 951b are connected to each other in series via connection wiring 961e. Specifically, the positive terminal (+) of the solar cell element (1-4) on the fourth column in the first row in the first solar cell module 951a and the negative terminal (−) of the solar cell element (1-1) on the first column in the first row in the second solar cell module 951b are connected to each other in series via the connection wiring 961e.

In the solar cell module assembly 950 according to the embodiment, the first current path R1 in the first solar cell module 951a, the third current path R3 in the second solar cell module 951b, and the second current path R2 in the first solar cell module 951a are connected in series in this order as described above.

A positive terminal 962(+) of the power conditioner 962 and the positive terminal (+) of the solar cell element (4-1) on the first column in the fourth row in the first solar cell module 951a are connected to each other via connection wiring 963a. A negative terminal 962(−) of the power conditioner 962 and the negative terminal (−) of the solar cell element (3-1) on the first column in the third row in the first solar cell module 951a are connected to each other via connection wiring 963b.

If the solar cell elements 953 are arranged such that the four solar cell elements are in each of the six rows in each solar cell module 951 as in the embodiment, the total length of the plurality of pieces of connection wiring becomes longer as compared with the case according to the ninth embodiment (the case in which the solar cell elements 903 are arranged such that two solar cell elements 903 are in each of two rows in each solar cell module 901). Therefore, according to the embodiment, a significant actual advantage is achieved from the effect in that it is possible to reduce wiring resistance and to reduce power loss. In addition, a significant actual advantage is achieved from the effect in that it is possible to reduce connection wiring cost and to facilitate the wiring connecting operation, which is preferable in terms of product cost, a product size, and wiring connection operability.

Although the case in which three solar cell modules are arranged such that three solar cell modules were in a row, the case in which six solar cell modules were arranged such that three solar cell modules are in each of two rows, and the case in which eight solar cell modules were arranged such that four solar cell modules are in each of two rows are exemplified and described as examples of arrangement configurations of solar cell modules in the above embodiments, the present invention is not limited thereto. For example, nine solar cell modules may be arranged such that three solar cell modules are in each of three rows. As the arrangement configuration of the solar cell modules, various arrangement configurations can be applied.

In addition, although the example in which terminal polarities of the solar cell elements were reversed in the second solar cell module from among the three solar cell modules was exemplified and described as an example in which terminal polarities of solar cell elements were reversed in solar cell module in the above embodiment, the present invention is not limited thereto. For example, terminal polarities of the solar cell elements in the second solar cell module and the third solar cell module may be reversed. As a configuration in which the terminal polarities of the solar cell elements in solar cell modules, various configurations can be employed.

In addition, although the case in which the planar shape of each light-concentrating panel is a quadrangular shape and the case in which the planar shape of each light-concentrating panel is a triangular shape were exemplified and described as examples of planar shapes of each light-concentrating panel in the above embodiments, the present invention is not limited thereto. For example, the planar shape of each light-concentrating panel may be another shape such as a polygonal shape, the number of the sides of which is five or more.

In addition, although the case where the light-concentrating panels, each of which had a quadrangular planar shape, and the light-concentrating panel which had a triangular planar shape were used was exemplified and described as a case where light-concentrating panel with different planar shapes are used in the above embodiment, the present invention is not limited thereto. Another combination may be employed, and for example, light-concentrating panels with quadrangular planar shapes and light-concentrating panels with polygonal planar shapes, the number of the sides of which is five or more, may be used in combination.

In addition, although the case in which the solar cell elements were provided on the first main surface of each light-concentrating panel was exemplified and described as an example of installation positions of the solar cell elements in the above embodiments, the present invention is not limited thereto. For example, the solar cell elements may be provided on the second main surface on the opposite side of the first main surface of each light-concentrating panel.

Although the case in which four solar cell elements were arranged on the upper surface of the support panel in each solar cell module and the case in which twenty four solar cell elements were arranged on the upper surface of the support panel were exemplified and described as examples of the configuration in which the light-concentrating panel is not provided in each solar cell module in the above embodiments, the present invention is not limited thereto. For example, the support panel may not be provided in each solar cell module. A plurality of solar cell elements may be directly arranged on an installation surface of a solar cell module (solar photovoltaic power generation system).

In addition, the case in which the light-concentrating panels were provided in all the plurality of solar cell modules (the configuration in which the first light-concentrating panel is provided in the first solar cell module and the second light-concentrating panel is provided in the second solar cell module) and the case in which the light-concentrating panel was not provided in any of a plurality of solar cell modules were exemplified and described in the above embodiments, the present invention is not limited thereto. For example, a configuration is also applicable in which a first light-concentrating panel is provided in a first solar cell module and a second light-concentrating panel is not provided in a second solar cell module.

In addition, the case in which the first collector electrode (the plurality of finger electrodes and the bus bar electrode) were formed on the front surface side of the semiconductor substrate was exemplified and described as an example of a configuration of solar cell elements in the above embodiments, the present invention is not limited thereto. For example, a so-called back-contact-type solar cell elements with a configuration in which the first collector electrode (the plurality of finger electrodes and the bus bar electrode) are formed on the rear surface side of the semiconductor substrate may be employed.

Although preferable embodiments according to the present invention were described with reference to the drawings, it is needless to say that the present invention is not limited to the above embodiments. The shapes, the combinations and the like of the respective components are described above only for an illustrative purpose, and various modifications can be made based on a request regarding design or the like, without departing from the gist of the present invention.

In addition, specific descriptions in relation to shapes, numbers, arrangement, materials, formation methods, and the like of the respective components in the solar cell modules are not limited to the above embodiments, and various modifications can be appropriately made.

INDUSTRIAL APPLICABILITY

The present invention is available for a solar cell module, a solar cell module assembly, and a solar photovoltaic power generation system.

REFERENCE SIGNS LIST 1, 401, 601, 801, 901, 951: solar cell module
1a, 301a, 401a, 501a, 601a, 701a, 801a, 901a, 951a: first solar cell module
1b, 301b, 401b, 501b, 601b, 701b, 801b, 901b, 951b: second solar cell module
1c, 301c, 401c, 501c, 601c, 701c, 801c: third solar cell module
1d: fourth solar cell module
1e: fifth solar cell module
1f: sixth solar cell module
1g: seventh solar cell module
1f: eighth solar cell module
2, 402: light-concentrating panel
2a: first end surface
2b: second end surface
2c: third end surface
2d: fourth end surface
2s: first main surface
2f: second main surface
3, 803, 903, 953: solar cell element
3a, 403a, 603a, 803a, 903a: first solar cell element
3b, 403b, 803b, 903b: second solar cell element
3c, 403c, 603c, 803c, 903c: third solar cell element
3d, 603d, 803d, 903d: fourth solar cell element
3a(+), 603a(+), 803a(+), 903a(+): positive terminal
3a(−), 603a(−), 803a(−), 903a(−): negative terminal
10, 210, 310, 410, 510, 610, 710, 810, 910, 160, 260, 960: solar cell module assembly
11a, 11b, 11c, 11d, 11e, 11f, 11g, 11h, 11i, 11j, 11k, 211a, 211b, 211c, 211d, 211e, 211f, 211g, 211h, 211i, 211j, 211k, 211l, 211m, 211n, 211o, 211p, 211q, 211r, 211s, 211t, 211u, 211v, 211w, 211x, 311a, 311b, 311c, 311d, 311e, 311f, 311g, 311h, 311i, 311j, 311k, 411a, 411b, 411c, 411d, 411e, 411f, 411g, 411h, 511a, 511b, 511c, 511d, 511e, 511f, 511g, 511h, 511i, 511j, 611a, 611b, 611c, 611d, 611e, 611f, 611g, 611h, 711a, 711b, 711c, 711d, 711e, 711f, 711g, 711h, 811a, 811b, 811c, 811d, 811e, 811f, 811g, 811h, 811i, 811j, 811k, 911a, 911b, 911c, 911d, 911e, 911f, 911g, 161a1, 161a2, 161b1, 161b2, 161c1, 161c2, 161d1, 161d2, 161e1, 161e2, 161f1, 161f2, 161g1, 161g2, 161h1, 161h2, 161h3, 261a, 261b, 261c, 261d, 261e, 261f, 261g, 261h, 261i, 261j, 261k, 261l, 261m, 261n, 261o, 261p, 261q, 261r, 261s, 261t, 261u, 261v, 961a1, 961a2, 961a3, 961a4, 961a5, 961a6, 961a7, 961a8, 961a9, 961a10, 961a11, 961b1, 961b2, 961b3, 961b4, 961b5, 961b6, 961b7, 961b8, 961b9, 961b10, 961b11, 961c1, 961c2, 961c3, 961c4, 961c5, 961c6, 961c7, 961c8, 961c9, 961c10, 961c11, 961c12, 961c13, 961c14, 961c15, 961c16, 961c17, 961c18, 961c19, 961c20, 961c21, 961c22, 961c23, 961d, 961e: connection wiring
12, 212, 312, 412, 512, 612, 712, 812, 912, 162, 262, 962: power conditioner
100, 200, 300, 400, 500, 600, 700, 800, 900, 150, 250, 950: solar photovoltaic power generation system
603b: reflecting mirror
R1: first current path
R2: second current path
R3: third current path
R4: fourth current path
R5: fifth current path
R6: sixth current path
R7: seventh current path
R8: eighth current path
R9: ninth current path
R10: tenth current path
R11: eleventh current path
R12: twelfth current path
R13: thirteenth current path
R14: fourteenth current path
R15: fifteenth current path
L: external light

The invention claimed is:

1. A solar cell module assembly comprising:
a first solar cell module including a first light-concentrating panel which has a first polygonal shape, and collects light which is incident from an outside; and
a second solar cell module including a second light-concentrating panel which has a second polygonal shape, and collects the light, wherein
the first polygonal shape includes a first side, a second side, and a third side,
the second polygonal shape includes a fourth side, a fifth side, and a sixth side,
one end of the second side contacts one end of the first side,
another end of the second side contacts one end of the third side,
one end of the fifth side contacts one end of the fourth side,
another end of the fifth side contacts one end of the sixth side,
the first solar cell module further comprises:
  a first solar cell element on the first side;
  a second solar cell element on the second side;
  a third solar cell element on the third side; and
  a first connection wiring which connects, in series, the first solar cell element and the second solar cell element to each other by connecting the one end of the first side and the one end of the second side;
the second solar cell module further comprises:
  a fourth solar cell element on the fourth side;
  a fifth solar cell element on the fifth side; and
  a sixth solar cell element on the sixth side; and
the solar cell module assembly further comprises:
a second connection wiring which connects, in series, the first solar cell element and the fifth solar cell element to each other by connecting another end of the first side and another end of the fifth side; and
a third connection wiring which connects, in series, the third solar cell element and the sixth solar cell element to each other by connecting another end of the third side and another end of the sixth side.

2. The solar cell module assembly according to claim 1, wherein the first to the third solar cell elements receive the light which is collected by the first light-concentrating panel.

3. The solar cell module assembly according to claim 1, wherein the fourth to the sixth solar cell elements receive the light which is collected by the second light-concentrating panel.

4. The solar cell module assembly according to claim 1, wherein the another end of the second side and the one end of the third side are terminals for connection to an external device.

5. The solar cell module assembly according to claim 1, wherein the third solar cell element is not directly connected in series to the first solar cell element and the second solar cell element.

6. The solar cell module assembly according to claim 1, wherein the second solar cell module further comprises:
a fourth connection wiring which connects, in series, the fourth solar cell element and the fifth solar cell element to each other by connecting the one end of the fourth side and the one end of the fifth side.

7. The solar cell module assembly according to claim 1, wherein one of the first polygonal shape and the second polygonal shape is a triangular shape.

8. The solar cell module assembly according to claim 1, wherein the first polygonal shape is a square shape and the second polygonal shape is a triangular shape.

9. The solar cell module assembly according to claim 4, wherein another end of the fourth side and the one end of the sixth side are connected in series with each other via a fourth connection wiring.

10. A solar photovoltaic power generation system, wherein a power conditioner is connected to the terminals for connection to an external device, in the solar cell module assembly according to claim 4.

* * * * *